US012261070B2

(12) United States Patent
Yamauchi

(10) Patent No.: US 12,261,070 B2
(45) Date of Patent: Mar. 25, 2025

(54) COMPONENT MOUNTING SYSTEM AND COMPONENT MOUNTING METHOD

(71) Applicant: BONDTECH CO., LTD., Kyoto (JP)

(72) Inventor: Akira Yamauchi, Kyoto (JP)

(73) Assignee: BONDTECH CO., LTD., Kyoto (JP)

( * ) Notice: Subject to any disclaimer, the term of this patent is extended or adjusted under 35 U.S.C. 154(b) by 999 days.

(21) Appl. No.: 17/269,518

(22) PCT Filed: Nov. 15, 2018

(86) PCT No.: PCT/JP2018/042296
§ 371 (c)(1),
(2) Date: Feb. 18, 2021

(87) PCT Pub. No.: WO2020/044580
PCT Pub. Date: Mar. 5, 2020

(65) Prior Publication Data
US 2021/0313211 A1    Oct. 7, 2021

(30) Foreign Application Priority Data

Aug. 31, 2018  (JP) .................................. 2018-162737

(51) Int. Cl.
*H01L 21/68* (2006.01)
*H01L 21/67* (2006.01)
(Continued)

(52) U.S. Cl.
CPC ...... *H01L 21/681* (2013.01); *H01L 21/67132* (2013.01); *H01L 21/67144* (2013.01);
(Continued)

(58) Field of Classification Search
CPC ............. H01L 21/681; H01L 21/67132; H01L 21/67144; H01L 21/67259; H01L 24/75;
(Continued)

(56) References Cited

U.S. PATENT DOCUMENTS

| 2013/0135458 | A1 | 5/2013 | Taniguchi et al. |
| 2015/0087083 | A1* | 3/2015 | Tani ..................... H01L 25/0657 438/5 |
| 2020/0006099 | A1* | 1/2020 | Yamauchi ........... B29C 35/0805 |

FOREIGN PATENT DOCUMENTS

| CN | 103129117 A | 6/2013 |
| CN | 103917079 A | 7/2014 |

(Continued)

OTHER PUBLICATIONS

JPO Office Action dated Aug. 24, 2021, issued for the corresponding JP patent application No. 2020-540019, 4 pages.
(Continued)

*Primary Examiner* — Ermias T Woldegeorgis
(74) *Attorney, Agent, or Firm* — ASLAN LAW, P.C.

(57) ABSTRACT

This chip mounting system simultaneously images an alignment mark disposed on a substrate (WT) and an alignment mark disposed on a chip (CP), with the alignment marks disposed on the substrate (WT) and the chip (CP) being separated by a first distance at which the alignment marks fall within a depth-of-field range of imaging devices. The chip mounting system calculates a relative positional deviation amount between the substrate (WT) and the chip (CP) from the imaged images of the alignment marks imaged by the imaging devices and, based on the calculated positional deviation amount, relatively moves the chip (CP) with respect to the substrate (WT) in a direction in which the positional deviation amount therebetween decreases.

8 Claims, 67 Drawing Sheets

(51) Int. Cl.
*H01L 23/00* (2006.01)
*H01L 21/687* (2006.01)

(52) U.S. Cl.
CPC ........ *H01L 21/67259* (2013.01); *H01L 24/75* (2013.01); *H01L 21/67017* (2013.01); *H01L 21/68707* (2013.01); *H01L 2224/75753* (2013.01)

(58) Field of Classification Search
CPC ......... H01L 21/67017; H01L 21/68707; H01L 2224/75753; H01L 24/80; H01L 24/81; H01L 24/83; H01L 2224/08; H01L 2224/16238; H01L 2224/7501; H01L 2224/7565; H01L 2224/75651; H01L 2224/75744; H01L 2224/75822; H01L 2224/75901; H01L 2224/75983; H01L 2224/75985; H01L 2224/75987; H01L 2224/80097; H01L 2224/8013; H01L 2224/80132; H01L 2224/80895; H01L 2224/80896; H01L 2224/81097; H01L 2224/8113; H01L 2224/81132; H01L 2224/81191; H01L 2224/81815; H01L 2224/83097; H01L 2224/8313; H01L 2224/83132; H01L 2224/83874; H05K 13/04

See application file for complete search history.

(56) References Cited

FOREIGN PATENT DOCUMENTS

| | | |
|---|---|---|
| JP | 2000-269242 A | 9/2000 |
| JP | 2011-040489 A | 2/2011 |
| JP | 2014-045013 A | 3/2014 |
| JP | 2014-113633 A | 6/2014 |
| JP | 2016-058542 A | 4/2016 |
| WO | WO 2012/165313 A1 | 12/2012 |
| WO | WO-2018147147 A1 * | 8/2018 ............. B29C 35/08 |

OTHER PUBLICATIONS

Office Action dated Sep. 27, 2023, issued for the corresponding CN patent application No. 201880096999.0, The State Intellectual Property Office of People's Republic of China, People's Republic of China, 7 pages.

* cited by examiner

COMPONENT MOUNTING SYSTEM AND COMPONENT MOUNTING METHOD

CROSS-REFERENCE TO RELATED APPLICATIONS

This application claims priority to JP Patent Application No. 2018-162737 filed on Aug. 31, 2018, and to PCT Application No. PCT/JP2018/042296 filed on Nov. 15, 2018, the entire contents of which are hereby incorporated by reference.

TECHNICAL FIELD

The present disclosure relates to a component mounting system and a component mounting method.

BACKGROUND ART

Bonding devices that perform relative positioning of a chip with respect to a substrate by moving in a horizontal direction, with respect to the chip held by a bonding tool, the position of the substrate supported by a bonding stage positioned below the bonding tool and subsequently cause the bonding tool to descend have been proposed (see, for example, Patent Literature 1). This type of bonding device includes a so-called dual view camera that images the up and down directions at the same time and inserts the dual view camera between the chip and the substrate, images alignment marks respectively disposed on the chip and the substrate, and recognizes a positional deviation amount between the alignment marks. The bonding device performs positioning of the chip by moving the bonding stage in such a way that the positional deviation amount between the chip and the substrate decreases. There are some cases where a plurality of pairs of an alignment mark for a chip and an alignment mark corresponding thereto and disposed on a substrate are disposed. In such a case, the bonding device images the plurality of pairs of alignment marks in sequence and recognizes a positional deviation amount between the chip and the substrate.

CITATION LIST

Patent Literature

Patent Literature 1: Unexamined Japanese Patent Application Publication No. 2000-269242

SUMMARY OF INVENTION

Technical Problem

However, since, in the bonding device described in Patent Literature 1, a plurality of pairs of alignment marks is imaged in sequence, there is a possibility that temporal change of the positions of the alignment marks due to vibration and positional change over time of the dual view camera or thermal expansion of a chip and a substrate influences the recognized positional deviation amount.

The present disclosure has been made in consideration of the above-described conditions, and an objective of the disclosure is to provide a component mounting system and a component mounting method that is capable of mounting components on a substrate with high positional precision.

Solution to Problem

In order to achieve the above-described objective, a component mounting system according to the present disclosure is
a component mounting system for mounting, on a substrate having a plurality of first alignment marks disposed in a region in which one component is mounted within a mounting surface on which at least one component is mounted, a component having a plurality of second alignment marks corresponding to the plurality of first alignment marks disposed and includes:
a substrate holder holding the substrate;
a head holding the component with the component made to face the mounting surface;
an imaging device imaging the plurality of first alignment marks and the plurality of second alignment marks from at least either an opposite side to the substrate side of the component or an opposite side to the component side of the substrate;
a substrate holder driver driving the substrate holder;
a head driver driving the head; and
a controller controlling the imaging device to image the plurality of first alignment marks and the plurality of second alignment marks at same time with the plurality of first alignment marks and the plurality of second alignment marks separated from each other by a preset first distance at which the plurality of first alignment marks and the plurality of second alignment marks fall within a depth-of-field range of the imaging device, calculating a relative positional deviation amount between the substrate and the component from an imaged image of the plurality of first alignment marks and the plurality of second alignment marks imaged by the imaging device, and controlling at least either the substrate holder driver or the head driver to relatively move the component with respect to the substrate in a direction that is parallel with the mounting surface and in which the positional deviation amount decreases, based on the calculated positional deviation amount.

A component mounting method according to another aspect of the present disclosure is
a component mounting method for mounting, on a substrate having a plurality of first alignment marks disposed in a region in which one component is mounted within a mounting surface on which at least one component is mounted, a component having a plurality of second alignment marks corresponding to the plurality of first alignment marks disposed and includes:
a first imaging step of imaging the plurality of first alignment marks and the plurality of second alignment marks, using an imaging device at same time from at least either an opposite side to the substrate side of the component or an opposite side to the component side of the substrate with the plurality of first alignment marks and the plurality of second alignment marks separated from each other by a preset first distance at which the plurality of first alignment marks and the plurality of second alignment marks fall within a depth-of-field range of the imaging device;
a first step of calculating amount of positional deviation of calculating a relative positional deviation amount between the substrate and the component from an imaged image of the plurality of first alignment marks and the plurality of second alignment marks imaged by the imaging device, with the substrate and the component separated from each other by the first distance; and a first position correction step of, by relatively moving the component with respect to the substrate in a direction that is parallel with the mounting surface and in which the positional deviation amount decreases, based on the positional deviation amount calculated in the first step of calculating amount of positional deviation, correcting a relative position of the component with respect to the substrate.

Advantageous Effects of Invention

According to the component mounting system according to the present disclosure, the controller controls the imaging device to image the plurality of first alignment marks and the plurality of second alignment marks at the same time with the plurality of first alignment marks and the plurality of second alignment marks separated from each other by a first distance at which the plurality of first alignment marks and the plurality of second alignment marks fall within a depth-of-field range of the imaging device. The controller calculates a relative positional deviation amount between the substrate and the component from an imaged image of the plurality of first alignment marks and the plurality of second alignment marks imaged by the imaging device. In addition, according to the component mounting method according to the present disclosure, in the first imaging step, the method images the plurality of first alignment marks and the plurality of second alignment marks, using the imaging device at the same time from at least either the opposite side to the substrate side of the component or the opposite side to the component side of the substrate, with the plurality of first alignment marks and the plurality of second alignment marks separated from each other by a preset first distance at which the plurality of first alignment marks and the plurality of second alignment marks fall within a depth-of-field range of the imaging device. In the first step of calculating amount of positional deviation, the method calculates a relative positional deviation amount between the substrate and the component from an imaged image of the plurality of first alignment marks and the plurality of second alignment marks imaged by the imaging device with the substrate and the component separated from each other by the first distance. This configuration enables influence of temporal change of the positions of the first alignment marks and the second alignment marks due to vibration and positional change over time of the imaging devices or thermal expansion of the component or the substrate on the calculated positional deviation amount to be reduced. Therefore, it is possible to mount the component on the substrate with high positional precision.

DESCRIPTION OF EMBODIMENTS

Embodiment 1

Figure 1:
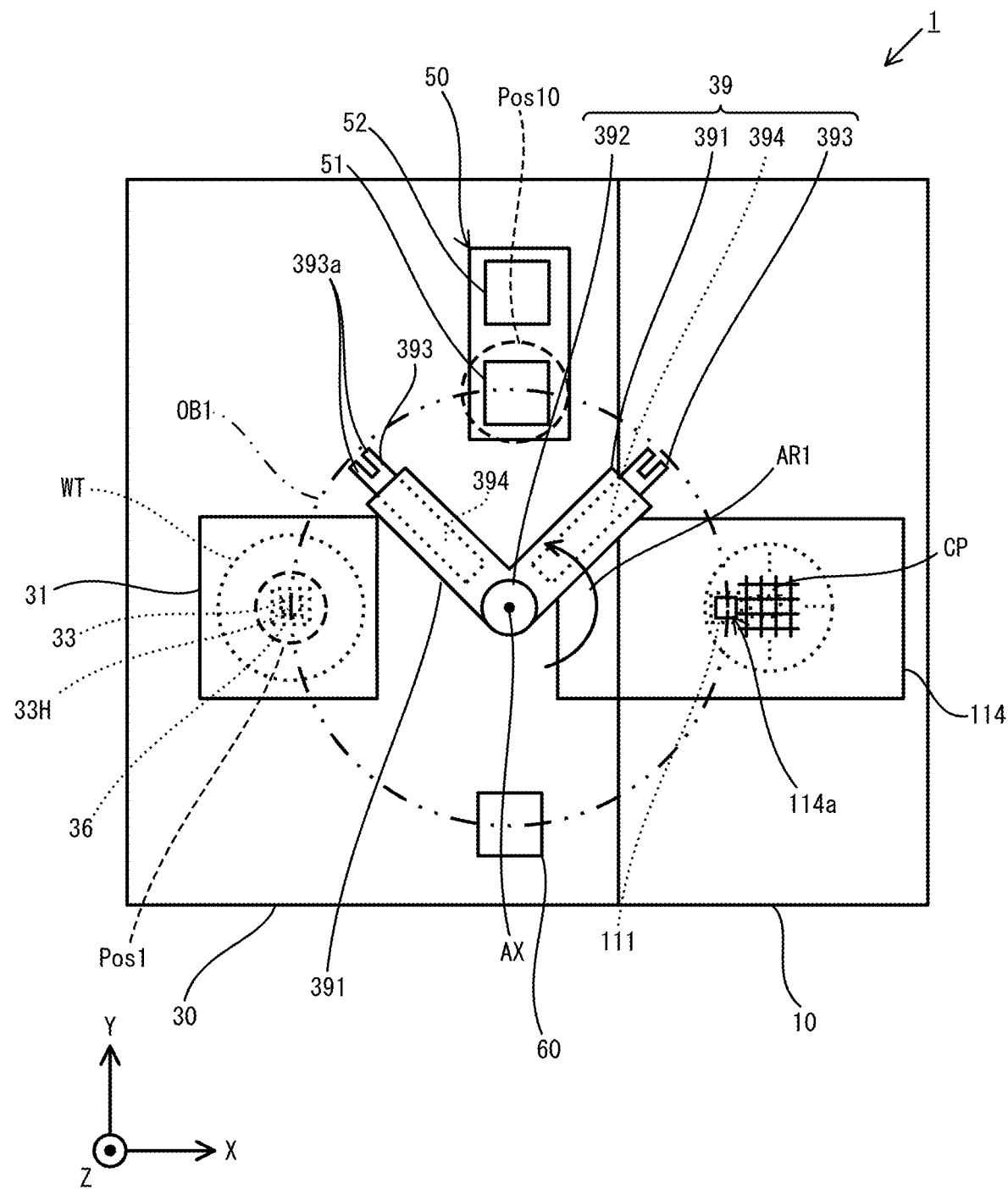
FIG. 1 is a schematic configuration diagram of a chip mounting system according to Embodiment 1 of the present disclosure.

A chip mounting system according to an embodiment of the present disclosure will be described below, referring to the drawings. The chip mounting system according to the present embodiment is a device that mounts electronic components on a substrate. Examples of the electronic components include a semiconductor chip (hereinafter, simply referred to as "chip") provided from a diced substrate. The chip mounting system mounts a chip on a substrate by, after activation treatment has been performed on a surface of the substrate on which the chip is mounted and a bonding surface of the electronic component, bringing the chip into contact with the substrate and applying pressure to the chip.

Figure 2:
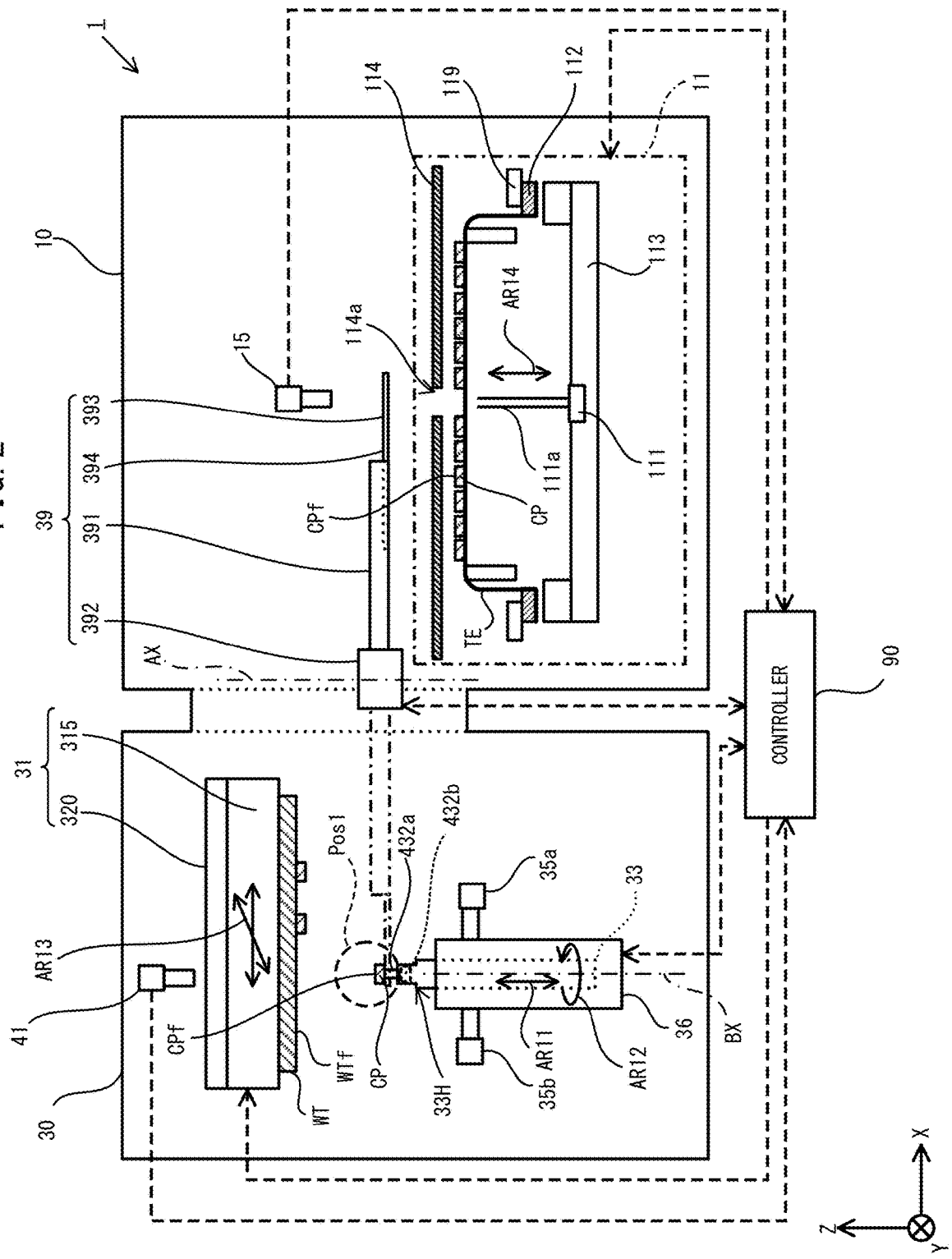
FIG. 2 is a schematic configuration diagram of the chip mounting system according to Embodiment 1 when viewed from a lateral side.

As illustrated in FIGS. 1 and 2, a chip mounting system 1 according to the present embodiment includes a chip supply device 10, a bonding device 30, a cleaning device 50, a chip collector 60, a chip transportation device 39, and a controller 90. The chip supply device 10 cuts a chip CP out of a plurality of chips CP that was produced by dicing a substrate and supplies the bonding device 30 with the chip CP. In this processing, the dicing is a process of cutting a substrate, into which a plurality of electronic components is fabricated, in the vertical direction and the lateral direction into individual chips. The chip supply device 10 includes a chip supply (component supply) 11 and a supplied chip imaging device 15, as illustrated in FIG. 2.

The chip supply 11 is a component supply that includes a sheet holding frame 112 that holds a sheet TE on which a plurality of chips CP is stuck, a frame holder 119 that holds the sheet holding frame 112, a pick-up mechanism 111 that picks up a chip CP out of a plurality of chips CP, and a cover 114. The chip supply 11 also includes a holding frame driver 113 that drives the sheet holding frame 112 in XY directions or in the rotational direction about the Z-axis. The frame holder 119 holds the sheet holding frame 112 in such an attitude that a surface of the sheet TE on which the plurality of chips CP is stuck faces the vertically upward (+Z-direction) side. The sheet holding frame 112 and the frame holder 119 constitute a sheet holder that holds the sheet TE, which is stuck on the opposite side to the bonding surface CPf side of the respective ones of the plurality of chips CP, in such an attitude that the bonding surfaces CPf face the vertically upward side.

The pick-up mechanism 111 brings one chip CP out of the plurality of chips CP into a state of being detached from the sheet TE by cutting out the one chip CP from the opposite side of the sheet TE to the side thereof on which the plurality of chips CP is stuck. In this processing, the pick-up mechanism 111 cuts out the chip CP while holding a peripheral portion, which is a third part, of the opposite side to the bonding surface CPf side of the chip CP, the peripheral portion being different from a central portion, which is a first part, thereof that is to be held by a head 33H, which will be described later. The pick-up mechanism 111 includes needles 111a and is configured to be movable in the vertical direction, as illustrated by an arrow AR14 in FIG. 2. The cover 114 is arranged to cover the vertically upper side of the plurality of chips CP and has a hole 114a disposed at a portion facing the pick-up mechanism 111. The needles 111a are, for example, provided in a number of four. However, the number of needles 111a may be three or five or more. The pick-up mechanism 111 supplies a chip CP by sticking the needles 111a into the sheet TE from the vertically lower side (−Z-direction) of the sheet TE and raising the chip CP vertically upward (+Z-direction). The respective chips CP stuck on the sheet TE are pushed out to the upper side of the cover 114 through the hole 114a of the cover 114 one by one by the needles 111a and handed over to the chip transportation device 39. The holding frame driver 113 changes the position of the chip CP located vertically above the needles 111a by driving the sheet holding frame 112 in an XY direction or the rotational direction about the Z-axis.

The supplied chip imaging device 15 is arranged above (+Z-direction) the chip supply 11 in the chip supply device 10. The supplied chip imaging device 15 images an image of the chip CP pushed out above the cover 114 by the pick-up mechanism 111.

The chip transportation device (also referred to as a turret) 39 transports a chip CP supplied from the chip supply 11 to a transfer position Pos1 at which the chip CP is transferred to the head 33H of a bonder 33 in the bonding device 30. The chip transportation device 39 includes two long plates 391, two arms 394, two chip holders 393 each of which is disposed at a tip portion of one of the arms 394, and a plate driver 392 that rotation-drives the two plates 391 at the same time, as illustrated in FIG. 1. Each of the two plates 391 is formed in a long rectangular box shape, and one end portion of the plate 391 turns with the other end portion thereof, which is located at the middle between the chip supply 11 and the head 33H, as a fulcrum. The two plates 391 are arranged in such a manner that the longitudinal directions thereof make an angle of 90 degrees with each other. Note that the number of plates 391 is not limited to two and may be three or more.

Figure 3A:
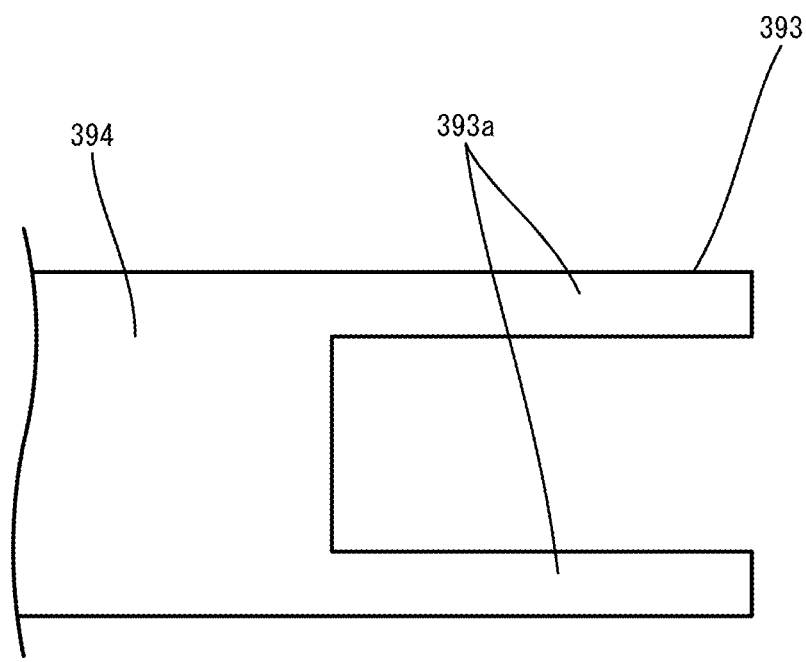
FIG. 3A is a plan view of a chip holder according to Embodiment 1.
Figure 3B:
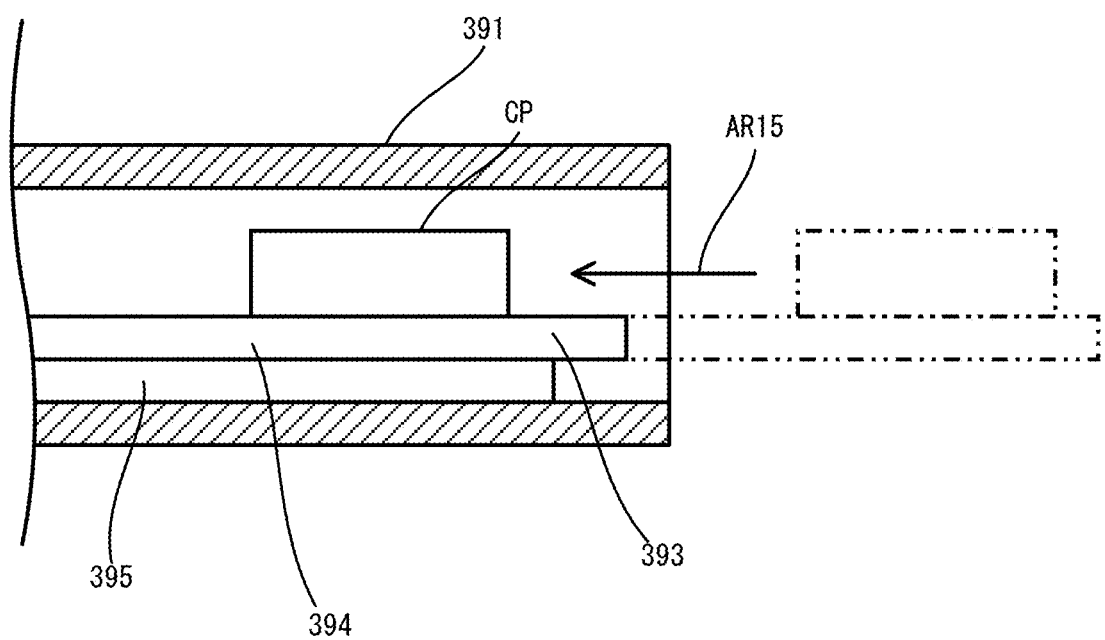
FIG. 3B is a cross-sectional view illustrating a portion of a chip transportation device according to Embodiment 1.

Each of the chip holders 393 is disposed at a tip portion of one of the arms 394 and is a component holder that has two leg pieces 393a for holding a chip CP, as illustrated in FIG. 3A. Each of the plates 391 is capable of housing the long arm 394 on the inside thereof, as illustrated in FIG. 3B. On the inside of the plate 391, an arm driver 395 that drives the arm 394 along the longitudinal direction of the plate 391 is disposed. This configuration enables the chip transportation device 39 to, using each of the arm drivers 395, bring the tip portion of one of the arms 394 to a state of being projected to the outside of one of the plates 391 or bring the tip portion of the arm 394 to a state of being retracted into the inside of the plate 391. When the chip transportation device 39 turns the plates 391, the chip transportation device 39 retracts the arms 394 into the plates 391 and thereby houses the chip holders 393 in the inside of the plates 391, as illustrated by an arrow AR15 in FIG. 3B. This configuration enables adherence of particles onto a chip CP at the time of transportation to be suppressed. Note that suction grooves (not illustrated) may be disposed on the two leg pieces 393a. In this case, since a chip CP is sucked and held by the leg pieces 393a, it is possible to transport the chip CP without positional deviation. In order to prevent a chip CP from being thrown out due to centrifugal force induced when the plate 391 turns, protrusions (not illustrated) may be disposed on the tip portions of the leg pieces 393a.

As illustrated in FIG. 1, the pick-up mechanism 111 and the head 33H are arranged at positions that overlap a locus OB1 drawn by the tip portions of the arms 394 when the plates 391 rotate in the Z-axis direction. When the chip transportation device 39 receives a chip CP from the pick-up mechanism 111, the chip transportation device 39 turns the plate 391 about an axis AX and thereby transports the chip CP to the transfer position Pos1, which overlaps the head 33H, as illustrated by an arrow AR1 in FIG. 1.

Figure 4:
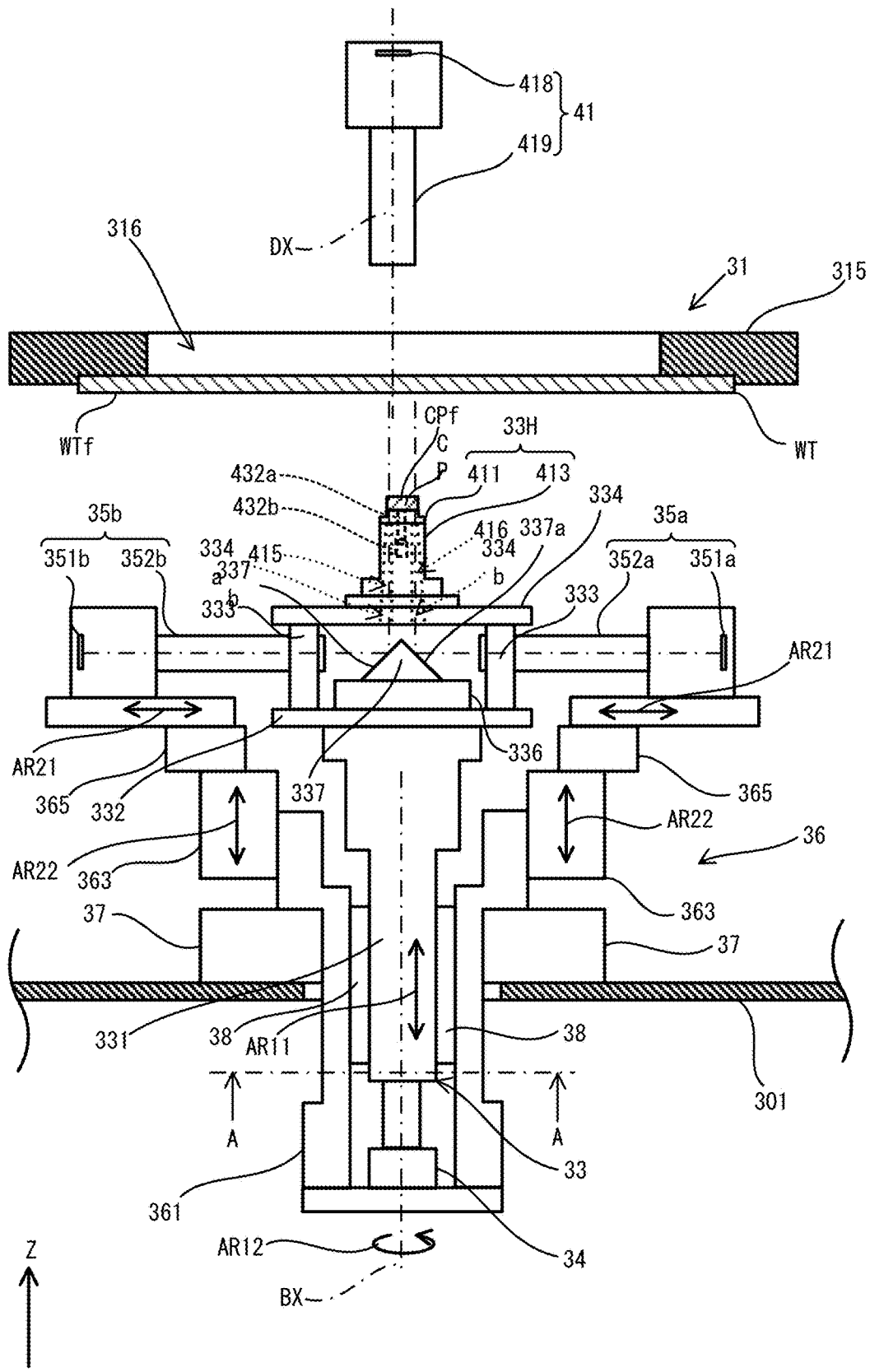
FIG. 4 is a schematic configuration diagram of a bonding device according to Embodiment 1.

The bonding device 30 includes a stage unit 31, the bonder 33 including the head 33H, a head driver 36 that drives the head 33H, imaging devices 35a and 35b, an imaging device 41, camera F-direction drivers 365, and a camera Z-direction driver 363, as illustrated in FIG. 4. The bonder 33 includes a Z-axis direction moving member 331, a first disc member 332, piezo-actuators (component attitude adjusters) 333, a second disc member 334, a mirror fixing member 336, a mirror 337, and the head 33H.

To an upper end portion of the Z-axis direction moving member 331, the first disc member 332 is fixed. In addition, on the upper side of the first disc member 332, the second disc member 334 is arranged. The first disc member 332 and the second disc member 334 are connected to each other with the piezo-actuators 333 interposed therebetween. Further, to the upper surface side of the second disc member 334, the head 33H is fixed. The head 33H sucks and holds a chip CP.

Figure 5A:
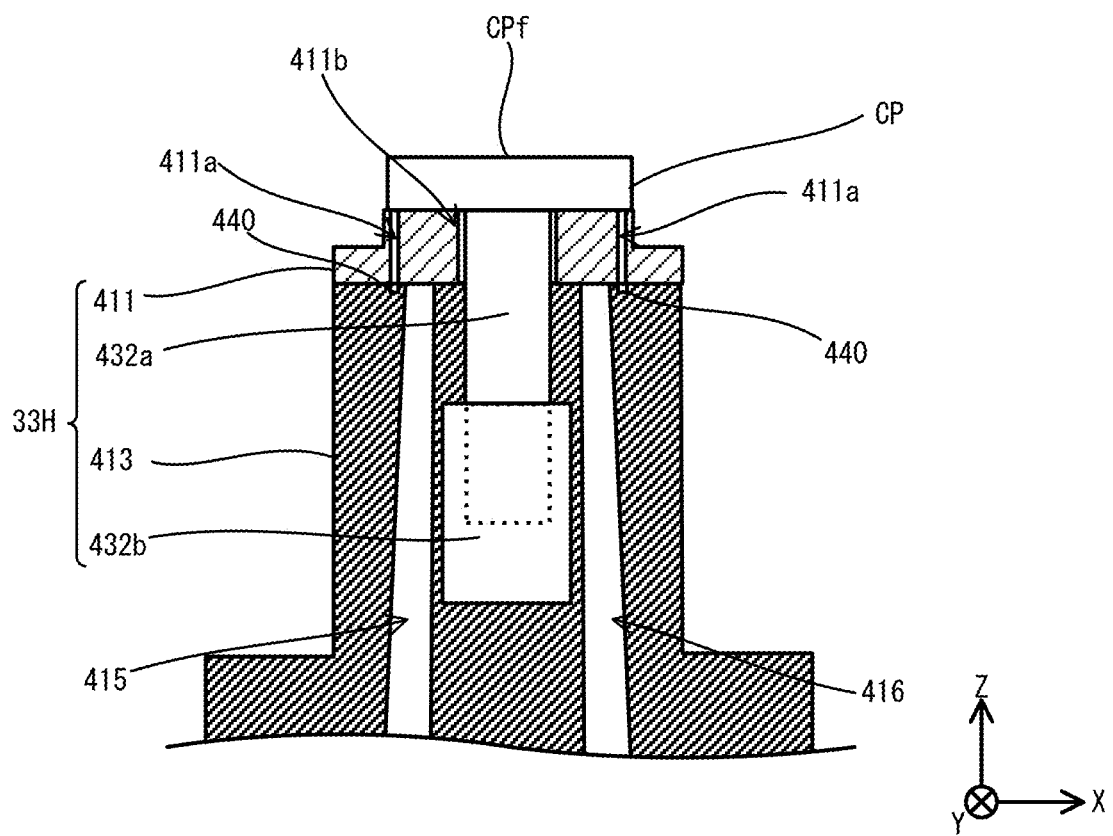
FIG. 5A is a cross-sectional view of a head according to Embodiment 1.
Figure 6:
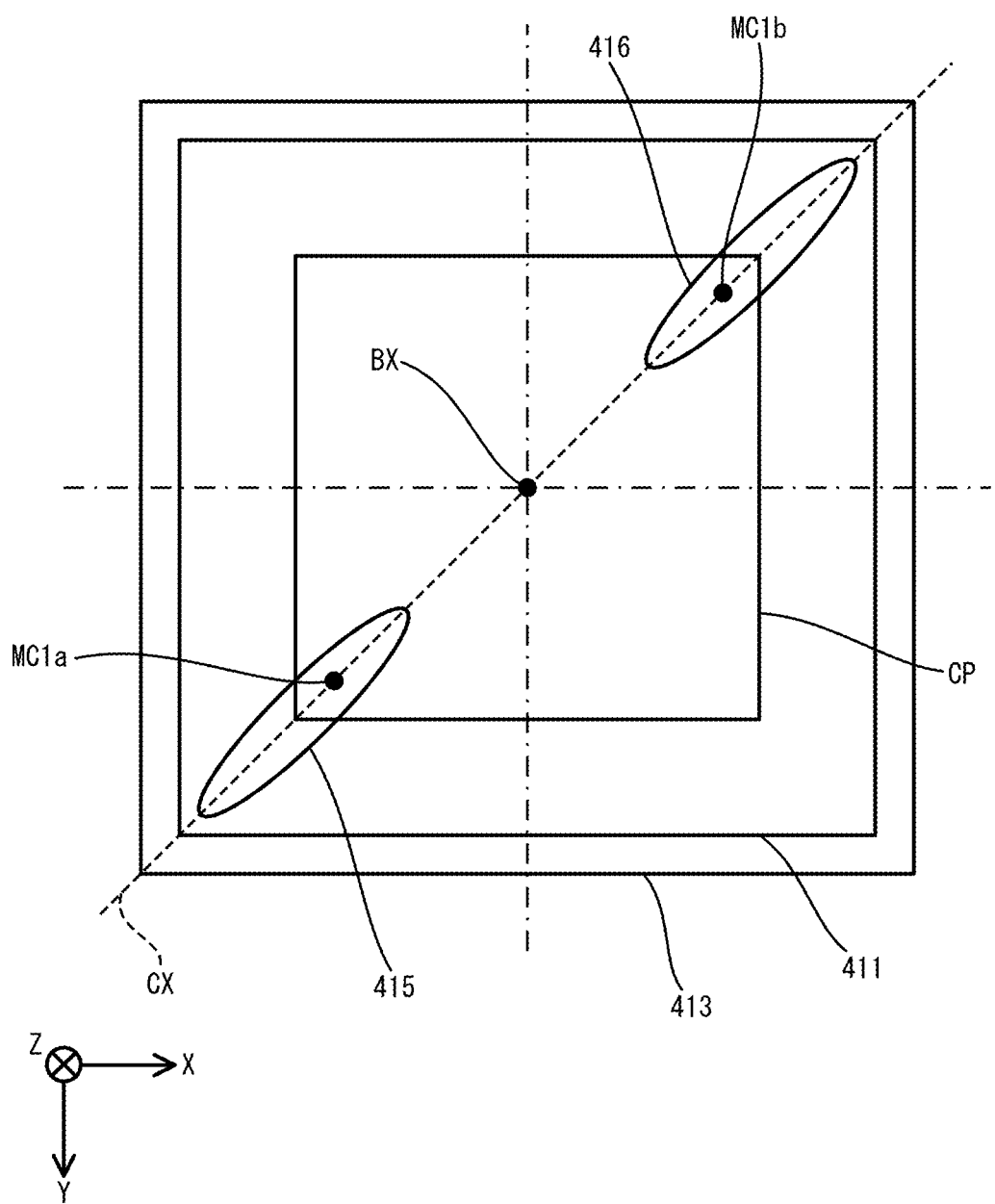
FIG. 6 is a diagram illustrating a positional relationship between alignment marks on a chip and cavities of the head according to Embodiment 1.

The head 33H holds a chip CP from the vertically lower side (−Z-direction). The head 33H includes a chip tool 411, a head body 413, a chip supporter 432a, and a support driver 432b, as illustrated in FIG. 5A. The chip tool 411 is formed of a material (for example, silicon (Si)) that transmits imaging light (infrared light or the like). A ceramic heater, a coil heater, or the like is incorporated into the head body 413. In addition, cavities 415 and 416 for transmitting (passing) imaging light are disposed to the head body 413. The respective cavities 415 and 416 are transmitting parts that transmit imaging light and are disposed in such a manner as to penetrate the head body 413 in the vertical direction (Z-axis direction). Each of the cavities 415 and 416 has an elliptical shape in top view, as illustrated in FIG. 6. The two cavities 415 and 416 are arranged at diagonal portions of the head body 413, which has a substantially square shape in top view, in a point symmetric manner about an axis BX. Note that, in order to transmit imaging light, hole portions 334a and 334b are also disposed at portions of the second disc member 334 corresponding to the cavities 415 and 416. The head body 413 includes holding mechanisms 440 that have suckers for making the chip tool 411 suck and hold a chip CP. The head body 413 also includes suckers (not illustrated) for fixing the chip tool 411 to the head body 413 by means of vacuum suction. The chip tool 411 has through-holes 411a that are formed at positions corresponding to the holding mechanisms 440 of the head body 413 and a through-hole 411b into the inside of which the chip supporter 432a is inserted.

The chip supporter 432a is, for example, a cylindrical sucking post, is disposed at the tip portion of the head 33H, and is configured to be freely movable in the vertical direction. The chip supporter 432a supports the opposite side to the bonding surface CPf side of a chip CP. The chip supporter 432a is disposed alone at a center portion, as illustrated in, for example, FIG. 5B.

The support driver 432b drives the chip supporter 432a in the vertical direction and, in conjunction therewith, causes a chip CP to be sucked on a tip portion of the chip supporter 432a by decompressing the inside of the chip supporter 432a with the chip CP placed on the tip portion of the chip supporter 432a. The support driver 432b moves the chip supporter 432a to the vertically upper side of the chip holder 393 of the chip transportation device 39, with the chip holder 393 holding the chip CP and being positioned at the transfer position (see Pos1 in FIG. 1) to the head 33H and the chip supporter 432a supporting the central portion of the chip CP on the tip portion thereof This movement causes the chip CP to be transferred from the chip holder 393 of the chip transportation device 39 to the head 33H.

Figure 7A:
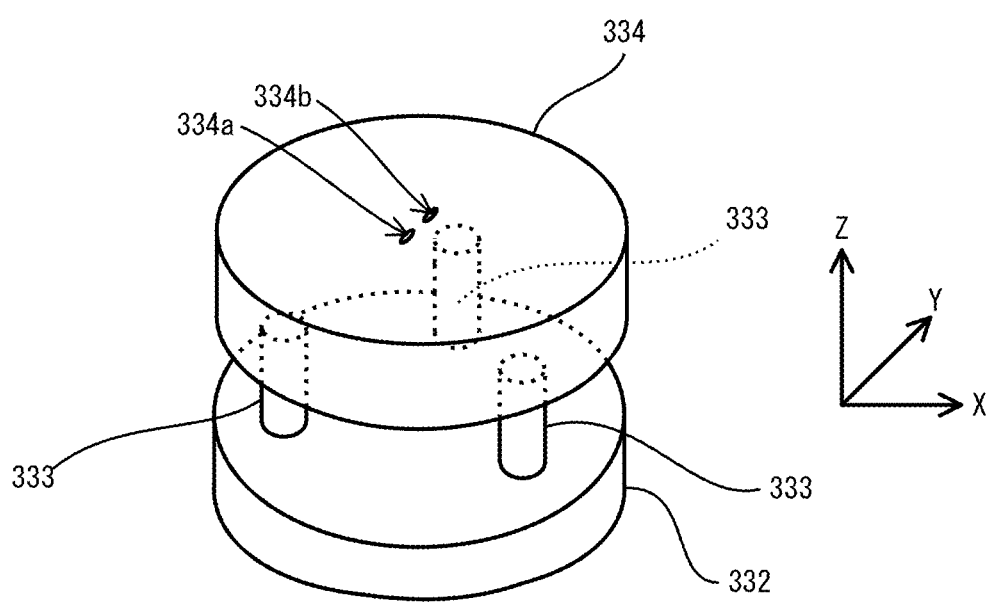
FIG. 7A is a schematic perspective view illustrating a portion of a bonder according to Embodiment 1.

The piezo-actuators 333 adjust at least either distance between a mounting surface WTf of a substrate WT and the bonding surface CPf of a chip CP or inclination of the chip CP with respect to the mounting surface WTf of the substrate WT. The piezo-actuators 333 are provided in a number of three between the first disc member 332 and the second disc member 334 as illustrated in FIG. 7A and are configured to be individually extensible and retractable in the Z-direction. Controlling the magnitude of extension and retraction of each of the three piezo-actuators 333 causes an inclination angle of the second disc member 334, eventually the head 33H, with respect to the horizontal plane to be adjusted. At least either distance between the bonding surface CPf of the chip CP held by the head 33H and the mounting surface WTf of the substrate WT or inclination of the bonding surface CPf of the chip CP held by the head 33H with respect to the mounting surface WTf of the substrate WT is adjusted. Note that the three piezo-actuators 333 are arranged at positions (planar positions) at which the piezo-actuators 333 do not block illuminating light (including reflected light) related to the imaging devices 35a and 35b.

Returning to FIG. 4, the mirror 337 is fixed to the first disc member 332 with the mirror fixing member 336 interposed therebetween and is arranged in a cavity between the first disc member 332 and the second disc member 334. The mirror 337 includes inclined surfaces 337a and 337b each of which has an inclination angle of 45 degrees obliquely downward. Imaging light that is incident on the inclined surfaces 337a and 337b of the mirror 337 from the imaging devices 35a and 35b, respectively, is reflected upward.

The head driver 36 brings the head 33H, which holds a chip CP having been transferred at the transfer position Pos1 (see FIG. 2), close to the stage unit 31 by moving the head 33H vertically upward (+Z-direction) and mounts the chip CP on the mounting surface WTf of the substrate WT. More in detail, the head driver 36 brings the head 33H holding a chip CP close to the stage unit 31 by moving the head 33H vertically upward (+Z-direction), brings the chip CP into contact with the mounting surface WTf of the substrate WT, and causes the chip CP to be surface-bonded to the substrate WT. In this processing, on the mounting surface WTf of the substrate WT and the bonding surface CPf of the chip CP to be bonded to the substrate WT, hydrophilization treatment has been performed by, for example, a hydrophilization treatment device (not illustrated). Therefore, bringing the bonding surface CPf of the chip CP into contact with the mounting surface WTf of the substrate WT causes the chip CP to be bonded to the substrate WT. Note that the bonding surface CPf of the chip CP may be, for example, a surface on which planar metal electrodes are exposed.

The head driver 36 includes a Z-direction driver 34, a rotating member 361, and a θ-direction driver 37. The Z-direction driver 34 includes a servo motor and a ball screw or the like. The Z-direction driver 34 is disposed on the bottom end side of the rotating member 361, which will be described later, and drives the Z-axis direction moving member 331 of the bonder 33 in the Z-axis direction, as illustrated by an arrow AR11 in FIG. 2. When the Z-direction driver 34 moves the Z-axis direction moving member 331 in the Z-direction, the head 33H, which is disposed on the top end of the bonder 33, moves in the Z-direction, associated with the movement of the Z-axis direction moving member 331. In other words, the head 33H is driven in the Z-direction by the Z-direction driver 34.

Figure 7B:
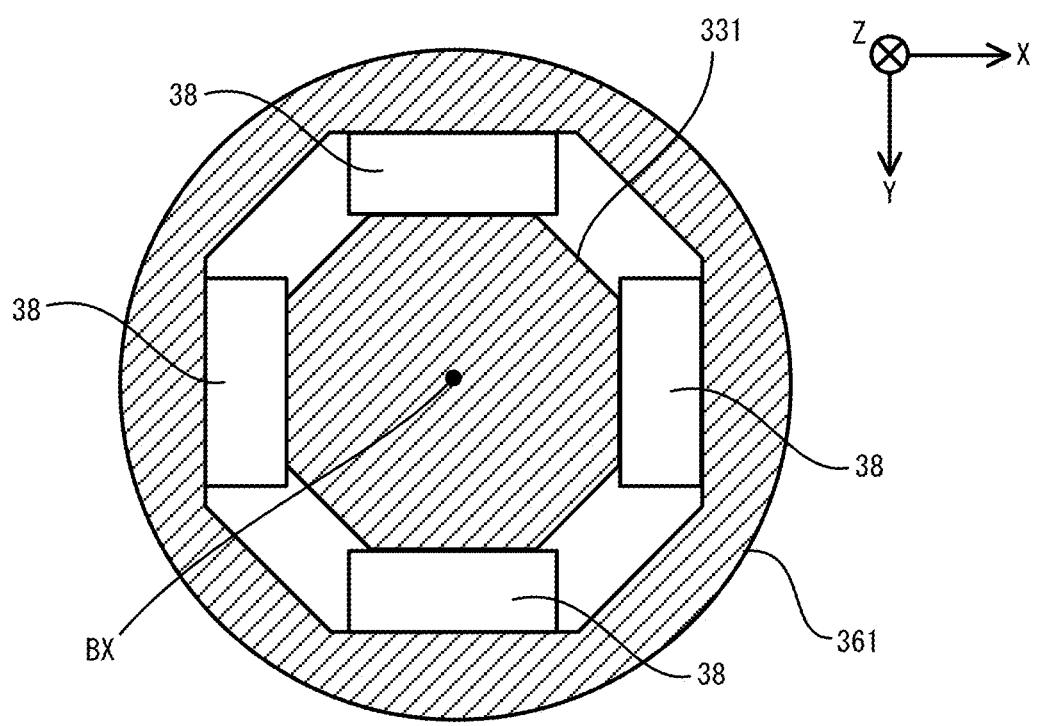
FIG. 7B is a cross-sectional arrow view of the bonding device according to Embodiment 1 taken along the line A-A in FIG. 4.

The rotating member 361 is formed in a cylindrical shape, and the cross-sectional shape of a hollow portion inside the rotating member 361 is an octagon, as illustrated in FIG. 7B. On the other hand, the Z-axis direction moving member 331 has a bar-shaped portion the cross-sectional shape of which is an octagon and is inserted into the inside of the rotating member 361. Between four side surfaces among the eight side surfaces of the Z-axis direction moving member 331 and the inner surface of the rotating member 361, linear guides 38 that are arranged in such a manner that the Z-axis direction moving member 331 slides in the Z-axis direction with respect to the rotating member 361 are disposed. When the rotating member 361 rotates about the axis BX, the Z-axis direction moving member 331 rotates in an interlocking manner with the rotation of the rotating member 361. In other words, the bonder 33 and the rotating member 361 rotate about the axis BX in an interlocking manner with each other, as illustrated by an arrow AR12 in FIG. 2.

The θ-direction driver 37 includes a servo motor and a speed reducer or the like and is fixed to a fixed member 301 that is disposed in the bonding device 30, as illustrated in FIG. 4. The θ-direction driver 37 supports the rotating member 361 in a rotatable manner about the axis BX. The θ-direction driver 37 makes the rotating member 361 rotate about the axis BX in accordance with a control signal input from the controller 90.

The imaging devices 35a and 35b image alignment marks (second alignment marks) MC2a and MC2b on the chip CP as illustrated in FIG. 6 from vertically below (−Z-direction) the chip CP, with the chip CP arranged at a position on the substrate WT at which a chip CP is mounted. The imaging device 35a is fixed to the rotating member 361 via the camera Z-direction driver 363 and the camera F-direction driver 365, as illustrated in FIG. 4. The imaging device 35b is also fixed to the rotating member 361 via the camera Z-direction driver 363 and the camera F-direction driver 365. This configuration causes the imaging devices 35a and 35b to rotate in conjunction with the rotating member 361. Note that, as described afore, the mirror 337 is fixed to the Z-axis direction moving member 331 and the rotating member 361 and the Z-axis direction moving member 331 rotate in an interlocking manner with each other. Therefore, since the relative positional relationship between the imaging devices 35a and 35b and the mirror 337 is invariable, imaging light, which is reflected by the mirror 337, is introduced to the imaging devices 35a and 35b regardless of the rotational movement of the rotating member 361.

The imaging devices 35a and 35b acquire imaged images including images of the alignment marks MC2a and MC2b, which are disposed on the chip CP, and images of alignment marks (first alignment marks) MC1a and MC1b that are disposed on the substrate WT. The controller 90 recognizes a relative position of the chip CP with respect to the substrate WT in a direction parallel with a surface of the substrate WT on which the chip CP is mounted, based on the image data acquired by the imaging devices 35a and 35b. The imaging devices 35a and 35b include image sensors 351a and 351b, optical systems 352a and 352b, and coaxial illumination systems (not illustrated), respectively. The imaging devices 35a and 35b respectively acquire image data relating to reflected light of illuminating light (for example, infrared light) that is emitted from light sources (not illustrated) of the coaxial illumination systems. Note that illuminating light emitted in horizontal directions from the coaxial illumination systems of the imaging devices 35a and 35b is reflected by the inclined surfaces 337a and 337b of the mirror 337, respectively, and the traveling directions thereof are changed to the vertically upward direction. The light reflected by the mirror 337 travels toward imaging target portions including the chip CP, which is held by the head 33H, and the substrate WT, which is arranged in such a manner as to face the chip CP and is reflected by the respective imaging target portions. Note that the alignment marks MC2a and MC2b are disposed on the imaging target portions of the chip CP and the alignment marks MC1a and MC1b are disposed on the imaging target portions of the substrate WT. The reflected light from the respective imaging target portions of the chip CP and the substrate WT travels vertically downward, is subsequently reflected by the inclined surfaces 337a and 337b of the mirror 337 again, has traveling directions thereof changed to horizontal directions, and reaches the imaging devices 35a and 35b. In this way, the imaging devices 35a and 35b acquire image data of the respective imaging target portions of the chip CP and the substrate WT.

On this occasion, the cavities 415 and 416 of the head 33H rotate about the axis BX in an interlocking manner with the rotation of the rotating member 361. For example, it is assumed that, as illustrated in FIG. 6, the alignment marks MC2a and MC2b are disposed at corner portions of the chip CP, which has a square shape, that are opposed to each other with the center of the chip CP interposed therebetween. In this case, when the imaging devices 35a and 35b are positioned on a diagonal connecting the two corner portions at which the alignment marks MC2a and MC2b on the chip CP are disposed, the imaging devices 35a and 35b are able to acquire imaged images of the alignment marks MC2a and MC2b through the cavities 415 and 416, respectively.

The camera F-direction drivers 365 adjust focal positions of the imaging devices 35a and 35b by driving the imaging devices 35a and 35b in the focusing directions, as illustrated by the arrows AR21 in FIG. 4. The camera Z-direction driver 363 drives the imaging devices 35a and 35b in the Z-axis direction, as illustrated by arrows AR22 in FIG. 4. In this processing, the camera Z-direction driver 363 generally moves the imaging devices 35a and 35b in such a way that a movement amount in the Z-axis direction of the Z-axis direction moving member 331 and a movement amount in the Z-axis direction of the imaging devices 35a and 35b are identical. In this way, it is configured such that the imaging target portions for the imaging devices 35a and 35b do not change between before and after movement at the time of movement of the head 33H in the Z-axis direction. However, the camera Z-direction driver 363 sometimes moves the imaging devices 35a and 35b in such a way that a movement amount in the Z-axis direction of the imaging devices 35a and 35b is different from a movement amount in the Z-axis direction of the Z-axis direction moving member 331. In this case, since relative positions between the imaging devices 35a and 35b and the mirror 337 in the Z-direction respectively change, the imaging target portions of the chip CP and the substrate WT to be imaged by the imaging devices 35a and 35b are changed.

The stage unit 31 includes a stage 315 that holds the substrate WT in such an attitude that the mounting surface WTf of the substrate WT on which the chip CP is mounted faces vertically downward (−Z-direction) and a stage driver 320 that drives the stage 315. The stage 315 is a substrate holder that is capable of moving in the X-direction, the Y-direction, and the rotational direction. This configuration enables a relative positional relationship between the bonder 33 and the stage unit 31 to be changed and a mounting position of each chip CP on the substrate WT to be thereby adjusted.

Figure 8A:
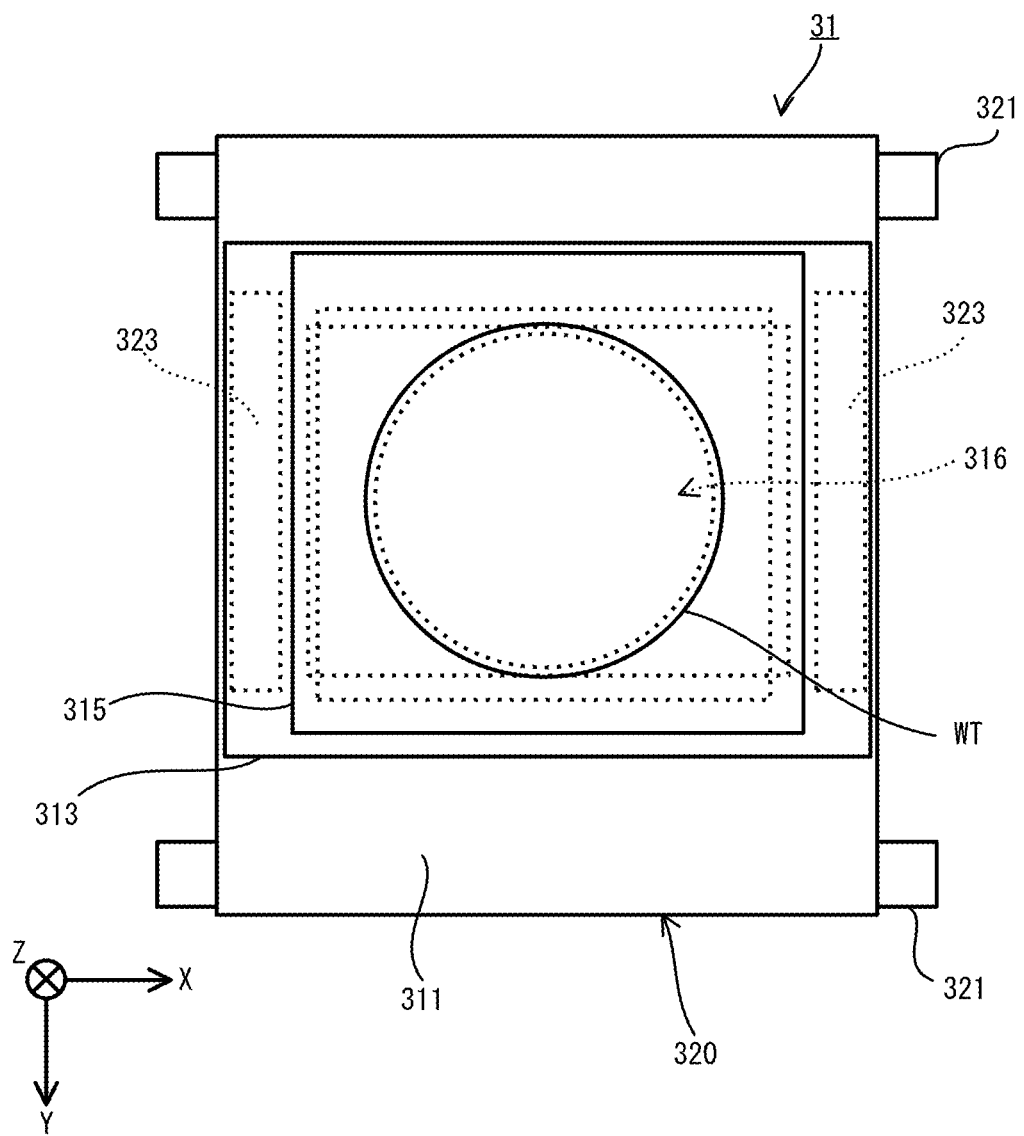
FIG. 8A is a plan view of a stage unit according to Embodiment 1.
Figure 8B:
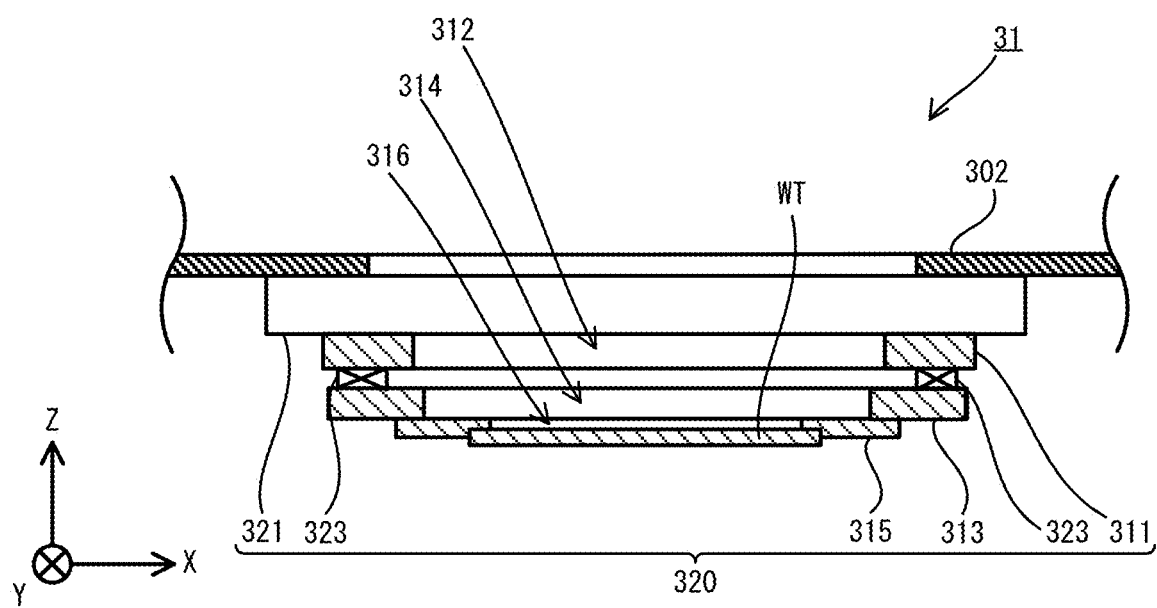
FIG. 8B is a side view of the stage unit according to Embodiment 1.

The stage driver 320 is a substrate holder driver that includes an X-direction mover 311, a Y-direction mover 313, X-direction drivers 321, and Y-direction drivers 323, as illustrated in FIGS. 8A and 8B. The X-direction mover 311 is fixed to abase member 302 of the bonding device 30 via two X-direction drivers 321. The two X-direction drivers 321 are arranged in such a manner as to respectively extend in the X-direction and be separated from each other in the Y-direction. Each of the X-direction drivers 321 includes a linear motor and a slide rail and moves the X-direction mover 311 in the X-direction with respect to the fixed member 301. The Y-direction mover 313 is arranged on the lower side (−Z-direction) of the X-direction mover 311 via two Y-direction drivers 323. The two Y-direction drivers 323 are arranged in such a manner as to respectively extend in the Y-direction and be separated from each other in the X-direction. Each of the Y-direction drivers 323 includes a linear motor and a slide rail and moves the Y-direction mover 313 in the Y-direction with respect to the X-direction mover 311. The stage 315 is fixed to the Y-direction mover 313.

The stage 315 moves in the X-direction and the Y-direction in accordance with the movements of the X-direction drivers 311 and the Y-direction drivers 313. At a central portion of the X-direction mover 311, an opening 312 having a rectangular shape in plan view is disposed, and, at a central portion of the Y-direction mover 313, an opening 314 having a rectangular shape in plan view is also disposed. At a central portion of the stage 315, an opening 316 having a circular shape in plan view is disposed. Marks on the substrate WT are recognized by the imaging device 41 through the openings 312, 314, and 316. In addition, by arranging an infrared ray radiator (not illustrated), the substrate WT is irradiated with infrared rays and can thereby be heated.

The imaging device 41 is arranged above the stage 315, as illustrated in FIGS. 2 and 4. The imaging device 41 images the alignment marks MC1a and MC1b on the substrate WT from vertically above (+Z-direction) the substrate WT, with the chip CP arranged at a position on the substrate WT at which a chip CP is mounted. With this configuration, the imaging device 41 acquires an imaged image including images of the alignment marks MC1a and MC1b on the substrate WT. The controller 90 recognizes a relative position of a mounting position of the chip CP with respect to the head 33H in a direction parallel with a surface of the substrate WT on which the chip CP is mounted, based on the imaged image acquired by the imaging device 41. The imaging device 41 includes an image sensor 418, an optical system 419, and a coaxial illumination system (not illustrated). The imaging device 41 acquires image data relating to reflected light of illuminating light (for example, infrared light) that is emitted from a light source (not illustrated) of the coaxial illumination system.

Figure 9A:
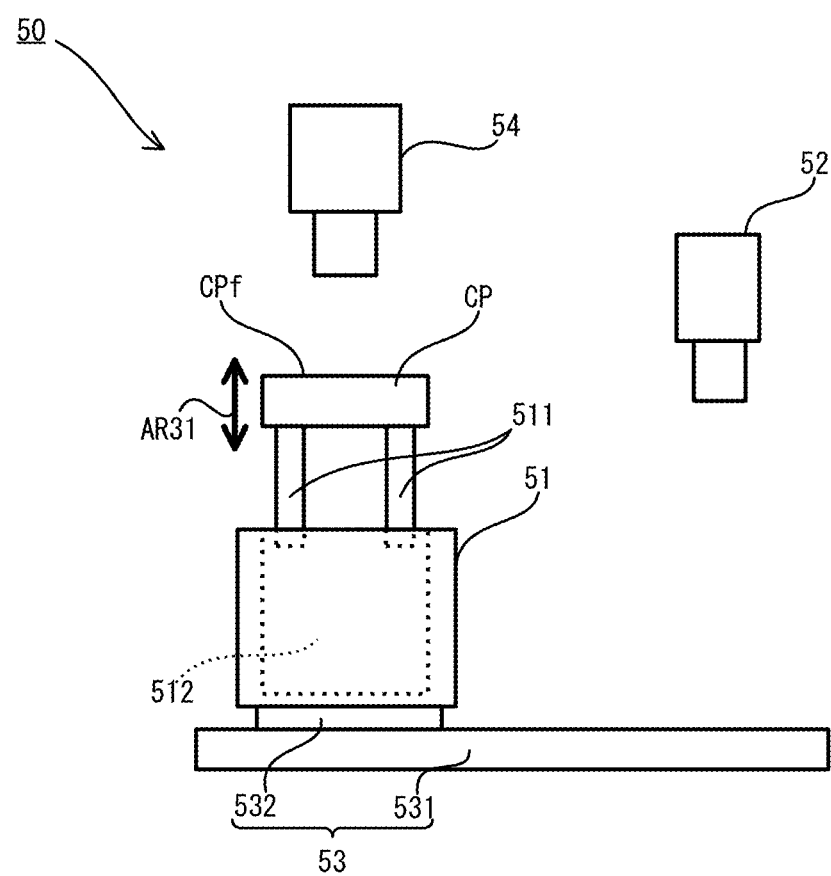
FIG. 9A is a schematic side view of a cleaning device according to Embodiment 1.

The cleaning device 50 includes a chip stage 51 that supports a chip CP, a chip stage driver 53 that drives the chip stage 51, and a cleaning head 52 that discharges water to which ultrasonic waves or megasonic vibration is provided or cleaning fluid reducing electrode surfaces, as illustrated in FIG. 9A. The cleaning device 50 also includes a cleaned chip imaging device 54 that images the chip CP placed on the chip stage 51. The chip stage 51 includes chip supporters 511 that support the chip CP and a support driver 512.

Each of the chip supporters 511 is, for example, a cylindrical suction post and can be switched between a state of a tip portion thereof projecting vertically upward from the placement surface of the chip stage 51 and a state of the tip portion thereof being retracted into the chip stage 51. The chip supporters 511 support the opposite side to the bonding surface CPf side of the chip CP. The support driver 512 drives the chip supporters 511 in the vertical direction and, in conjunction therewith, causes the chip CP to be sucked on the tip portions of the chip supporters 511 by decompressing the insides of the chip supporters 511 with the chip CP placed on the tip portions of the chip supporters 511. The support driver 512 moves the chip supporters 511 to the vertically upper side of the chip holder 393 of the chip transportation device 39, with the chip holder 393 holding the chip CP and being positioned at a transfer position (see Pos10 in FIG. 1) to the cleaning device 50 and the chip supporters 511 supporting the central portion of the chip CP on the tip portions thereof. This movement causes the chip CP to be transferred from the chip holder 393 of the chip transportation device 39 to the chip stage 51. The chip stage driver 53 includes an XY direction driver 531 that drives the chip stage 51 in two directions (XY directions) that are orthogonal to the vertical direction and orthogonal to each other and a rotary driver 532 that rotates the chip stage 51 within a plane that is orthogonal to the vertical direction.

Figure 9B:
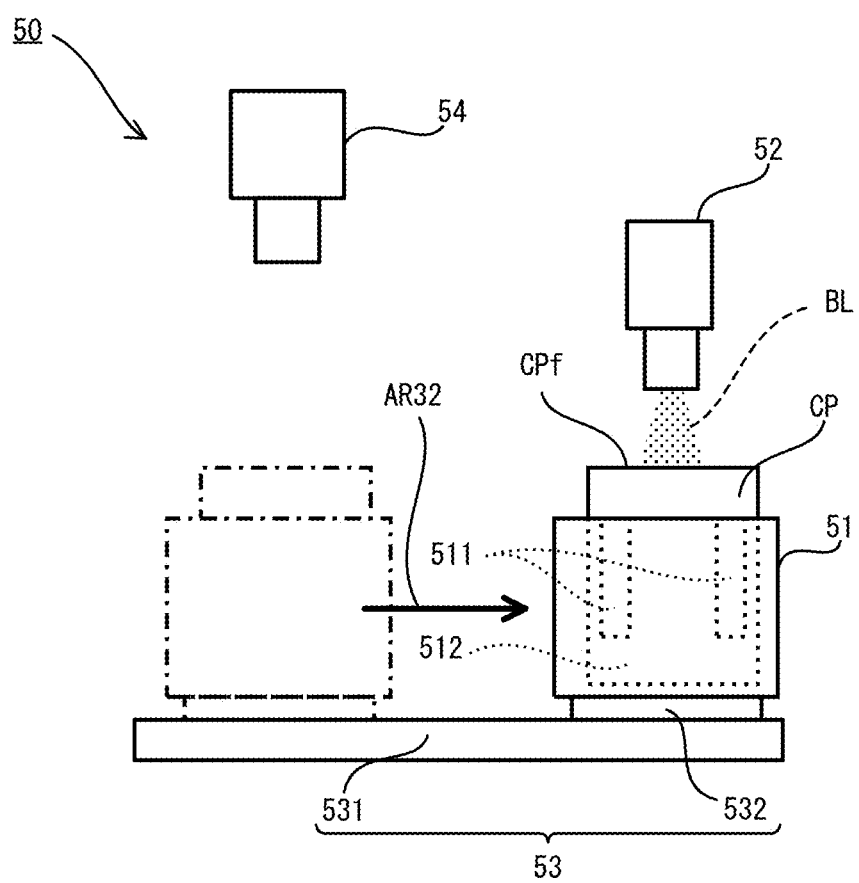
FIG. 9B is a schematic side view illustrating a manner in which the cleaning device according to Embodiment 1 cleans a chip.
Figure 10:
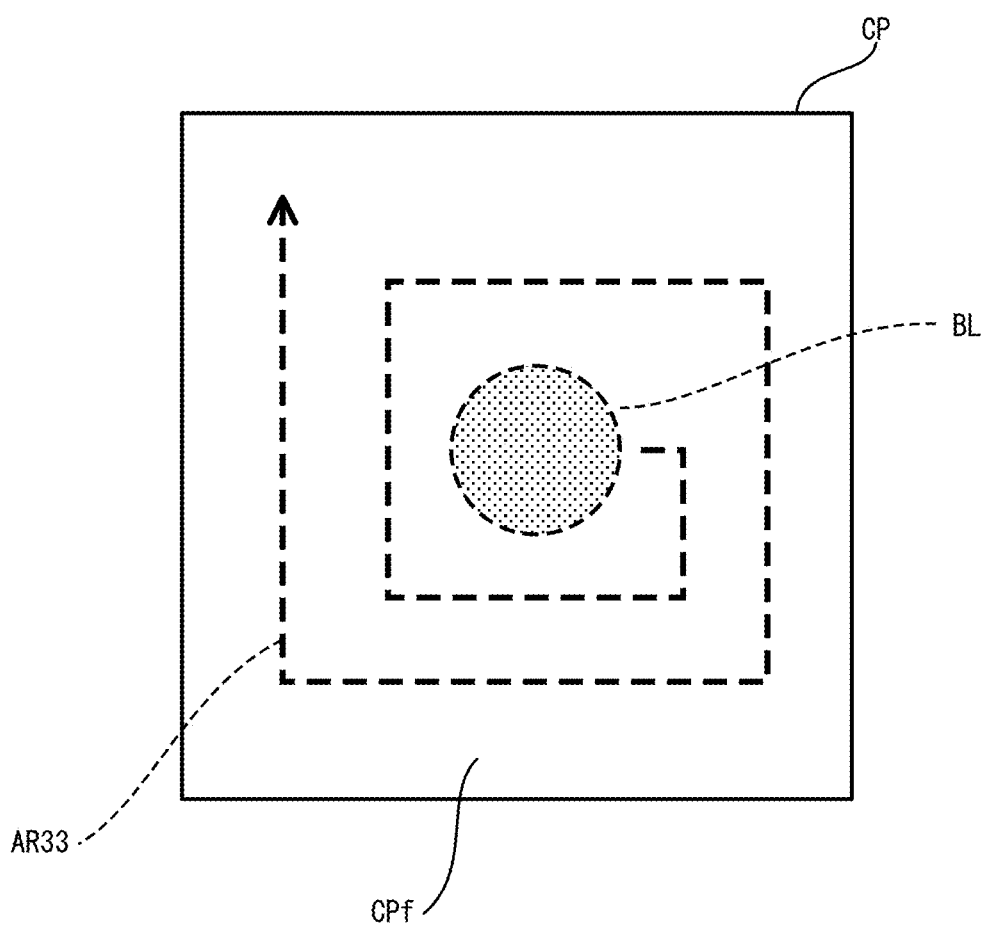
FIG. 10 is an operation explanation diagram of the cleaning device according to Embodiment 1.

When a chip CP is transferred from the chip transportation device 39 to the chip stage 51, the cleaning device 50 first moves the chip stage 51 to a position vertically below the cleaning head 52, as illustrated by an arrow AR32 in FIG. 9B. The cleaning device 50, spraying water BL to which ultrasonic waves are applied on the chip CP by use of the cleaning head 52, makes the chip stage 51 supporting the chip CP scan in XY directions and cleans the entire bonding surface CPf of the chip CP. On this occasion, the cleaning device 50 makes the water BL spirally scan on the bonding surface CPf of the chip CP, as illustrated by, for example, an arrow AR33 in FIG. 10. The cleaning device 50 stops the discharge of water by the cleaning head 52 and subsequently spin-dries the chip CP by rotating the chip stage 51. Subsequently, the cleaning device 50 moves the chip stage 51 to the original position and adjusts the attitude of the chip CP after cleaning, based on an imaged image imaged by the cleaned chip imaging device 54. The cleaning device 50 transfers the chip CP after cleaning to the chip holder 393 of the chip transportation device 39 again. This configuration enables the attitude of the chip CP to be adjusted with the chip CP placed on the chip stage 51 immediately before handing over the chip CP to the head 33H of the bonder 33 even if a deviation has occurred to the attitude of the chip CP at the time of cutout of the chip CP at the chip supply 11. Therefore, it is possible to transfer the chip CP to the head 33H without positional deviation. Note that the cleaning device 50 may be a device that, by blowing, for example, inert gas, such as N2, in place of water on the chip CP, removes particles attached to the chip CP.

The chip collector 60 collects a chip CP that was not bonded to the substrate WT and has been left on the head 33H in the bonding device 30. The chip collector 60 is arranged at a stage succeeding to the head 33H in the turning direction of the plates 391 when viewed from the axis AX (fulcrum) of the plates 391.

Figure 11:
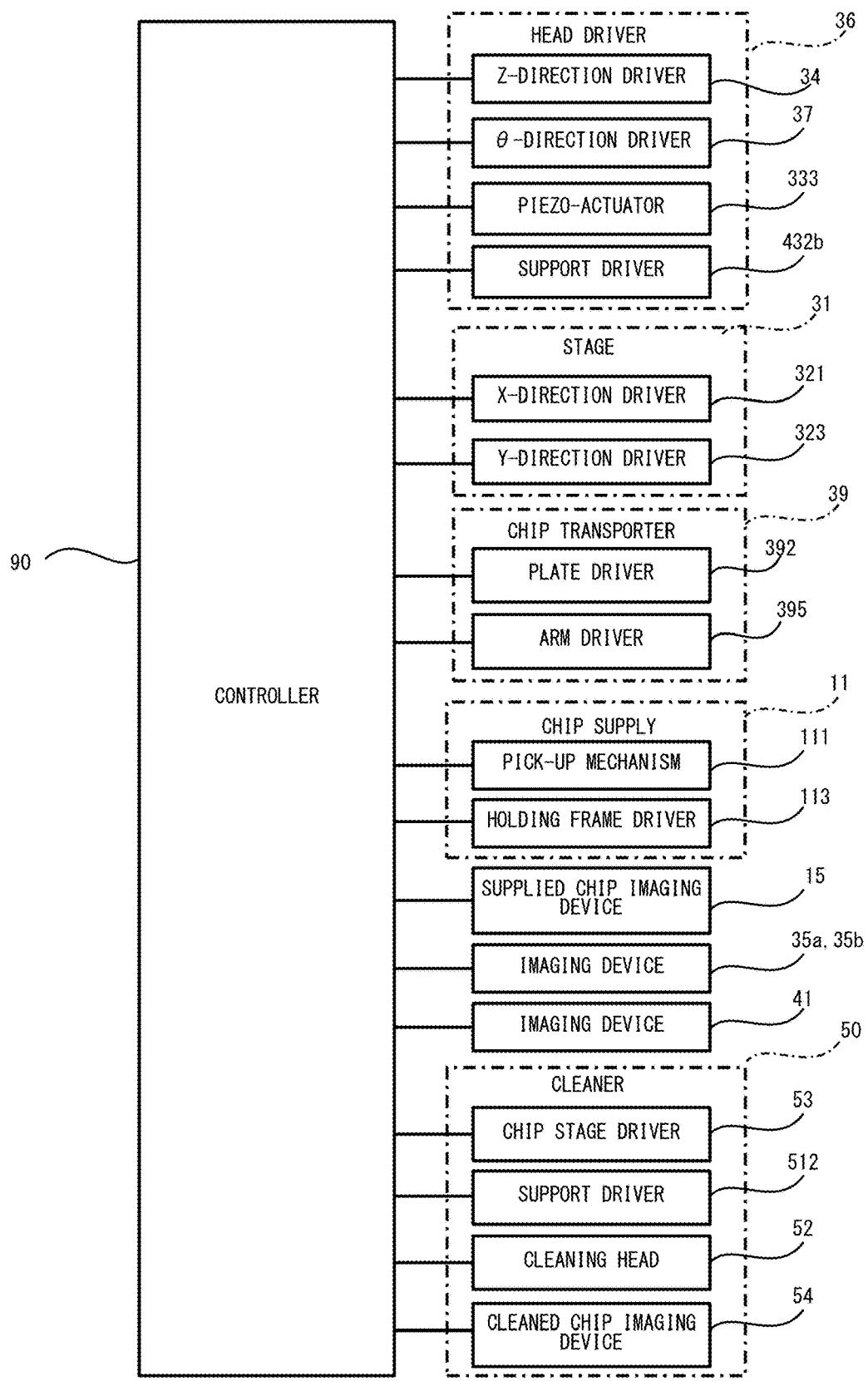
FIG. 11 is a block diagram of the component mounting system according to Embodiment 1.

The controller 90 includes a micro processing unit (MPU), a main storage, an auxiliary storage, an interface, and a bus connecting the components to one another. In this configuration, the main storage is constituted by a volatile memory and is used as a working area for the MPU. The auxiliary storage is constituted by a nonvolatile memory and stores programs that the MPU executes. The auxiliary storage also stores information indicating first distance and second distance, which will be described later. The controller 90 is connected to the supplied chip imaging device 15, the imaging devices 35a and 35b, the imaging device 41, the cleaned chip imaging device 54, the Z-direction driver 34, the θ-direction driver 37, the piezo-actuators 333, the support driver 432b, the X-direction drivers 321, the Y-direction drivers 323, the plate driver 392, the arm drivers 395, the pick-up mechanism 111, the holding frame driver 113, the chip stage driver 53, the support driver 512, and the cleaning head 52, as illustrated in FIG. 11. The interface converts imaged image signals input from the supplied chip imaging device 15, the imaging devices 35a and 35b, the imaging device 41, and the cleaned chip imaging device 54 to imaged image information and outputs the imaged image information to the bus. In addition, the MPU, by reading programs stored in the auxiliary storage into the main storage and executing the programs, respectively outputs control signals to the Z-direction driver 34, the θ-direction driver 37, the piezo-actuators 333, the support driver 432b, the X-direction drivers 321, the Y-direction drivers 323, the plate driver 392, the arm drivers 395, the pick-up mechanism 111, the holding frame driver 113, the chip stage driver 53, the support driver 512, and the cleaning head 52 via the interface.

The controller 90 calculates a relative positional error between a substrate WT and a chip CP from images that are acquired by imaging alignment marks MC1a, MC1b, MC2a, and MC2b with the substrate WT and the chip CP in contact with each other. The controller 90 makes the Z-direction driver 34 and the θ-direction driver 37 of the head driver 36 and the X-direction drivers 321 and the Y-direction drivers 323 of the stage 31 correct the position and attitude of the chip CP with respect to the substrate WT according to the calculated relative positional error. The controller 90 also makes the holding frame driver 113 correct the position and the inclination about the Z-axis of the sheet holding frame 112 according to the position and attitude of a chip CP to be cut out by the pick-up mechanism 111. In this processing, the controller 90 recognizes the position and attitude of the chip CP, based on image data input from the supplied chip imaging device 15. Further, the controller 90 further makes the chip stage driver 53 correct the position and the inclination about the Z-axis of the chip stage 51 according to the position and attitude of a chip CP placed on the chip stage 51. In this processing, the controller 90 recognizes the position and attitude of the chip CP, based on image data input from the cleaned chip imaging device 54.

Figure 12A:
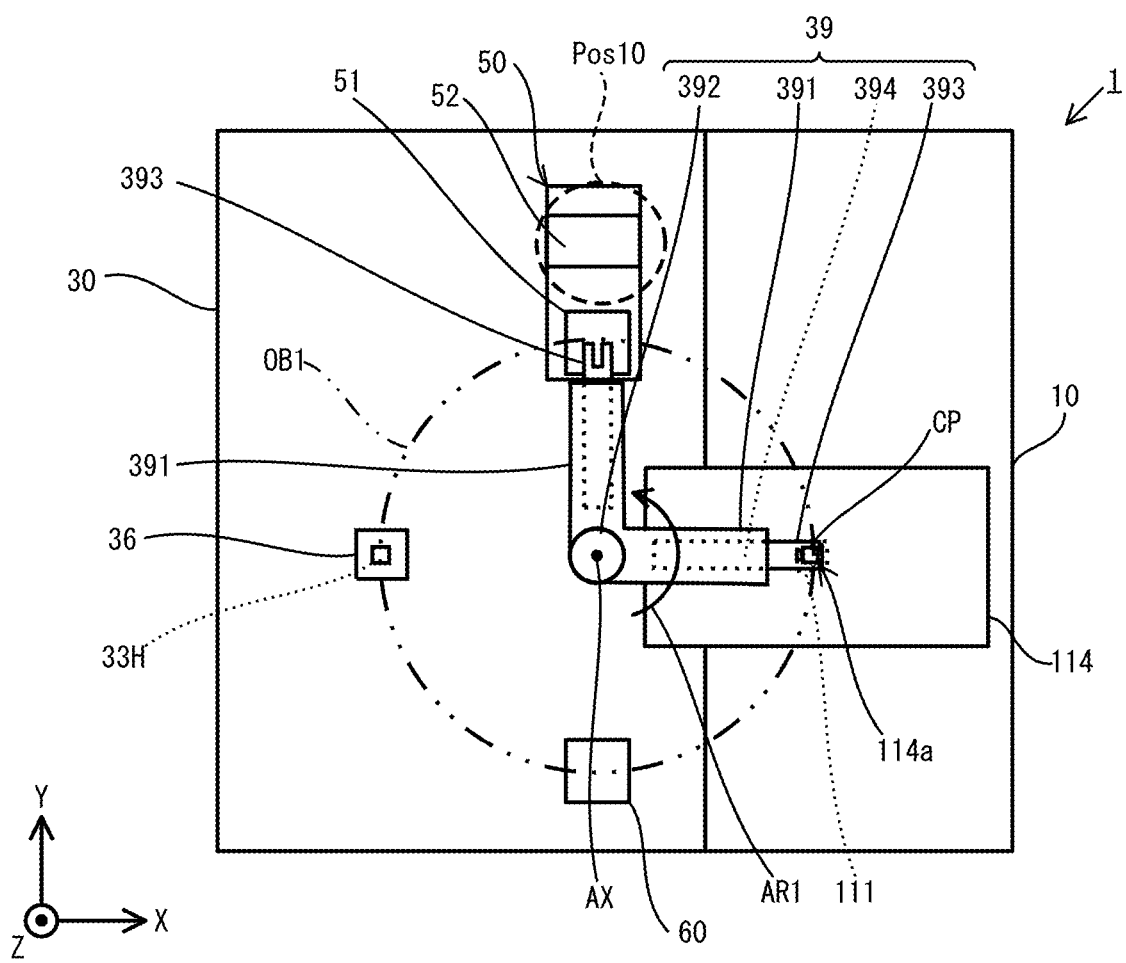
FIG. 12A is a schematic plan view illustrating a manner in which a chip is supplied from a chip supply in the chip mounting system according to Embodiment 1.
Figure 12B:
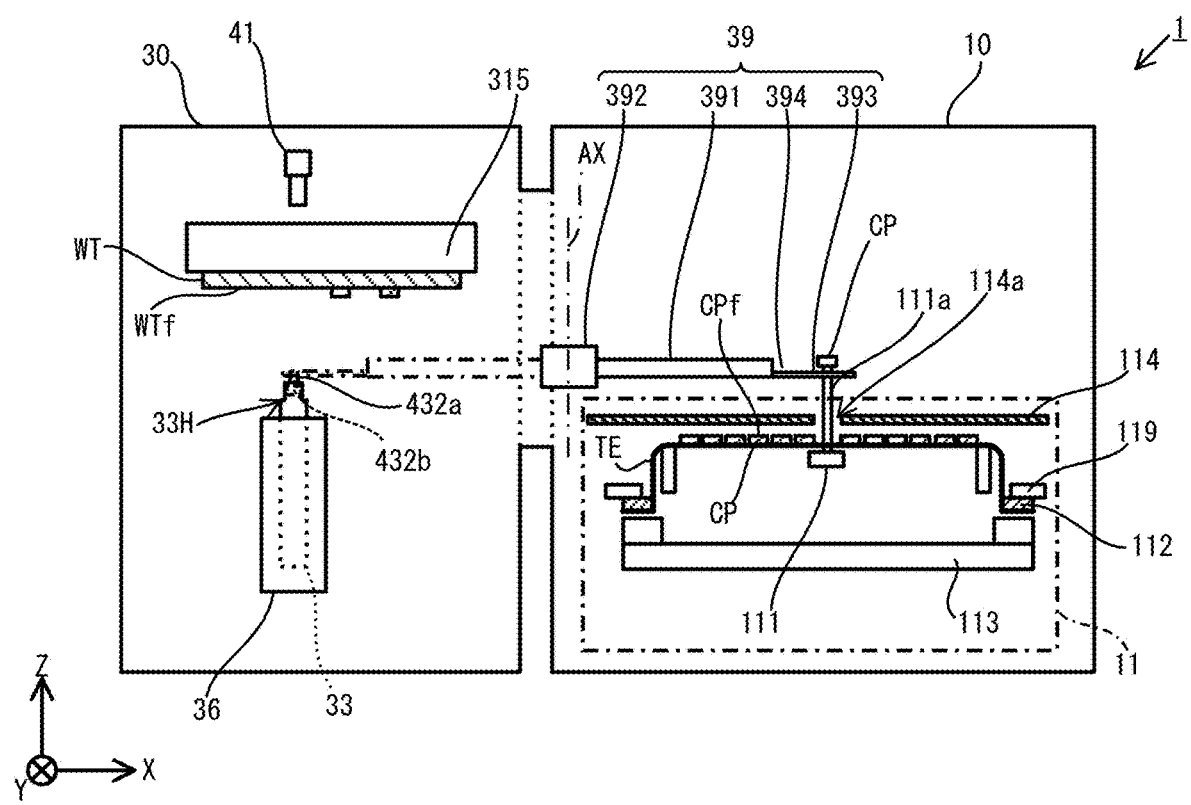
FIG. 12B is a schematic side view illustrating the manner in which a chip is supplied from the chip supply in the chip mounting system according to Embodiment 1.

Next, operation of the chip mounting system 1 according to the present embodiment will be described, referring to FIGS. 12A to 19. First, the chip mounting system 1 is set to a state in which one plate 391 is directed toward the chip supply 11. Next, the pick-up mechanism 111, by moving vertically upward, cuts out one chip CP from the opposite side of the sheet TE to the side thereof on which a plurality of chips CP is stuck and brings the one chip CP into a state of being detached from the sheet TE. While the chip CP is in this state, the chip transportation device 39 projects the arm 394 out of the plate 391. On this occasion, the chip holder 393 and the pick-up mechanism 111 are brought to a state in which the needles 111a of the pick-up mechanism 111 are arranged between two leg pieces 393a of the chip holder 393. In this way, the chip holder 393 and the chip CP are brought to a state in which the chip CP can be transferred to the chip holder 393, as illustrated in FIGS. 12A and 12B. When the pick-up mechanism 111 is moved vertically downward while the chip holder 393 and the chip CP are in this state, the chip CP is transferred to the chip holder 393.

Figure 13A:
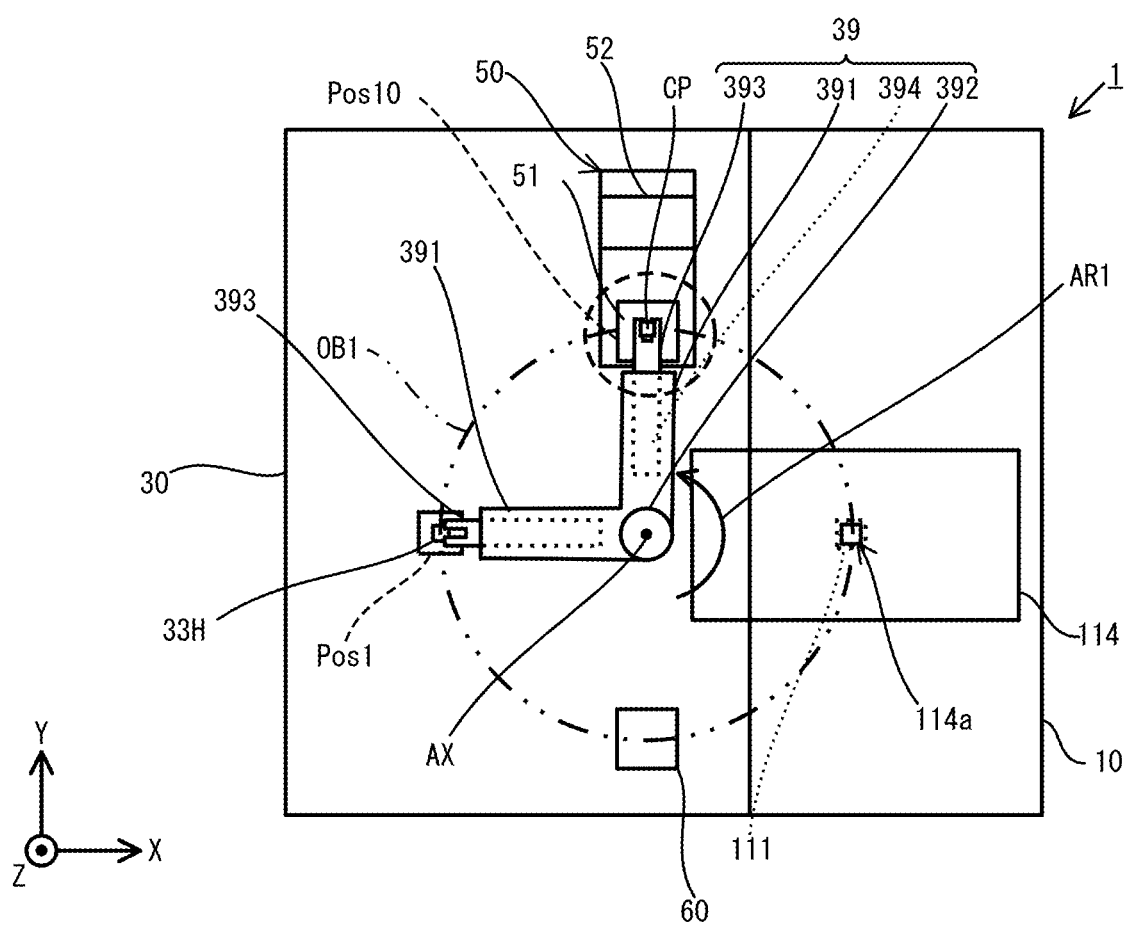
FIG. 13A is a schematic plan view illustrating a manner in which a chip holder has been moved to a position vertically above a cleaning device in the chip mounting system according to Embodiment 1.
Figure 13B:
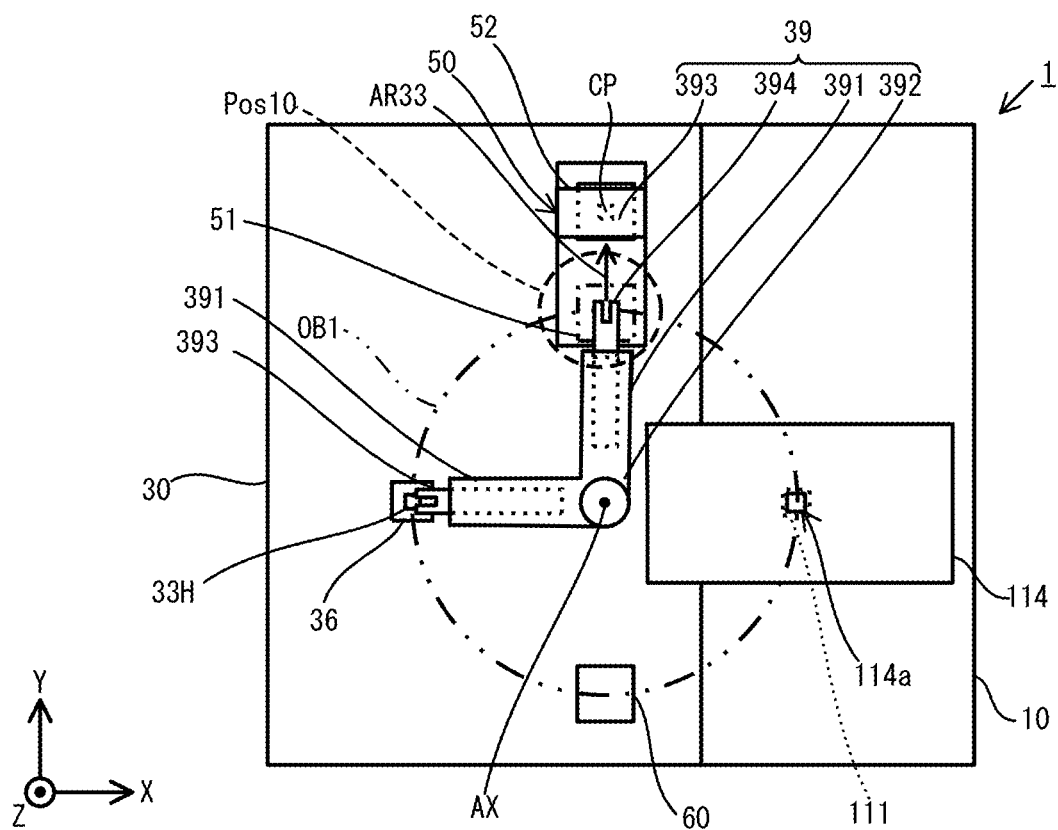
FIG. 13B is a schematic plan view illustrating a manner in which a chip stage is moved to a position vertically below a cleaning head in the chip mounting system according to Embodiment 1.

Succeedingly, when the chip mounting system 1 rotates the plate 391 in the direction of the arrow AR1 in FIG. 12A by 90 degrees, the plate 391 is arranged at a position Pos10 illustrated in FIG. 13A at which the chip CP is transferred to the cleaning device 50. In other words, the chip transportation device 39 transports the chip holder 393 that holds the chip CP supplied from the chip supply 11 to the position Pos10 at which the chip CP is transferred to the cleaning device 50. While the chip holder 393 is in this state, the chip transportation device 39 transfers the chip CP from the chip holder 393 to the chip stage 51 of the cleaning device 50. The cleaning device 50 moves the chip stage 51 supporting the chip CP to a position vertically below the cleaning head 52, as illustrated by the arrow AR33 in FIG. 13B. The cleaning device 50 cleans the chip CP, using water discharged from the cleaning head 52. Subsequently, the cleaning device 50 moves the chip stage 51 supporting the chip CP after cleaning to the position Pos10 again. Next, the cleaning device 50 moves the chip stage 51 and thereby adjusts the attitude of the chip CP supported by the chip stage 51. Succeedingly, the cleaning device 50 transfers the chip CP supported by the chip stage 51 to the chip holder 393 of the chip transportation device 39 again.

Figure 14A:
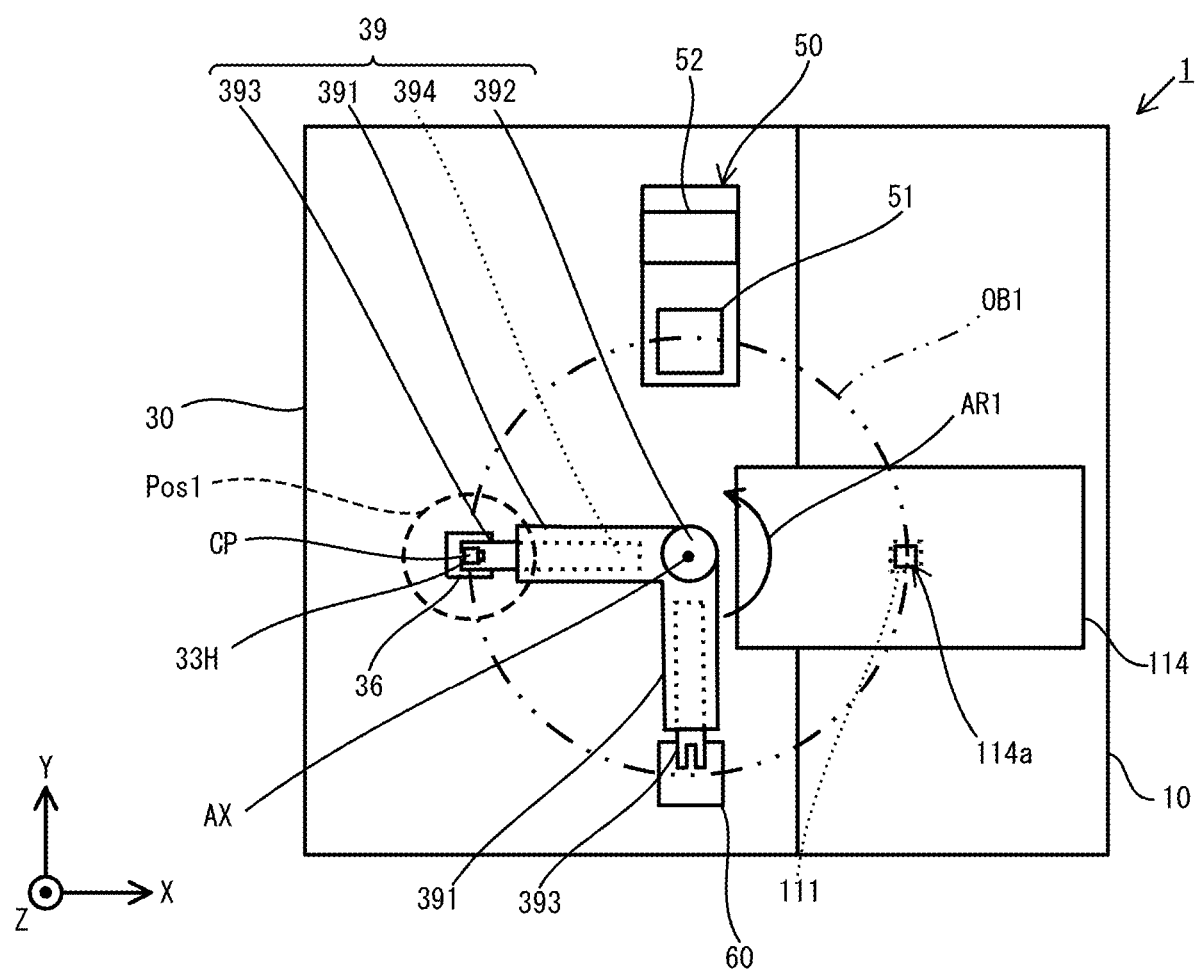
FIG. 14A is a schematic plan view illustrating a manner in which a chip is handed over from the chip transportation device to a head in the chip mounting system according to Embodiment 1.
Figure 14B:
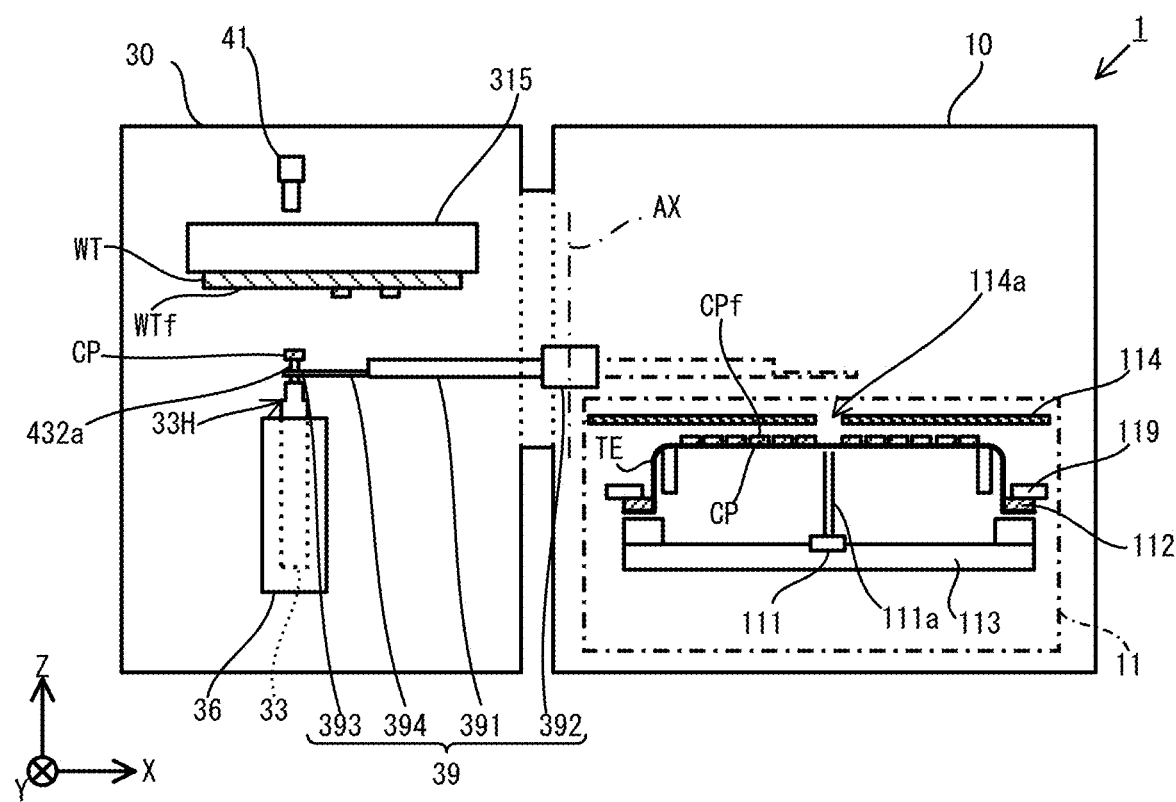
FIG. 14B is a schematic side view illustrating the manner in which a chip is handed over from the chip transportation device to the head in the chip mounting system according to Embodiment 1.

Subsequently, the chip mounting system 1 rotates the plate 391 in the direction of the arrow AR1 in FIG. 14A by 90 degrees. On this occasion, the chip holder 393 at the tip portion of the arm 394 of the chip transportation device 39 is arranged at the transfer position Pos1 vertically above the head 33H of the bonder 33. In other words, the chip transportation device 39 transports the chip CP received at the position Pos10 to the transfer position Pos1 at which the chip CP is transferred to the head 33H. The head driver 36 moves the bonder 33 vertically upward and brings the head 33H close to the chip holder 393 of the chip transportation device 39. Next, the support driver 432b moves the chip supporter 432a vertically upward. This movement causes the chip CP having been held by the chip holder 393 to be arranged on the vertically upper side of the chip holder 393 while being supported on the top end of the chip supporter 432a, as illustrated in FIG. 14B. Succeedingly, the chip transportation device 39 retracts the arm 394 into the plate 391. Subsequently, the support driver 432b moves the chip supporter 432a vertically downward. This movement causes the chip CP to be held on the tip portion of the head 33H.

Figure 15:
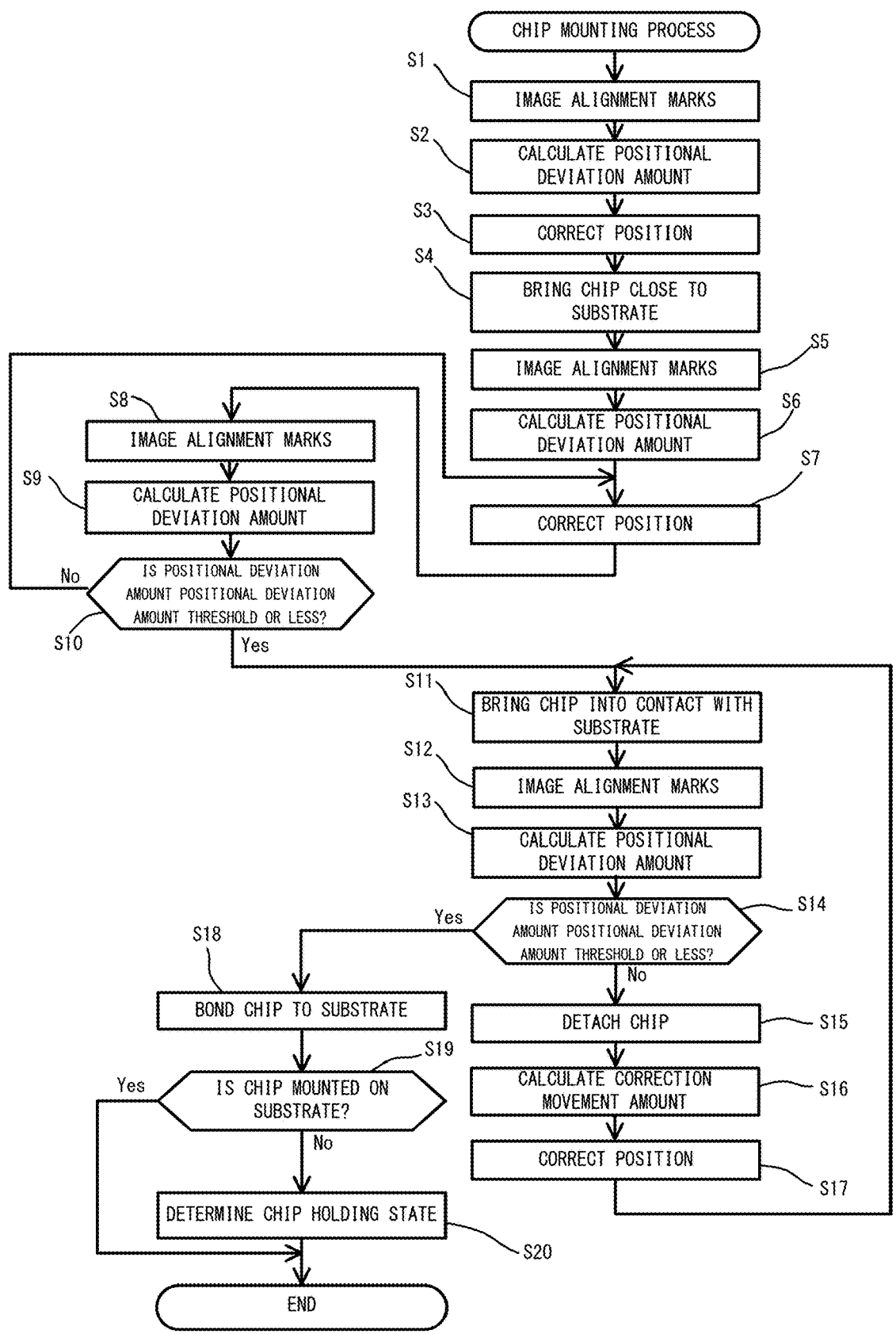
FIG. 15 is a flowchart illustrating an example of a flow of a chip mounting process that the chip mounting system according to Embodiment 1 performs.
Figure 16A:
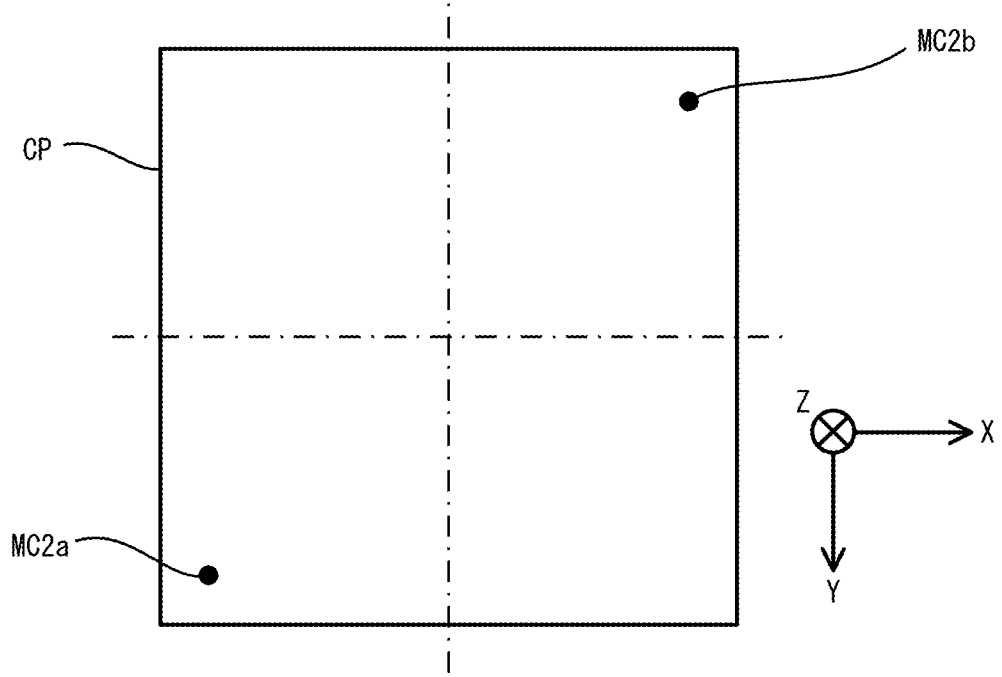
FIG. 16A is a diagram illustrating alignment marks disposed on a chip according to Embodiment 1.
Figure 16B:
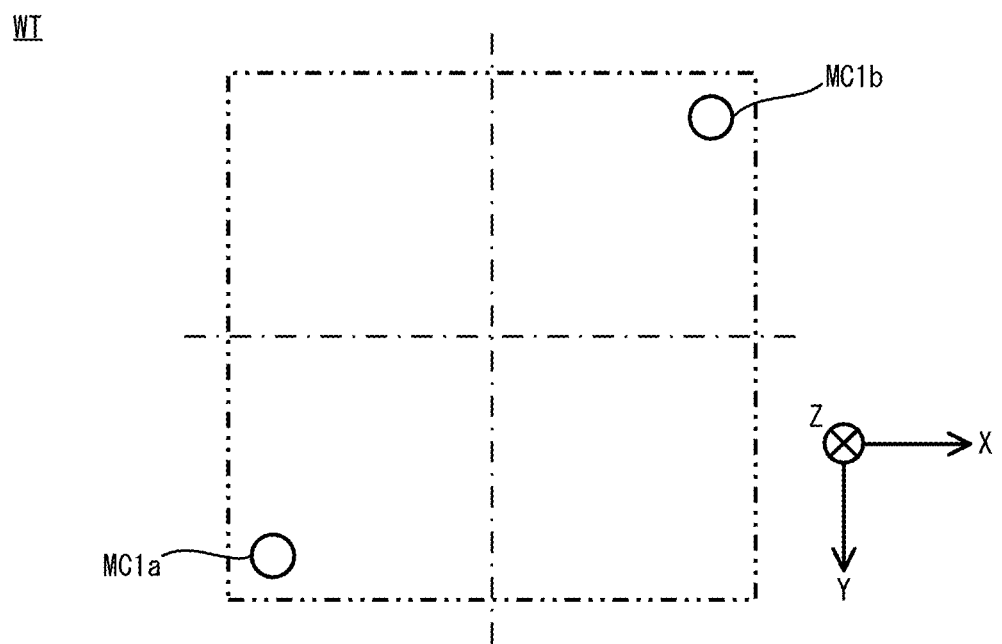
FIG. 16B is a diagram illustrating alignment marks disposed on a substrate according to Embodiment 1.

Next, the chip mounting system 1 performs a chip mounting process in which the chip CP is mounted on the substrate WT in the bonding device 30. The chip mounting process that the chip mounting system 1 performs will be described below, referring to FIGS. 15 to 18. On the chip CP, alignment marks MC2a and MC2b as illustrated in, for example, FIG. 16A are disposed. On the other hand, at positions on the substrate WT at which the chip CP is mounted, alignment marks MC1a and MC1b as illustrated in, for example, FIG. 16B are disposed. In addition, the chip mounting system 1 is in a state in which the chip CP has been transferred from the chip transportation device 39 to the head 33H and the alignment marks MC2a and MC2b on the chip CP and the alignment marks MC1a and MC1b on the substrate WT are separated from each other by a second distance that is longer than a preset first distance at which the distance between the alignment marks MC2a and MC2b and the alignment marks MC1a and MC1b falls within a depth-of-field range of the imaging devices 35a and 35b. The first distance G1 is set at, for example, a distance in a range of 10 μm to 100 μm.

First, the chip mounting system 1 performs a second imaging step of imaging the alignment marks MC2a and MC2b on the chip CP and the alignment marks MC1a and MC1b on the substrate WT with the chip CP having been transferred from the chip transportation device 39 to the head 33H and the chip CP and the substrate WT separated from each other (step S1). In this step, the controller 90 makes the imaging devices 35a and 35b image the alignment marks MC2a and MC2b on the chip CP and the imaging device 41 image the alignment marks MC1a and MC1b on the substrate WT. In other words, the controller 90 makes the imaging devices 35a and 35b and the imaging device 41 image the alignment marks MC2a and MC2b on the chip CP and the alignment marks MC1a and MC1b on the substrate WT, respectively.

Succeedingly, the chip mounting system 1 performs a second step of calculating amount of positional deviation of calculating relative positional deviation amounts between the substrate WT and the chip CP from an imaged image of the alignment marks MC1a and MC1b and imaged images of the alignment marks MC2a and MC2b, which were individually imaged by the imaging devices 35a and 35b and the imaging device 41 (step S2).

Subsequently, the chip mounting system 1 performs a second position correction step of performing correction of the position of the chip CP with respect to the substrate WT by moving the stage 315 in a horizontal direction with respect to the head 33H in such a way as to eliminate the calculated positional deviation amounts (step S3). In this step, the chip mounting system 1 moves the stage 315 in the X-direction, Y-direction, and the rotational direction about the Z-axis with the head 33H fixed in such a way as to eliminate positional deviation amounts Δx, Δy, and Δθ.

Specifically, the controller 90 controls the stage driver 320 to relatively move the chip CP with respect to the substrate WT in a horizontal direction, that is, in a direction parallel with the mounting surface WTf of the substrate WT, based on the calculated positional deviation amounts.

Next, the chip mounting system 1 performs a movement step of bringing the chip CP closer to the substrate WT by moving the head 33H holding the chip CP vertically upward (step S4). In this step, the chip mounting system 1 brings the chip CP close to the substrate WT until the alignment marks MC2a and MC2b on the chip CP and the alignment marks MC1a and MC1b on the substrate WT are brought to a state of being separated from each other by a preset first distance G1 at which the distance between the alignment marks MC2a and MC2b and the alignment marks MC1a and MC1b falls within the depth-of-field range of the imaging devices 35a and 35b, as illustrated in, for example, FIG. 18A. The first distance G1 above is set at, for example, a distance in a range of 10 μm to 100 μm.

Figure 17:
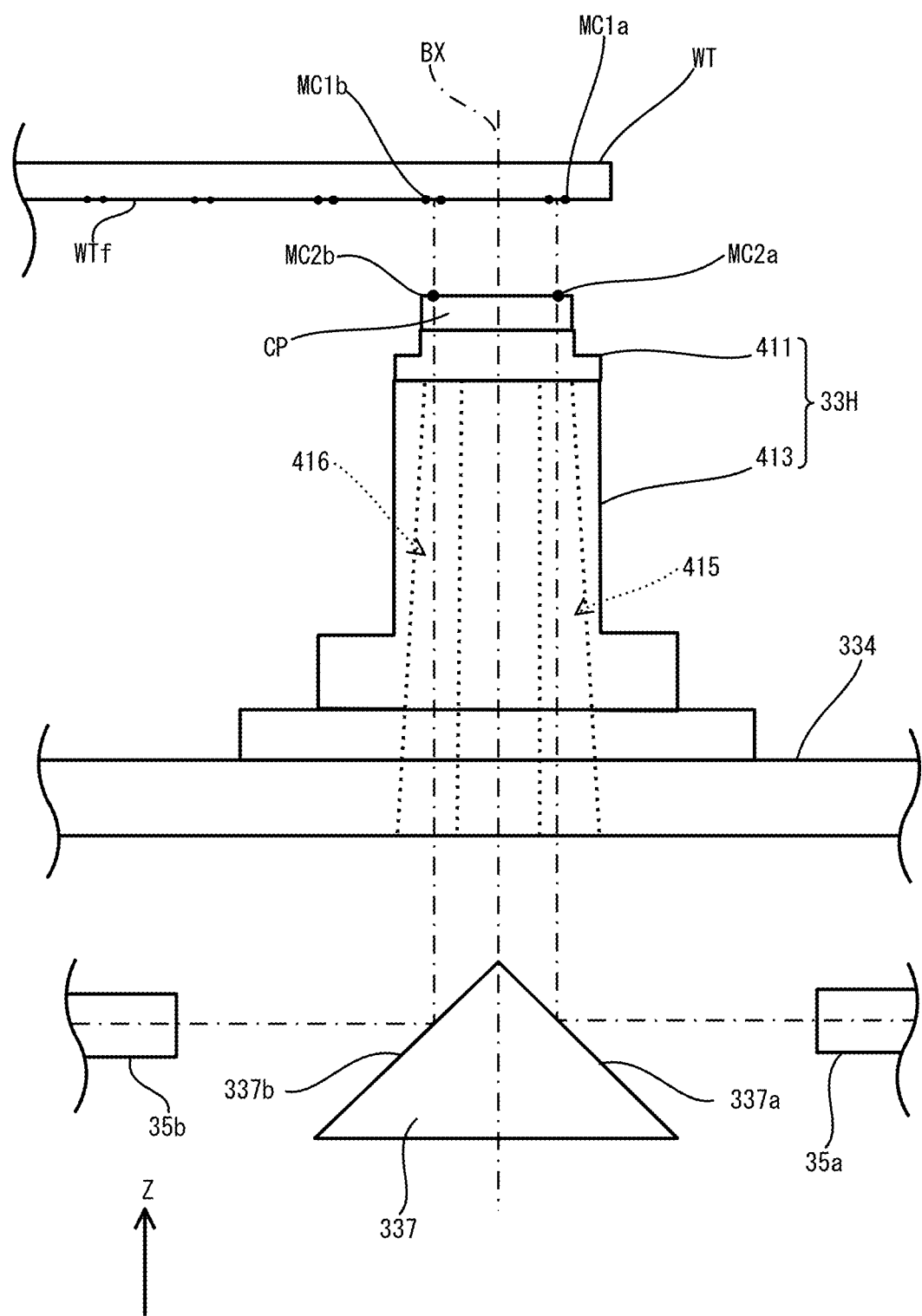
FIG. 17 is a diagram illustrating a detail of the head according to Embodiment 1.
Figure 18A:
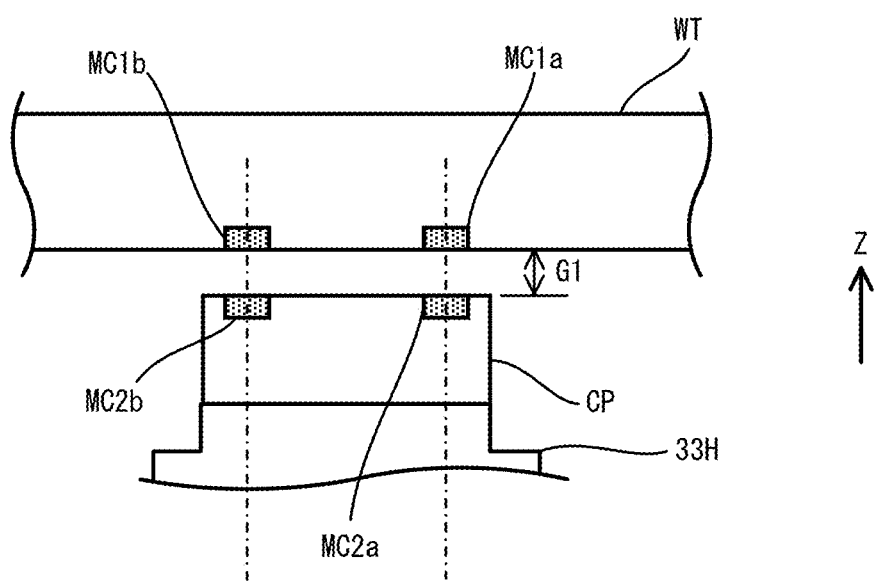
FIG. 18A is a diagram illustrating a state in which a chip is separated from a substrate in the chip mounting system according to Embodiment 1.
Figure 18B:
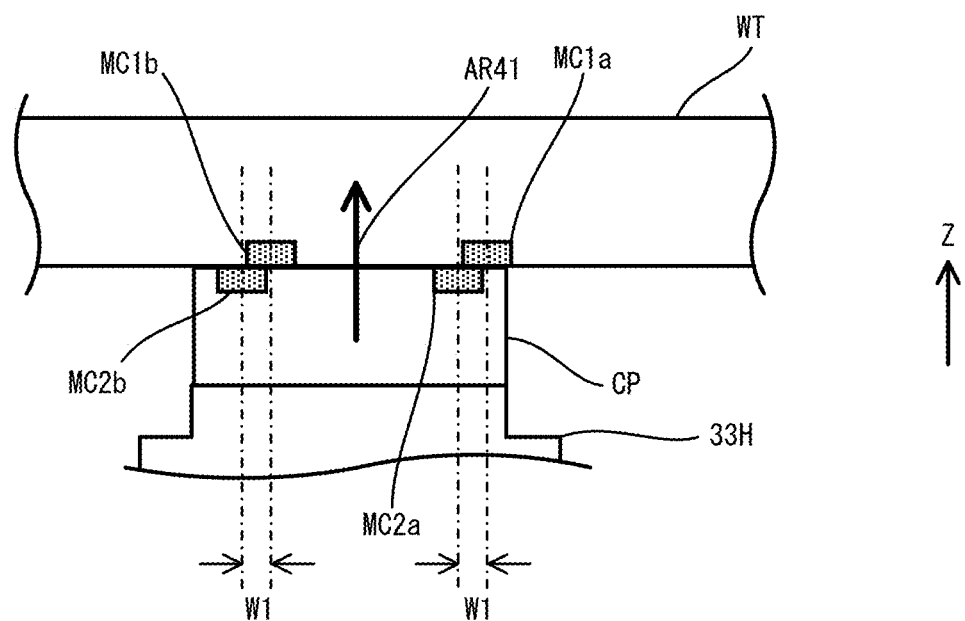
FIG. 18B is a diagram illustrating a state in which the chip is brought into contact with the substrate in the chip mounting system according to Embodiment 1.
Figure 18C:
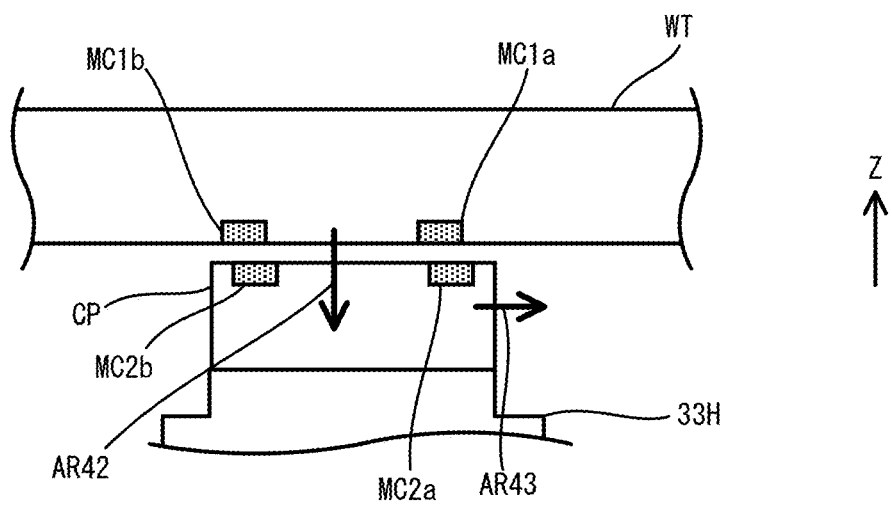
FIG. 18C is a diagram illustrating a manner in which the chip is detached from the substrate in the chip mounting system according to Embodiment 1.

Succeedingly, the chip mounting system 1 performs a first imaging step of imaging the alignment marks MC2a and MC2b on the chip CP and the alignment marks MC1a and MC1b on the substrate WT again with the chip CP and the substrate WT separated from each other by the first distance G1 (step S5). In this step, the chip mounting system 1 performs imaging of the alignment marks MC1a and MC2a by the imaging device 35a and imaging of the alignment marks MC1b and MC2b by the imaging device 35b at the same time. In this processing, as illustrated in FIG. 17, a portion of light that was emitted from the imaging device 35a, was reflected by the mirror 337, and passed the cavity 415 of the head 33H is transmitted through the chip tool 411 and the chip CP. A portion of the light that was transmitted through the chip CP is reflected by a part of the substrate WT at which the alignment mark MC1a is disposed. In addition, a portion of the rest of the light having passed the cavity 415 of the head 33H is reflected by a part of the chip CP at which the alignment mark MC2a is disposed. The light reflected by the part of the substrate WT at which the alignment mark MC1a is disposed or the part of the chip CP at which the alignment mark MC2a is disposed is transmitted through the chip tool 411 and passes the cavity 415 of the head 33H. The light that has passed the cavity 415 of the head 33H is reflected by the mirror 337 and is incident on the imaging element of the imaging device 35a. This processing causes the chip mounting system 1 to acquire an imaged image Ga including an image of the alignment mark MC2a, which is disposed on the chip CP, and an image of the alignment mark MC1a, which is disposed on the substrate WT. The chip mounting system 1 simultaneously recognizes a pair of the alignment mark MC2a on the chip CP and the alignment mark MC1a on the substrate WT in one imaging by the identical imaging device 35a without moving the focal axis.

In addition, a portion of light that was emitted from the imaging device 35b, was reflected by the mirror 337, and passed the cavity 416 of the head 33H is also transmitted through the chip tool 411 and the chip CP. A portion of the light that was transmitted through the chip CP is reflected by a part of the substrate WT at which the alignment mark MC1b is disposed. In addition, a portion of the rest of the light having passed the cavity 416 of the head 33H is reflected by a part of the chip CP at which the alignment mark MC2b is disposed. The light reflected by the part of the substrate WT at which the alignment mark MC1b is disposed or the part of the chip CP at which the alignment mark MC2b is disposed is transmitted through the chip tool 411 and passes the cavity 416 of the head 33H. The light that has passed the cavity 416 of the head 33H is reflected by the mirror 337 and is incident on the imaging element of the imaging device 35b. This processing causes the chip mounting system 1 to acquire an imaged image Gb including an image of the alignment mark MC2b, which is disposed on the chip CP, and an image of the alignment mark MC1b, which is disposed on the substrate WT. The chip mounting system 1 simultaneously recognizes a pair of the alignment mark MC2b on the chip CP and the alignment mark MC1b on the substrate WT in one imaging by the identical imaging device 35b without moving the focal axis.

Figure 16C:
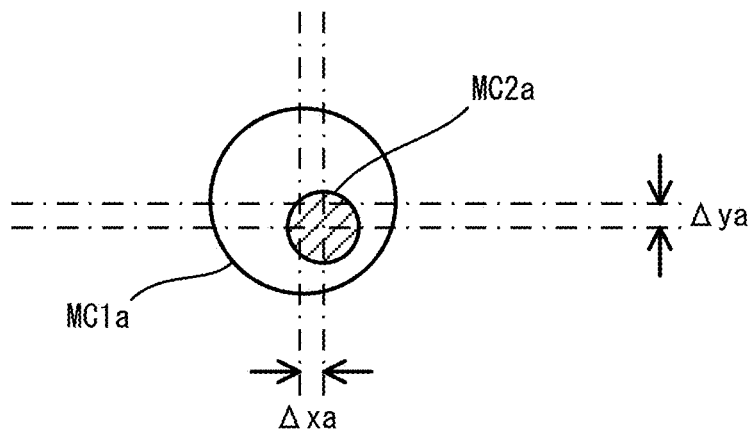
FIG. 16C is a diagram illustrating a relative positional deviation between alignment marks according to Embodiment 1.

Returning to FIG. 15, next, the chip mounting system 1 performs a first step of calculating amount of positional deviation of respectively calculating positional deviation amounts $\Delta x$, $\Delta y$, and $\Delta \theta$ in the X-direction, the Y-direction, and the rotational direction about the Z-axis between the chip CP and the substrate WT, based on the two imaged images Ga and Gb, which were acquired through imaging by the imaging devices 35a and 35b, respectively (step S6). In this step, the controller 90 recognizes the positions of the pair of the alignment marks MC1a and MC2a, which are disposed on the chip CP and the substrate WT, based on the imaged image Ga and calculates positional deviation amounts $\Delta xa$ and $\Delta ya$ between the alignment marks MC1a and MC2a, using a vector correlation method, as illustrated in FIG. 16C. In addition, the chip mounting system 1, as with the above-described processing, recognizes the positions of the pair of the alignment marks MC1b and MC2b, which are disposed on the chip CP and the substrate WT, based on the imaged image Gb and calculates positional deviation amounts $\Delta xb$ and $\Delta yb$ between the alignment marks MC1b and MC2b, using a vector correlation method. The controller 90 calculates positional deviation amounts $\Delta x$, $\Delta y$, and $\Delta \theta$ in horizontal directions of the chip CP with respect to the substrate WT, based on the positional deviation amounts $\Delta xa$, $\Delta ya$, $\Delta xb$, and $\Delta yb$.

Returning to FIG. 15, succeedingly, the chip mounting system 1 performs a first position correction step of correcting the position of the chip CP with respect to the substrate WT by relatively moving the chip CP with respect to the substrate WT in such a way as to reduce the calculated positional deviation amounts $\Delta x$, $\Delta y$, and $\Delta \theta$ (step S7). In this step, the chip mounting system 1 moves the stage 315 in the X-direction, Y-direction, and the rotational direction about the Z-axis with the head 33H fixed in such a way as to eliminate the positional deviation amounts $\Delta x$, $\Delta y$, and $\Delta \theta$. Specifically, the controller 90 controls the stage driver 320 to relatively move the chip CP with respect to the substrate WT in a horizontal direction, that is, in a direction parallel with the mounting surface WTf of the substrate WT, based on the calculated positional deviation amounts. This processing causes each of the pair of the alignment marks MC1a and MC2a and the pair of alignment marks MC1b and MC2b to be aligned with each other in the Z-axis direction, as illustrated in, for example, FIG. 18A.

Returning to FIG. 15, subsequently, the chip mounting system 1 performs the first imaging step of imaging the alignment marks MC2a and MC2b on the chip CP and the alignment marks MC1a and MC1b on the substrate WT again (step S8). Next, the chip mounting system 1 performs the first step of calculating amount of positional deviation of respectively calculating positional deviation amounts $\Delta x$, $\Delta y$, and $\Delta \theta$ in the X-direction, the Y-direction, and the rotational direction about the Z-axis between the chip CP and the substrate WT again (step S9). Succeedingly, the chip mounting system 1 determines whether or not all of the calculated positional deviation amounts $\Delta x$, $\Delta y$, and $\Delta \theta$ are equal to or less than preset positional deviation amount threshold values Δxth, Δyth, and Δθth, respectively (step S10).

It is now assumed that the chip mounting system 1 determines that one of the calculated positional deviation amounts Δx, Δy, and Δθ is greater than the corresponding one of the preset positional deviation amount threshold values Δxth, Δyth, and Δθth (step S10: No). In this case, the chip mounting system 1 performs the processing in step S7 again. On the other hand, it is assumed that the chip mounting system 1 determines that all of the calculated positional deviation amounts Δx, Δy, and Δθ are equal to or less than the preset positional deviation amount threshold values Δxth, Δyth, and Δθth, respectively (step S10: Yes). In this case, the chip mounting system 1 performs a contact step of bringing the bonding surface CPf of the chip CP into contact with the mounting surface WTf of the substrate WT by moving the head 33H vertically upward (step S11). Next, the chip mounting system 1 performs a third imaging step of imaging the alignment marks MC2a and MC2b on the chip CP and the alignment marks MC1a and MC1b on the substrate WT with the chip CP and the substrate WT in contact with each other (step S12). In this step, the chip mounting system 1, as with the above-described processing, performs imaging of the alignment marks MC1a and MC2a by the imaging device 35a and imaging of the alignment marks MC1b and MC2b by the imaging device 35b at the same time.

Next, the chip mounting system 1 performs a third step of calculating amount of positional deviation of respectively calculating positional deviation amounts Δx, Δy, and Δθ in the X-direction, the Y-direction, and the rotational direction about the Z-axis between the chip CP and the substrate WT, based on the two imaged images Ga and Gb, which were acquired through imaging by the imaging devices 35a and 35b, respectively (step S13).

Succeedingly, the chip mounting system 1 determines whether or not all of the calculated positional deviation amounts Δx, Δy, and Δθ are equal to or less than the preset positional deviation amount threshold values Δxth, Δyth, and Δθth, respectively (step S14). In the chip mounting process, caused by, for example, bringing the chip CP into contact with the substrate WT as illustrated by the arrow AR41 in FIG. 18B, positional deviation of the alignment mark MC1a with respect to the alignment mark MC2a or positional deviation of the alignment mark MC1b with respect to the alignment mark MC2b may occur. The chip mounting system 1 determines whether or not the amount W1 of such positional deviation is equal to or less than a positional deviation amount threshold value.

Returning to FIG. 15, it is assumed that, subsequently, the chip mounting system 1 determines that one of the calculated positional deviation amounts Δx, Δy, and Δθ is greater than the corresponding one of the preset positional deviation amount threshold values Δxth, Δyth, and Δθth (step S14: No). In this case, the chip mounting system 1 performs a detachment step of detaching the chip CP from the substrate WT (step S15). In this step, the chip mounting system 1 detaches the chip CP from the substrate WT by moving the head 33H vertically downward, as illustrated by, for example, an arrow AR42 in FIG. 18C.

Returning to FIG. 15, next, the chip 1 calculates relative correction movement amounts of the chip CP with respect to the substrate WT required to decrease all of the calculated positional deviation amounts Δx, Δy, and Δθ to the positional deviation amount threshold values Δxth, Δyth, and Δθth or less, respectively (step S16). In this step, the controller 90 calculates correction movement amounts that cause the chip CP to relatively move by movement amounts that are equivalent to differences between the positional deviation amounts Δx, Δy, and Δθ between the chip CP and the substrate WT with the chip CP in contact with the substrate WT and the positional deviation amounts between the chip CP and the substrate WT with the chip CP separated from the substrate WT. Aligning the chip CP with the substrate WT with the positions thereof offset from each other by the movement amounts equivalent to differences between positional deviation amounts with the chip CP in contact with the substrate WT and positional deviation amounts with the chip CP not in contact with the substrate WT as described above enables positional deviation of the chip CP with respect to the substrate WT to be eliminated if similar positional deviation caused by contact of the chip CP with the substrate WT occurs when the chip CP is brought into contact with the substrate WT again.

Subsequently, the chip mounting system 1 performs a third position correction step of correcting the position of the chip CP with respect to the substrate WT in such a way as to correct the relative positional deviation amounts Δx, Δy, and Δθ of the chip CP with respect to the substrate WT, with the chip CP separated from the substrate WT (step S17). In this step, the chip mounting system 1 moves the stage 315 in the X-direction, the Y-direction, and the rotational direction about the Z-axis by the correction movement amounts calculated in step S11, with the position of the head 33H fixed. The chip mounting system 1 subsequently performs the processing in step S11 again.

On the other hand, it is assumed that the chip mounting system 1 determines that all of the calculated positional deviation amounts Δx, Δy, and Δθ are equal to or less than the preset positional deviation amount threshold values Δxth, Δyth, and Δθth, respectively (step S14: Yes). In this case, the chip mounting system 1 bonds the chip CP to the substrate WT directly by pressing the chip against the substrate WT (step S18).

Next, the chip mounting system 1 moves the head 33H vertically downward and subsequently determines whether or not the chip CP is mounted on the substrate WT by imaging an image including at least the alignment marks MC2a and MC2b, using the imaging device 41 (step S19). In this step, when the alignment marks MC1a and MC1b are included in the imaged image imaged by the imaging device 41 in conjunction with the alignment marks MC2a and MC2b, the chip mounting system 1 determines that the chip CP is mounted on the substrate WT. On the other hand, when the alignment marks MC1a and MC1b are not included in the imaged image imaged by the imaging device 41, the chip mounting system 1 determines that the chip CP is not mounted on the substrate WT. When the chip mounting system 1 determines that the chip CP is mounted on the substrate WT (step S19: Yes), the chip mounting system 1 directly terminates the chip mounting process.

On the other hand, it is assumed that the chip mounting system 1 determines that the chip CP is not mounted on the substrate WT (step S19: No). In this case, the chip mounting system 1 determines whether or not the chip CP is held by the head 33H depending on whether or not the alignment marks MC2a and MC2b are included in imaged images imaged by the imaging devices 35a and 35b (step S20). In this step, when the alignment marks MC2a and MC2b are included in the imaged images imaged by the imaging devices 35a and 35b, the chip mounting system 1 determines that the chip CP is held by the head 33H. On the other hand, when the alignment marks MC2a and MC2b are not included in the imaged images imaged by the imaging devices 35a and 35b, the chip mounting system 1 determines that the chip CP is not held by the head 33H. This determination result is equivalent to a case where, although the chip mounting system 1 attempted to bond the chip CP to the substrate WT, the chip mounting system 1 was not able to bond the chip CP to the substrate WT. The chip mounting system 1, after having determined whether or not the chip CP is held by the head 33H, terminates the chip mounting process.

Figure 19:
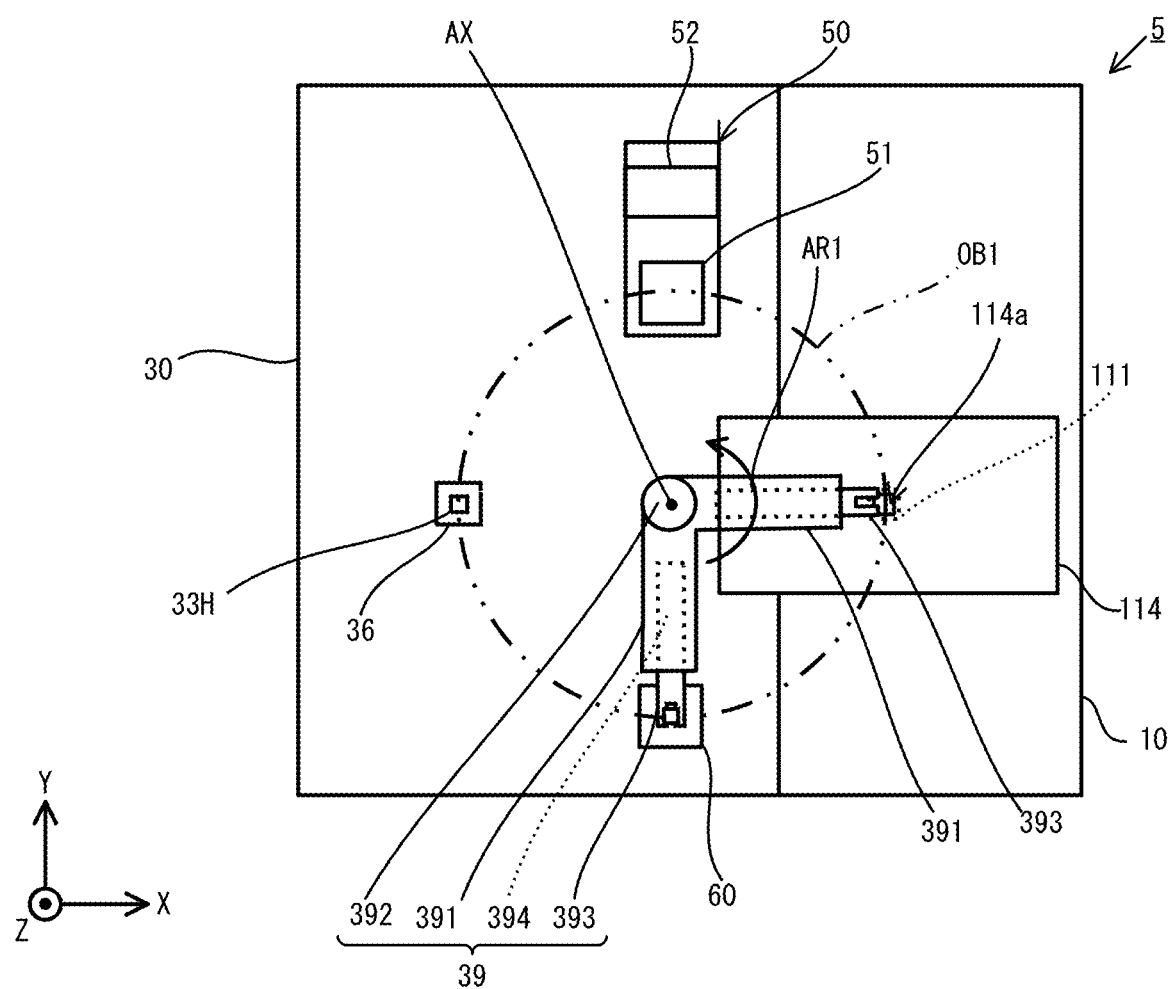
FIG. 19 is a schematic plan view illustrating a manner in which a chip is handed over from the chip transportation device to a chip collector in the chip mounting system according to Embodiment 1.

When the chip mounting system 1 determines that the chip CP is not mounted on the substrate WT and the chip CP is held by the head 33H, the chip mounting system 1 transfers the chip CP held by the head 33H to a chip holder 393 of the chip transportation device 39 again. Subsequently, the chip mounting system 1 rotates the plate 391 in the direction of the arrow AR1 in FIG. 14A by 90 degrees and arranges the chip holder 393 of the chip transportation device 39 vertically above the chip collector 60, as illustrated in FIG. 19. The chip mounting system 1 makes the chip collector 60 collect the chip CP held by the chip holder 393.

As described in the foregoing, according to the chip mounting system 1 according to the present embodiment, the chip mounting system 1 images the alignment marks MC1a, MC1b, MC2a, and MC2b at the same time using the imaging devices 35a and 35b, with the alignment marks MC1a and MC1b and the alignment marks MC2a and MC2b separated from each other by the first distance G1 at which the alignment marks MC1a and MC1b and the alignment marks MC2a and MC2b fall within a depth-of-field range of the imaging devices 35a and 35b. The chip mounting system 1 calculates relative positional deviation amounts between the substrate WT and the chip CP from the imaged images of the alignment marks MC1a, MC1b, MC2a, and MC2b imaged by the imaging devices 35a and 35b. This configuration enables influence of temporal change of the positions of the alignment marks MC1a, MC1b, MC2a, and MC2b due to vibration and positional change over time of the imaging devices 35a and 35b or thermal expansion of the substrate WT and the chip CP on calculated positional deviation amounts to be reduced. Therefore, it is possible to mount the chip CP on the substrate WT with high positional precision.

Conventionally, a chip mounting system has generally been configured such that an imaging device for imaging an alignment mark disposed on a chip CP arranged vertically above the imaging device and an imaging device for recognizing a substrate WT arranged vertically below the imaging device are separated from each other and move between the alignment mark disposed on the chip CP and an alignment mark disposed on the substrate WT (for example, Unexamined Japanese Patent Application Publication No. 2004-22949). However, in the case of this configuration, since the imaging device for imaging the alignment mark on the chip CP and the imaging device for imaging the alignment mark on the substrate WT are separated from each other, relative positions between the two imaging devices sometimes deviate due to thermal expansion or temporal change. In this case, precision in alignment between the chip CP and the substrate WT is caused to deteriorate and calibration or the like of the positions of the imaging devices is required to be performed. There is also a possibility that the operating state in daily operation of the chip mounting system is not stable, which causes the positions of the imaging devices to change. By contrast, imaging the alignment mark disposed on the chip CP and the alignment mark disposed on the substrate WT, using a single imaging device enables operation of the chip mounting system to become unlikely to be influenced by positional deviation of the imaging devices. In addition, when a time lag occurs in timing of imaging of the alignment marks by the two imaging devices that move between the alignment mark disposed on the chip CP and the alignment mark disposed on the substrate WT, vibration of the imaging devices influences the alignment precision. By contrast, in the chip mounting system according to the present embodiment, since each of the imaging devices 35a and 35b is arranged for one of two pairs of alignment marks and images of the two pairs of alignment marks are imaged at the same time, it is possible to cancel out influences from vibration of the imaging devices 35a and 35b. In addition, the aforedescribed configuration is incapable of correcting positional deviation of the chip CP with respect to the substrate WT occurring at the time of bonding the chip CP to the substrate WT. By contrast, in the chip mounting system according to the present embodiment, since it is possible to calculate a positional deviation amount between the chip CP and the substrate WT with the chip CP and the substrate WT having been thermally expanded by heating the chip CP and the substrate WT using infrared rays to a temperature at which the chip CP and the substrate WT are bonded to each other, it is possible to constantly calculate a positional deviation amount with high precision and correct the positional deviation of the chip CP with respect to the substrate WT regardless of states of the chip CP and the substrate WT.

In the chip mounting system 1 according to the present embodiment, images of the alignment marks MC1a and MC1b and images of the alignment marks MC2a and MC2b are individually imaged by the imaging devices 35a, 35b, and 41 with the substrate WT and the chip CP separated from each other by the second distance that is longer than the first distance. This configuration enables the position of the chip CP with respect to the substrate WT to be corrected to some extent while the alignment marks MC1a and MC1b and the alignment marks MC2a and MC2b do not fall within the depth-of-field range of the imaging devices 35a and 35b.

Further, in the chip mounting system 1 according to the present embodiment, images of the alignment marks MC1a, MC1b, MC2a, and MC2b are imaged at the same time by the imaging devices 35a and 35b with the chip CP in contact with the substrate WT, and relative positional deviation amounts between the substrate WT and the chip CP are calculated from the imaged images. In this processing, when the relative positional deviation amounts between the substrate WT and the chip CP are greater than preset positional deviation amount threshold values, the chip mounting system 1 detaches the chip CP from the substrate WT and, based on the calculated positional deviation amounts, relatively moves the chip CP with respect to the substrate WT in a direction in which the positional deviation amounts decrease. The chip mounting system 1 repeats bringing the chip CP into contact with the substrate WT, imaging the alignment marks MC1a, MC1b, MC2a, and MC2b, calculating positional deviation amounts, detaching the chip CP from the substrate WT, and correcting the position of the chip CP until the calculated positional deviation amounts fall within the positional deviation amount threshold values. This configuration enables the chip CP to be mounted on the substrate WT with high positional precision.

In addition, in the chip mounting system 1 according to the present embodiment, the stage 315 of the bonding device 30 holds the substrate WT in such an attitude that the mounting surface WTf of the substrate WT faces vertically downward. When, for example, although bonding of the chip CP to the substrate WT is attempted, the chip CP is not bonded to the substrate WT, this configuration causes the chip CP to be detached from the substrate WT, associated with vertically downward movement of the head 33H. Therefore, it is possible to prevent the chip CP that was not bonded to the substrate WT and has been left on the mounting surface WTf of the substrate WT from being flipped to a place at which another chip CP is to be bonded and interfering with the another chip CP at the time of bonding of the another chip CP to the substrate WT. For example, there is a case where, when a chip CP is displaced from an original mounting position to a mounting position of a chip CP that is to be mounted next, the next chip CP interferes with the displaced chip CP while being rapidly transported to a position at which pressure is to be applied to the next chip CP. In this case, the substrate sometimes cracks. When such an accident occurs, all chips CP that have been mounted on the substrate WT are wasted, which is a significant problem.

Further, the chip mounting system 1 according to the present embodiment, after processing of mounting the chip CP on the substrate has been completed, determines whether or not a chip CP is mounted on the substrate WT depending on whether or not the alignment marks MC2a and MC2b are included in an imaged image imaged by the imaging device 41 in conjunction with the alignment marks MC1a and MC1b. In addition, the chip mounting system 1, after processing of mounting the chip CP on the substrate WT has been completed, determines whether or not a chip CP is held by the head 33H depending on whether or not the alignment marks MC2a and MC2b are included in imaged images imaged by the imaging devices 35a and 35b. When, because of this processing, a chip CP that has not been able to be mounted on the substrate WT is determined to be held by the head 33H, it is possible to collect the chip CP at the chip collector 60.

Embodiment 2

A chip mounting system according to the present embodiment is a device that mounts a chip CP on a flexible substrate. The chip mounting system mounts a chip on a flexible substrate by, after activation treatment has been performed on a surface of the substrate on which the chip is mounted and a bonding surface of the electronic component, bringing the chip into contact with the flexible substrate and applying pressure to the chip.

Figure 20:
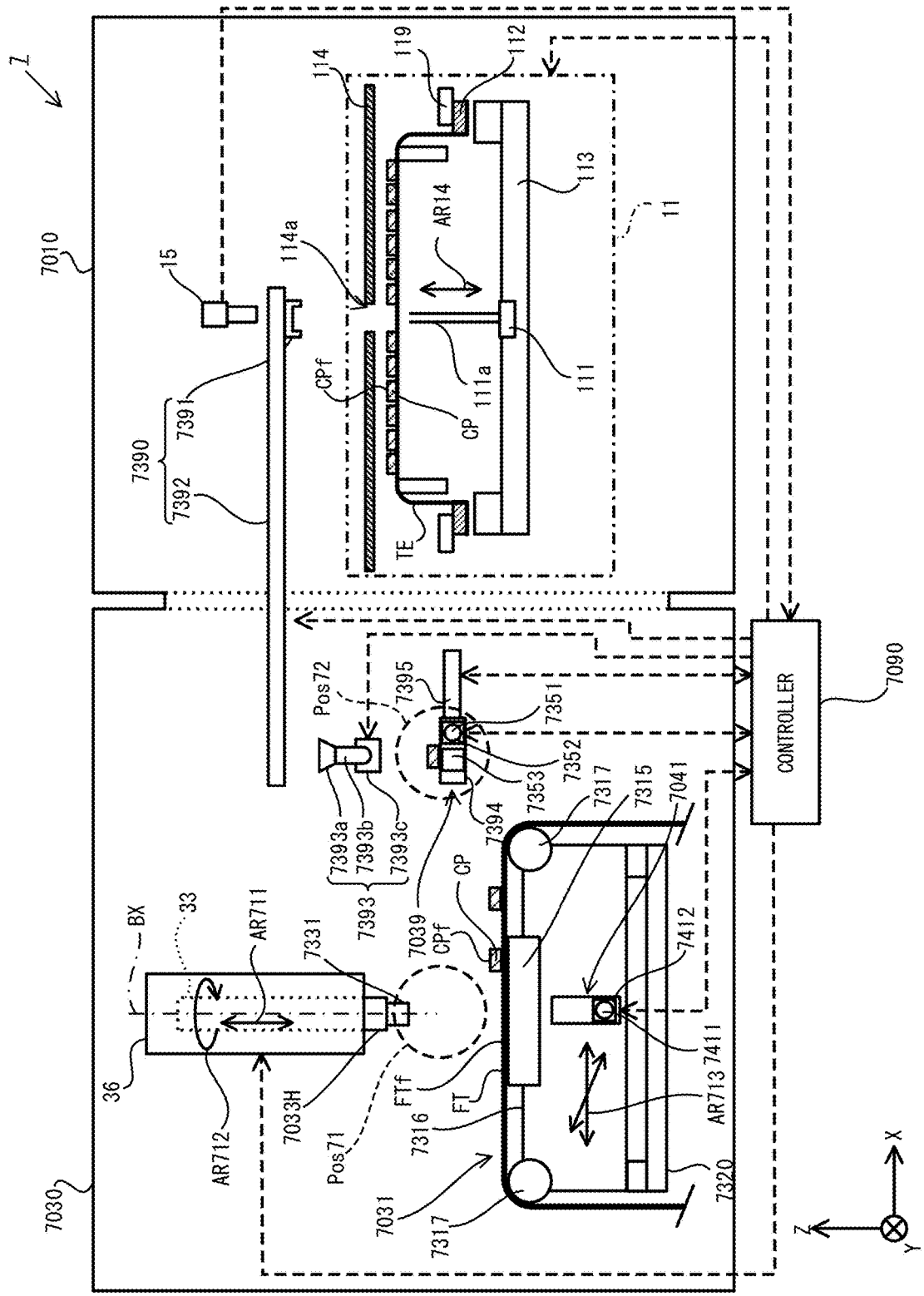
FIG. 20 is a schematic configuration diagram of a chip mounting system according to Embodiment 2.

As illustrated in FIG. 20, a chip mounting system 7 according to the present embodiment includes a chip supply device 7010, a bonding device 7030, a chip transfer unit 7039, a chip transportation unit 7390, a turnover unit 7393, and a controller 7090. Note that, in FIG. 20, the same reference signs as those in FIG. 2 are assigned to the same constituent components as those in Embodiment 1.

The chip transportation unit 7390 is a component transportation unit that transports a chip CP supplied from a chip supply 11 to a handover position to the turnover unit 7393. The chip transportation unit 7390 includes a Bernoulli chuck 7391 and a chuck driver 7392 that drives the Bernoulli chuck 7391. The Bernoulli chuck 7391 holds a chip CP pushed out by a pick-up mechanism 111, without contact with a bonding surface CPf of the chip CP. A Bernoulli chuck is a chuck that holds a chip CP without contact, with a gas layer formed between the Bernoulli chuck and the chip CP by generating negative pressure on the inside thereof and, in conjunction therewith, discharging gas to the outside thereof.

The turnover unit 7393 is a component turnover unit that turns over a chip CP supplied from the chip supply 11. The turnover unit 7393 includes a sucker 7393a that sucks a chip CP, an arm 7393b, and a turnover driver 7393c. The turnover unit 7393 directs a tip portion of the arm 7393b vertically upward and receives a chip CP from the chip transportation unit 7390 by sucking the chip CP, using the sucker 7393a. The turnover unit 7393 turns the arm 7393b and thereby directs the tip portion of the arm 7393b vertically downward, using the turnover driver 7393c, with the chip CP sucked on the tip portion of the arm 7393b and hands over the chip CP to the chip transfer unit 7039. The turnover unit 7393, after having handed over the chip CP to the chip transfer unit 7039, turns the arm 7393b and brings the arm 7393b to a state of the tip portion thereof being directed vertically upward.

Figure 21A:
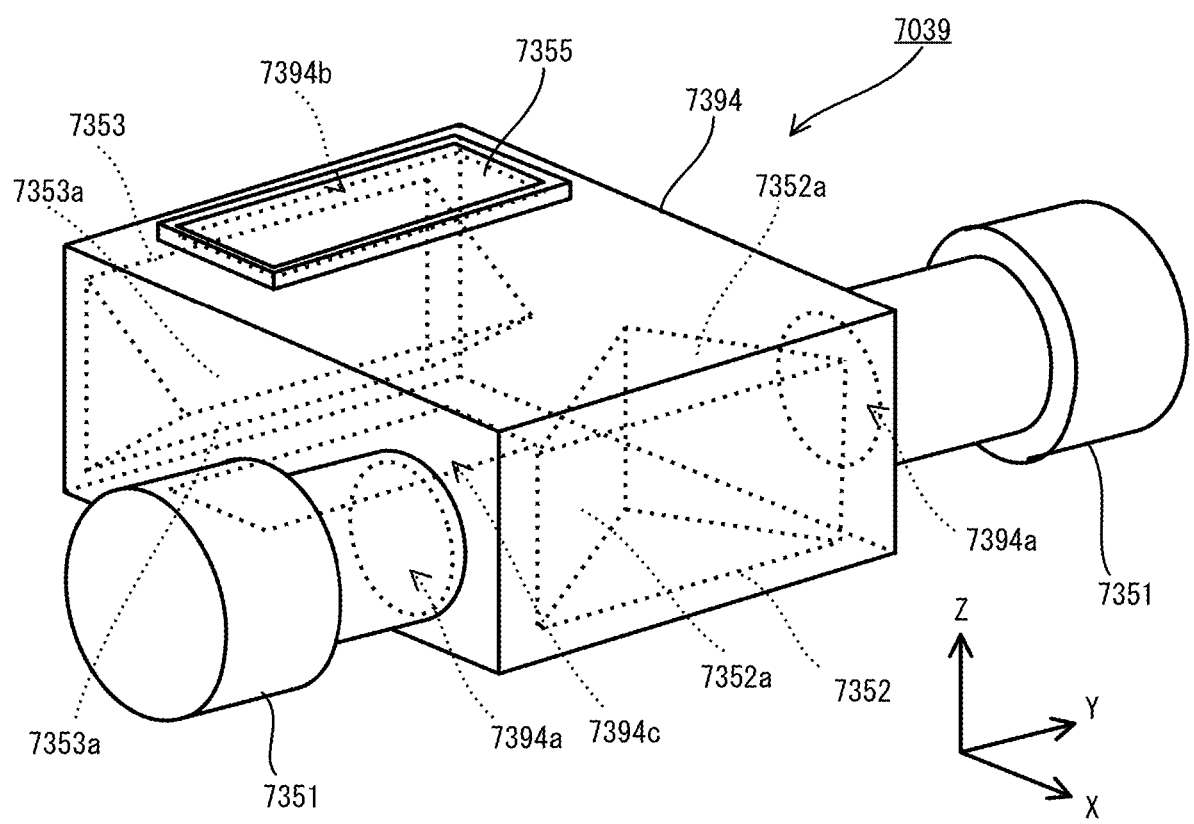
FIG. 21A is a schematic perspective view of a chip transfer unit according to Embodiment 2.

The chip transfer unit 7039 includes a transportation head 7394, a transportation head driver 7395 that drives the transportation head 7394, two imaging devices 7351, and light path converting members 7352 and 7353. The chip transfer unit 7039 also includes a chip holder 7355 that is transparent plate-shaped and on which a chip CP is placed, as illustrated in FIG. 21A. The light path converting members 7352 and 7353 are members that have two mirror surfaces 7352a and two mirror surfaces 7353a, respectively. The light path converting member 7353 converts a propagation direction of light that propagates in a direction along the Z-axis (first direction), which is orthogonal to a mounting surface FTf of a flexible substrate FT, to a direction along the X-axis (second direction), which is orthogonal to the Z-axis direction. The transportation head 7394 is box-shaped and holds the light path converting members 7352 and 7353 with the light path converting members 7352 and 7353 housed on the inside thereof. At portions at which the respective imaging devices 7351 are fixed within side walls that face each other in the Y-axis direction on the transportation head 7394, openings 7394a that cause light from the imaging devices 7351 to be incident on the light path converting member 7352 and, in conjunction therewith, take in light reflected by the light path converting member 7352 into the imaging devices 7351 are formed. Further, at a portion at which the chip holder 7355 is arranged on the upper wall on the +Z-direction side of the transportation head 7394, an opening 7394b that, with a chip CP held by the head 7033H, causes light reflected by the chip CP to be incident on the light path converting member 7353 and, in conjunction therewith, causes light reflected by the light path converting member 7353 to be emitted toward the chip CP is formed. In addition, on the bottom wall on the −Z-direction side of the transportation head 7394, an opening 7394c that causes light reflected by the flexible substrate FT, which is arranged on the −Z-direction side of the transportation head 7394, to be incident on the light path converting member 7353 and, in conjunction therewith, causes light reflected by the light path converting member 7353 to be emitted toward the flexible substrate FT is formed.

Figure 22A:
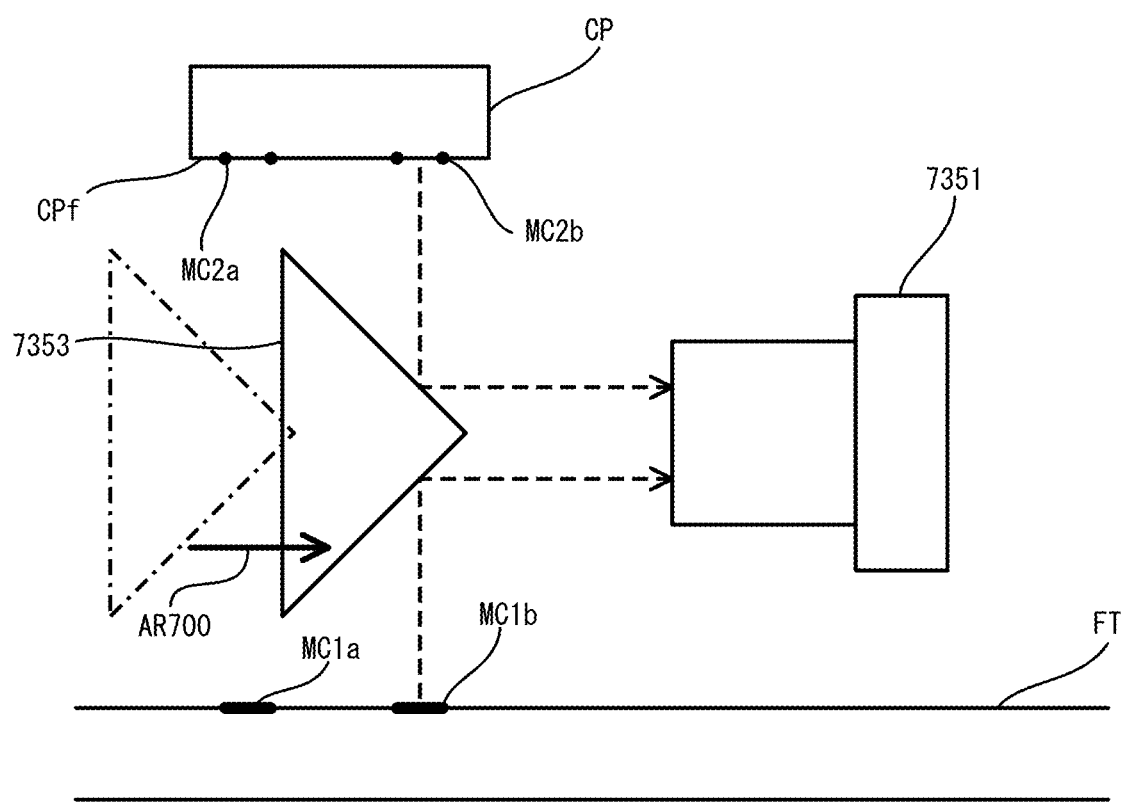
FIG. 22A is a schematic view of a portion of the chip transfer unit according to Embodiment 2.
Figure 22B:
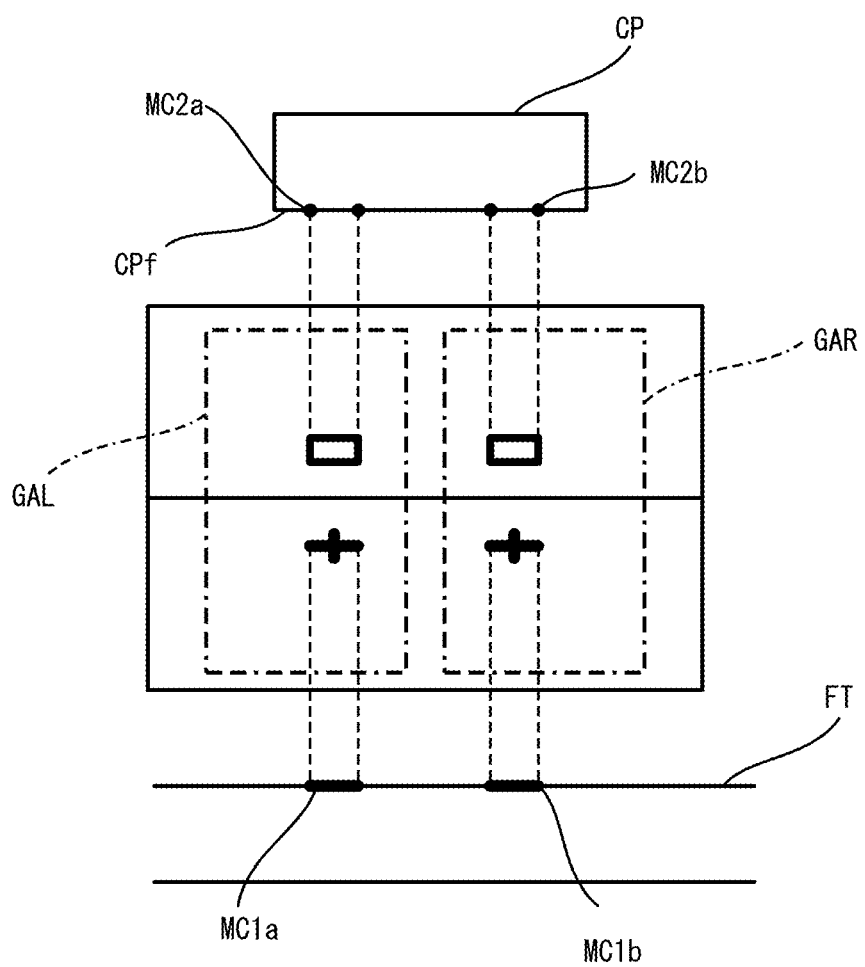
FIG. 22B is a diagram illustrating an example of an image imaged by an imaging device according to Embodiment 2.

The two imaging devices 7351 are second imaging devices that, while moving the light path converting member 7353 as illustrated by an arrow AR700 in FIG. 22A, image alignment marks MC1a and MC1b disposed on the flexible substrate FT and alignment marks MC2a and MC2b disposed on the chip CP from the +Y-direction sides of the light path converting member 7353. Each of the two imaging devices 7351 includes an image sensor (not illustrated), an optical system (not illustrated), and a coaxial illumination system (not illustrated). Each of the two imaging devices 7351 acquires image data relating to reflected light of illuminating light that is emitted from a light source (not illustrated) of the coaxial illumination system. Note that illuminating light emitted in the Y-axis direction from the coaxial illumination systems of the imaging devices 7351 is reflected by the mirror surfaces 7352a of the light path converting member 7352 and the traveling direction thereof is changed to the −X-direction. The light reflected by the light path converting member 7352 travels toward the light path converting member 7353 and is reflected by the mirror surfaces 7353a of the light path converting member 7353, and the traveling direction thereof is thereby changed to the +Z-direction and the −Z-direction. The light reflected by the light path converting member 7353 travels toward imaging target portions of the chip CP, which is held by a head 7033H, and the flexible substrate FT and is reflected by the respective imaging target portions. Note that the alignment marks are disposed on the imaging target portions of the chip CP and the flexible substrate FT. The reflected light from the respective imaging target portions of the chip CP and the flexible substrate FT travels toward the light path converting member 7353, is subsequently reflected by the mirror surfaces 7353a of the light path converting member 7353 again, has the traveling directions thereof changed to the +X-direction, travels toward the light path converting member 7352, and is reflected by the mirror surfaces 7352a of the light path converting member 7352. The light reflected by the light path converting member 7352 finally reaches the two imaging devices 7351. Light that is emitted from an imaging unit 7041 and is transmitted through imaging target portions of the flexible substrate FT also travels toward the light path converting member 7353, is subsequently reflected by the mirror surfaces 7353a of the light path converting member 7353 again, has the traveling directions thereof changed to the +X-direction, travels toward the light path converting member 7352, and is reflected by the mirror surfaces 7352a of the light path converting member 7352. The light reflected by the light path converting member 7352 finally reaches the two imaging devices 7351. In this way, the two imaging devices 7351 acquire image data GAL and GAR including the respective imaging target portions of the chip CP and the flexible substrate FT, as illustrated in FIG. 22B.

Returning to FIG. 20, the transportation head driver 7395 moves the transportation head 7394 to a first position Pos71 or a second position Pos72 by moving the transportation head 7394 along the X-axis direction with the chip CP and the flexible substrate FT separated from each other by a preset second distance. In this configuration, the first position Pos71 is equivalent to a position at which the light path converting member 7353 is arranged between the chip CP and the flexible substrate FT. In addition, the second position Pos72 is equivalent to a position at which the transportation head 7394 is separated from the chip CP in the X-axis direction.

The bonding device 7030 includes a flexible substrate support unit 7031, a bonder 33 that includes the head 7033H, a head driver 36 that drives the head 7033H, and the imaging unit 7041. The head 7033H has a sucker 7331 for sucking a chip CP on a tip portion thereof. The head driver 36 makes the bonder 33 ascend or descend in the Z-axis direction and, in conjunction therewith, rotate about an axis BX, as illustrated by arrows AR711 and AR712 in FIG. 20.

Figure 21B:
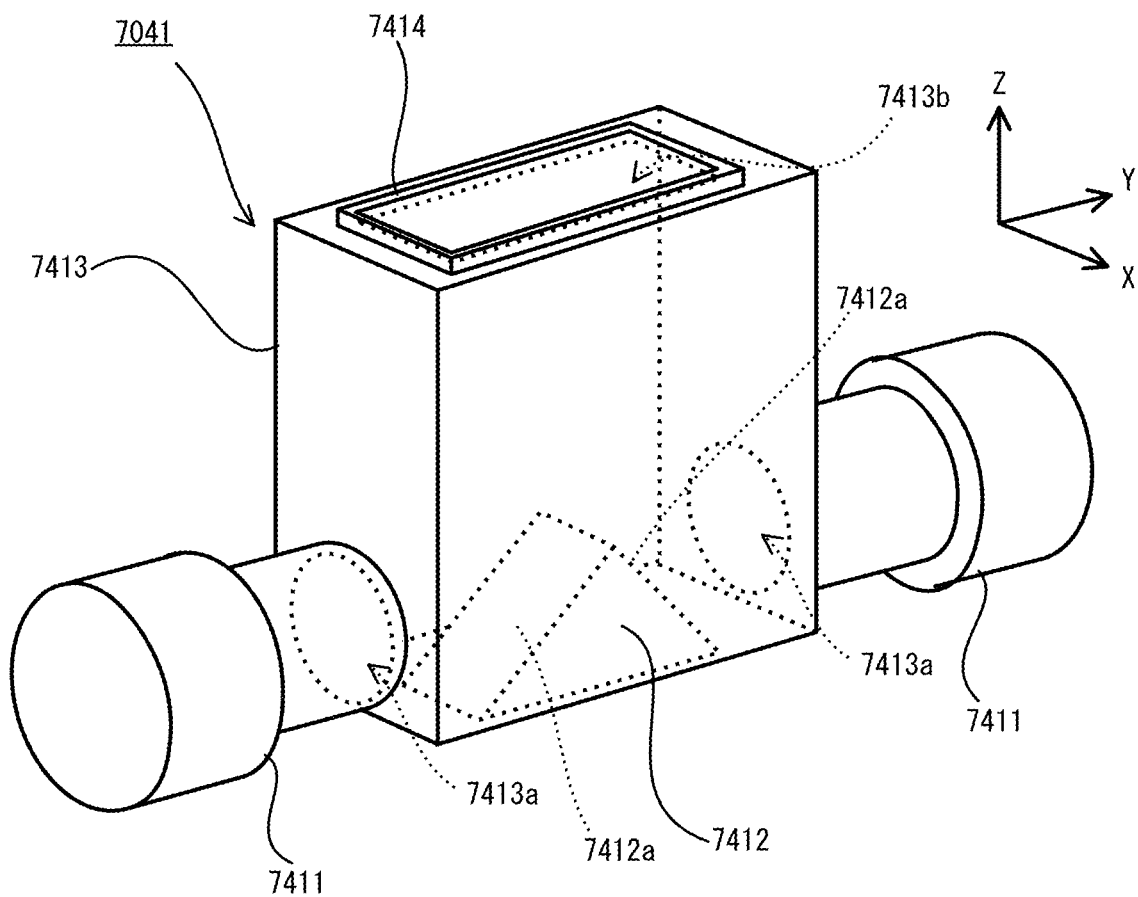
FIG. 21B is a schematic perspective view of an imaging unit according to Embodiment 2.

The imaging unit 7041 includes two imaging devices 7411 and a light path converting member 7412. The imaging unit 7041 also includes a housing 7413 that houses the light path converting member 7412 and a transparent plate-shaped window member 7414, as illustrated in FIG. 21B. The light path converting member 7412 has two mirror surfaces 7412a. At portions at which the respective imaging devices 7411 are fixed within side walls that face each other in the Y-axis direction on the housing 7413, openings 7413a that cause light from the imaging devices 7411 to be incident on the light path converting member 7412 and, in conjunction therewith, take in light reflected by the light path converting member 7412 into the imaging devices 7411 are formed. In addition, at a portion at which the window member 7414 is arranged on the upper wall on the +Z-direction side of the housing 7413, an opening 7413b that causes light reflected by the chip CP or the flexible substrate FT to be incident on the light path converting member 7412 and, in conjunction therewith, causes light reflected by the light path converting member 7412 to be emitted toward the chip CP or the flexible substrate FT is formed.

The two imaging devices 7411 are first imaging devices that acquire imaged images each of which includes an image of the alignment marks MC2a or MC2b, both of which are disposed on the chip CP, and an image of the alignment marks MC1a or MC1b, both of which are disposed on the flexible substrate FT. The controller 7090 recognizes a relative position of each chip CP with respect to the flexible substrate FT in a direction parallel with a surface of the flexible substrate FT on which the chip CP is mounted, based on image data acquired by the two imaging devices 7411. Each of the two imaging devices 7411 includes an image sensor, an optical system, and a coaxial illumination system (not illustrated). Each of the two imaging devices 7411 acquires image data relating to reflected light of illuminating light (for example, infrared light) that is emitted from a light source (not illustrated) of the coaxial illumination system. Each of the two imaging devices 7411 acquires image data relating to reflected light of illuminating light that is emitted from a light source (not illustrated) of the coaxial illumination system. Note that illuminating light emitted in the Y-axis directions from the coaxial illumination systems of the imaging devices 7411 is reflected by the mirror surfaces 7412a of the light path converting member 7412 and has the traveling direction thereof changed to the +Z-direction. The light reflected by the light path converting member 7412 travels toward imaging target portions of the chip CP, which is held by the head 7033H, and the flexible substrate FT and is reflected by the respective imaging target portions, with the chip transfer unit 7039 arranged at the second position. The reflected light from the respective imaging target portions of the chip CP and the flexible substrate FT travels toward the light path converting member 7412, is subsequently reflected by the mirror surfaces 7412a of the light path converting member 7412 again, has the traveling directions thereof changed to the Y-axis directions, and reaches the two imaging devices 7411. In this way, the two imaging devices 7411 acquire image data including the respective imaging target portions of the chip CP and the flexible substrate FT.

The flexible substrate support unit 7031 includes a stage 7315, guide rollers 7317 that are arranged on both sides in the X-axis direction of the stage 7315 and guide the flexible substrate FT, and a support 7316 that collectively supports the stage 7315, the guide rollers 7317, and the imaging unit 7041. The support 7316 is configured to be movable in the X-direction and the Y-direction, as illustrated by arrows AR713 in FIG. 20. This configuration enables a relative positional relationship between the bonder 33 and the stage 315 to be changed and a mounting position of each chip CP on the flexible substrate FT to be adjusted. The flexible substrate support unit 7031 also includes a support driver (substrate holder driver) 7320 that drives the support 7316 in the X-axis direction and the Y-axis direction.

Figure 23:
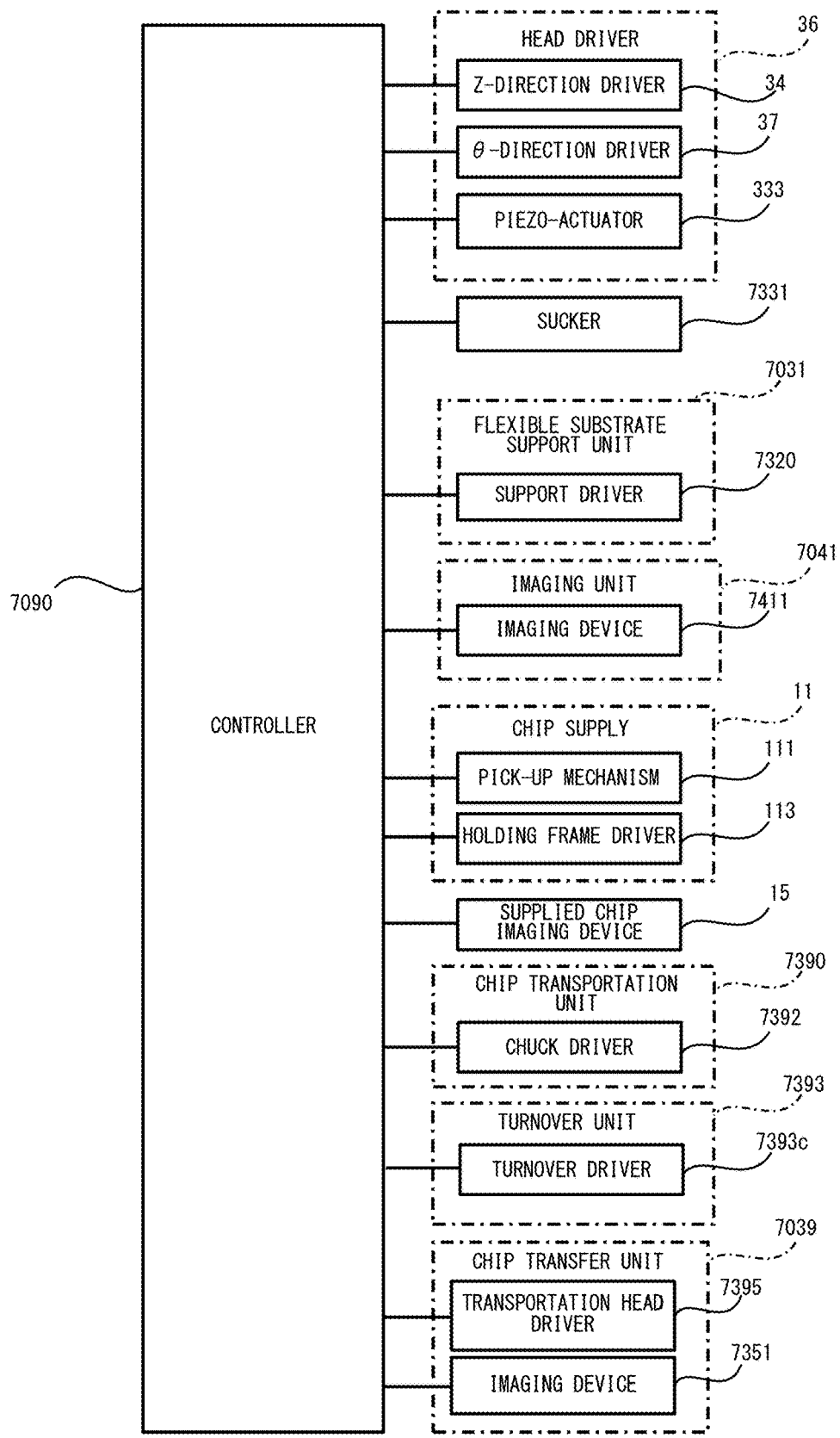
FIG. 23 is a block diagram of the component mounting system according to Embodiment 2.

The controller 7090, as with the controller 90 that was described in Embodiment 1, includes an MPU, a main storage, an auxiliary storage, an interface, and a bus connecting the components to one another. The controller 7090 is connected to the supplied chip imaging device 15, the imaging devices 7351 and 7411, the Z-direction driver 34, the θ-direction driver 37, the piezo-actuators 333, the sucker 7331, the support driver 7320, the turnover driver 7393$c$, the pick-up mechanism 111, the holding frame driver 113, the chuck driver 7392, and the transportation head driver 7395, as illustrated in FIG. 23. The interface converts imaged image signals input from the supplied chip imaging device 15 and the imaging devices 7351 and 7411 to imaged image information and outputs the imaged image information to the bus. In addition, the MPU, by reading programs stored in the auxiliary storage into the main storage and executing the programs, respectively outputs control signals to the Z-direction driver 34, the θ-direction driver 37, the piezo-actuators 333, the sucker 7331, the support driver 7320, the turnover driver 7393$c$, the pick-up mechanism 111, the holding frame driver 113, the chuck driver 7392, and the transportation head driver 7395 via the interface.

The controller 7090 calculates a relative positional error between the flexible substrate FT and a chip CP from images that are acquired by imaging the alignment marks MC1$a$ and MC1$b$ on the flexible substrate FT and the alignment marks MC2$a$ and MC2$b$ on the chip CP, using the imaging devices 7351, with the light path converting member 7353, which is held by the transportation head 7394, arranged between the flexible substrate FT and the chip CP. The controller 7090 makes the head driver 36 and the support driver 7320 correct the position and attitude of the chip CP with respect to the flexible substrate FT by outputting a control signal to the head driver 36 and the support driver 7320. The controller 7090 calculates a relative positional error between the flexible substrate FT and a chip CP from images that are acquired by imaging the alignment marks MC1$a$ and MC1$b$ on the flexible substrate FT and the alignment marks MC2$a$ and MC2$b$ on the chip CP, using the imaging devices 7411, with the flexible substrate FT and the chip CP in contact with each other. The controller 7090 makes the head driver 36 and the support driver 7320 correct the position and attitude of the chip CP with respect to the flexible substrate FT by outputting a control signal to the head driver 36 and the support driver 7320.

Figure 24A:
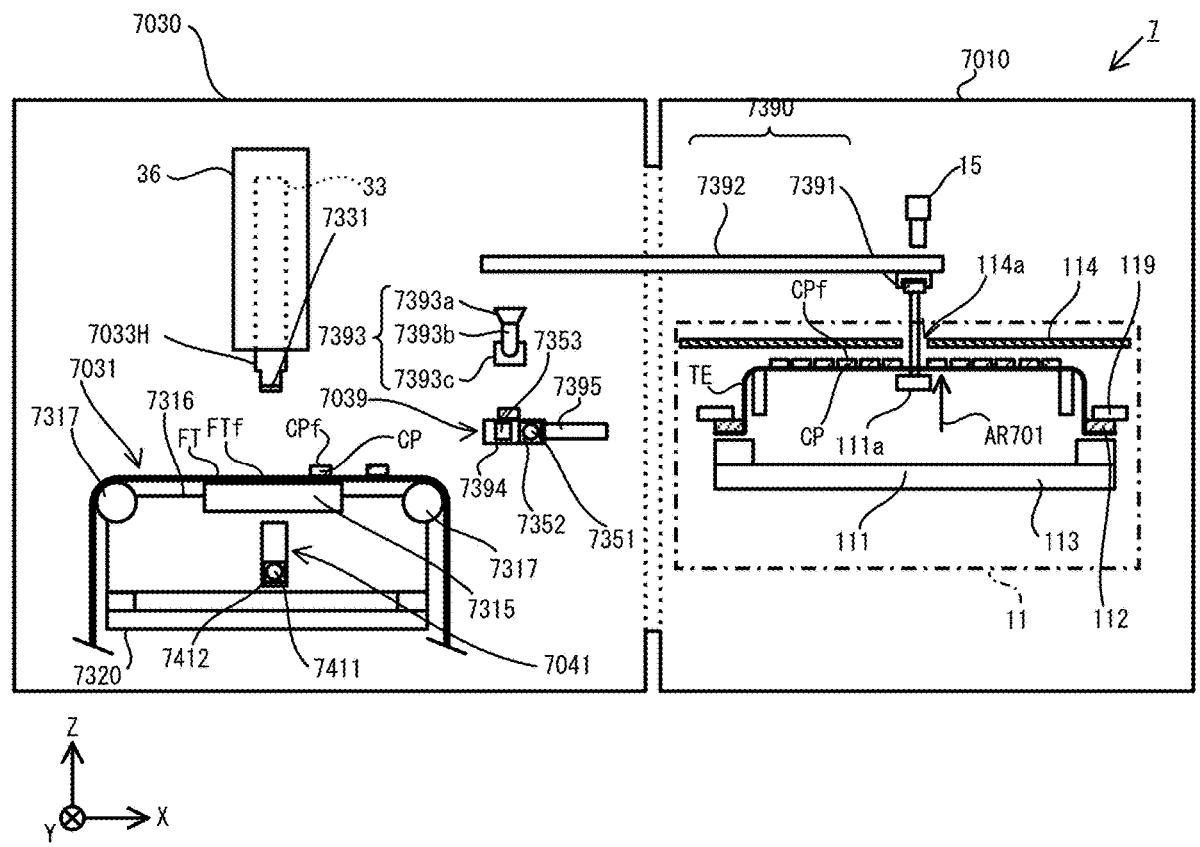
FIG. 24A is a schematic side view illustrating a manner in which a chip is supplied from a chip supply in the chip mounting system according to Embodiment 2.

Next, operation of the chip mounting system 7 according to the present embodiment will be described, referring to FIGS. 24A to 28A. First, the chip mounting system 7 is set to a state in which the Bernoulli chuck 7391 is arranged on the +Z-direction side of the chip supply 11, as illustrated in FIG. 24A. Next, the pick-up mechanism 111, by moving in the +Z-direction, cuts out one chip CP from the opposite side of a sheet TE to the side thereof on which a plurality of chips CP is stuck and brings the one chip CP to a state of being detached from the sheet TE, as illustrated by an arrow AR701 in FIG. 24A. In this state, the chip transportation unit 7390 receives the chip CP, using the Bernoulli chuck 7391.

Figure 24B:
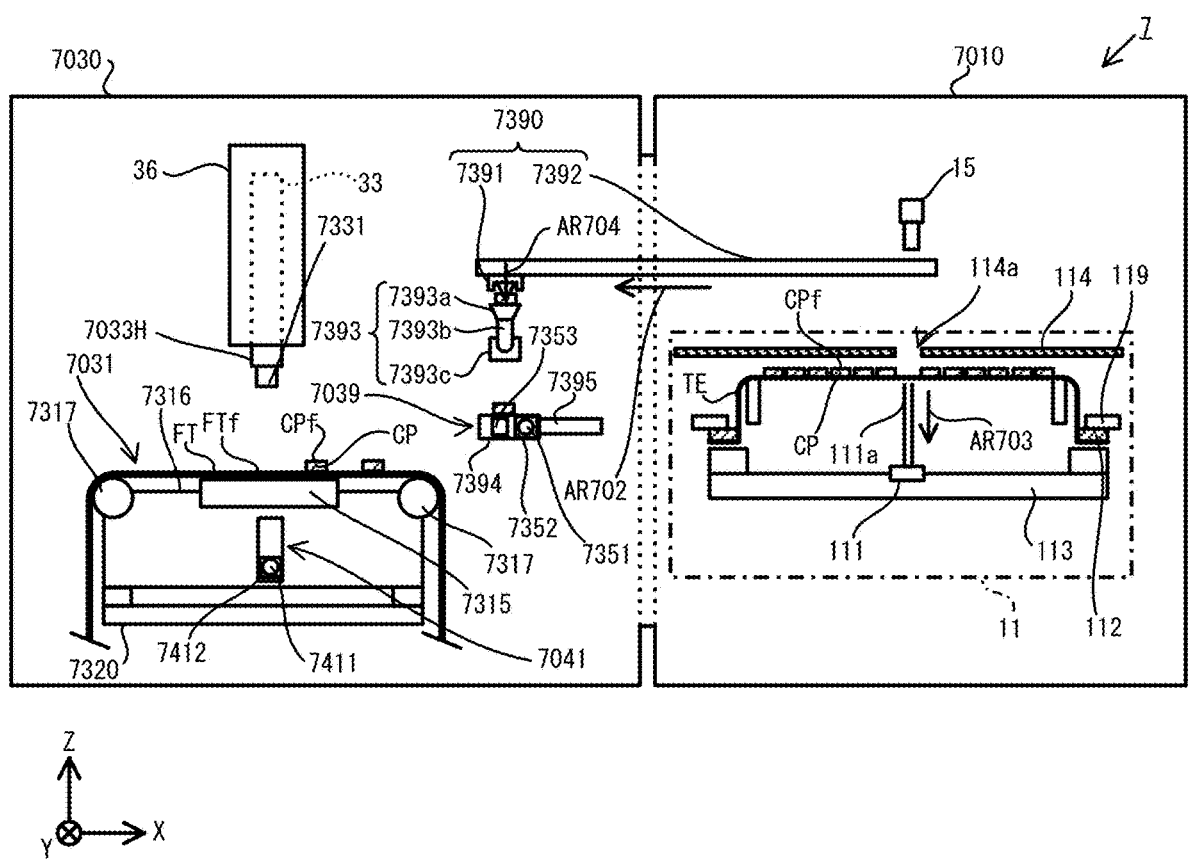
FIG. 24B is a schematic side view illustrating a manner in which the chip supplied from the chip supply is transported to a turnover unit in the chip mounting system according to Embodiment 2.
Figure 25A:
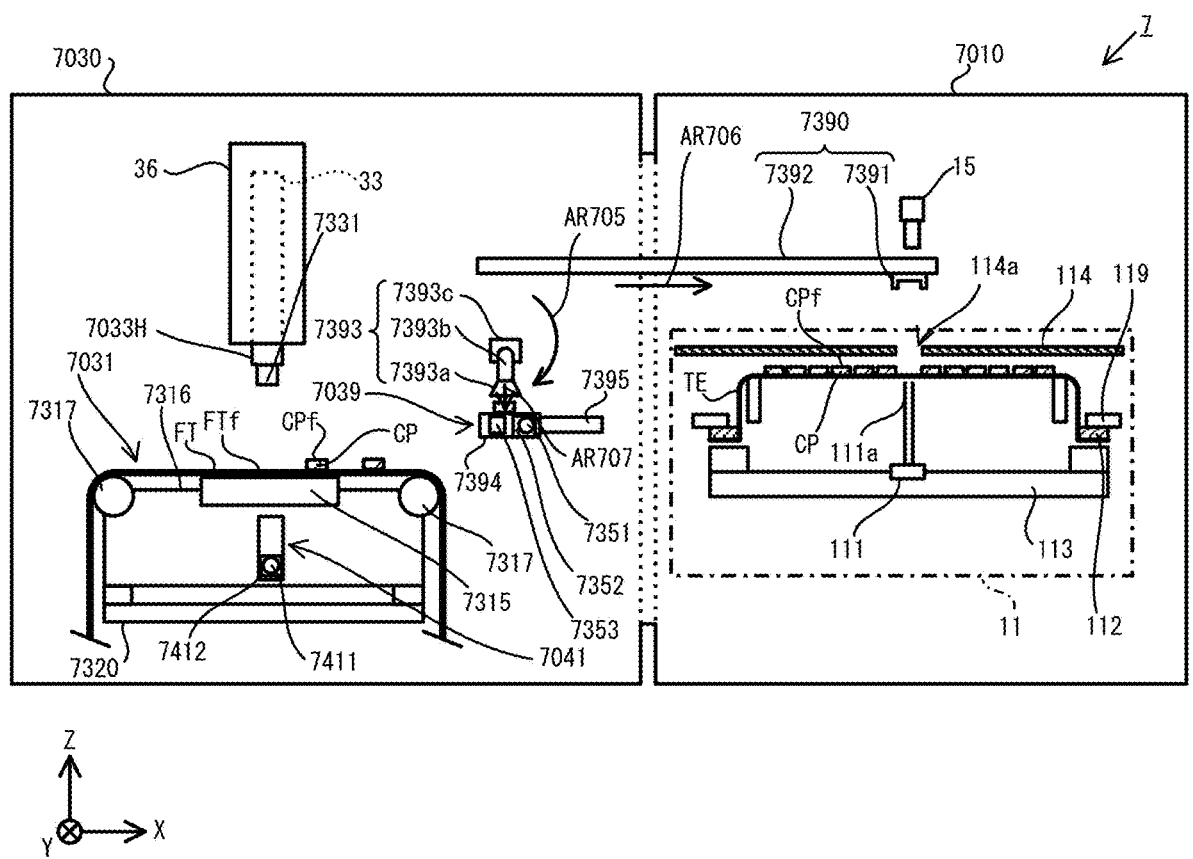
FIG. 25A is a schematic side view illustrating a manner in which the chip is transferred from the turnover unit to a transportation head in the chip mounting system according to Embodiment 2.
Figure 25B:
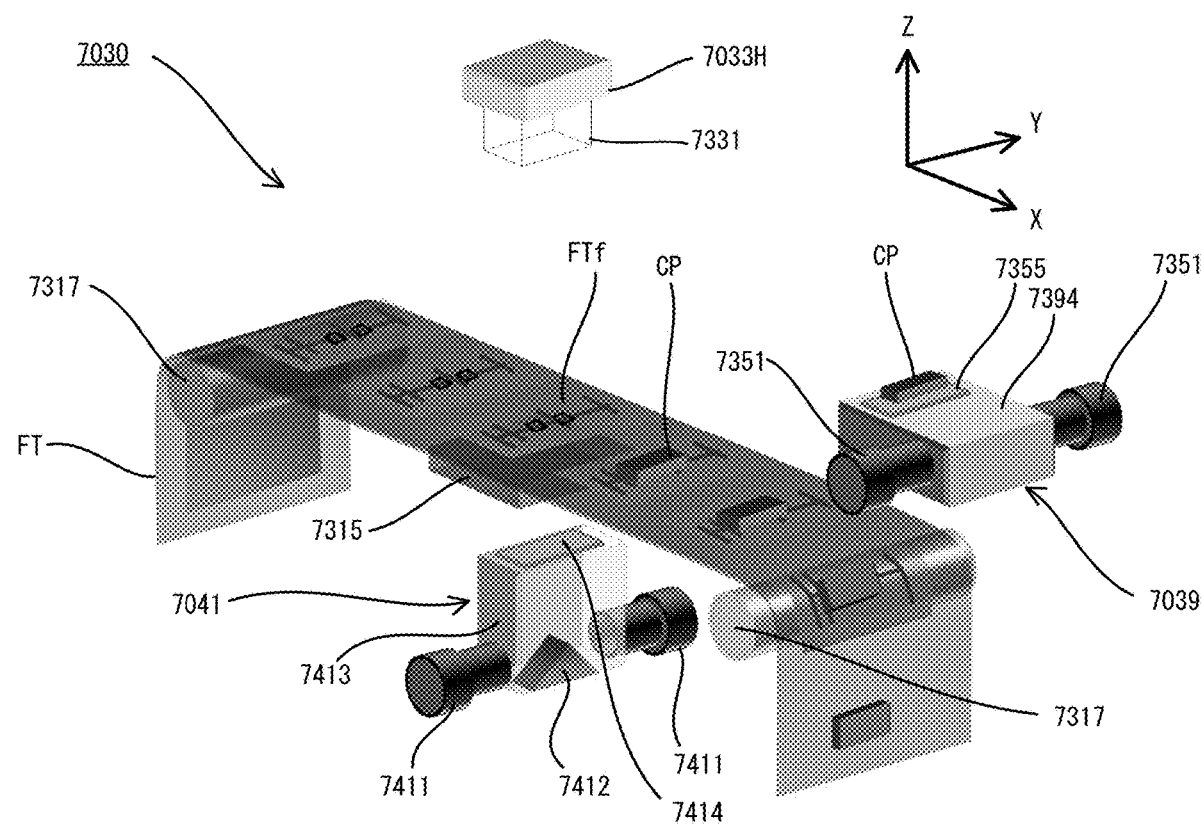
FIG. 25B is a schematic perspective view illustrating a state in which a chip has been transferred to the transportation head in a bonding device according to Embodiment 2.

Succeedingly, the chuck driver 7392 of the chip transportation unit 7390 moves the Bernoulli chuck 7391 to a handover position to the turnover unit 7393, as illustrated by an arrow AR702 in FIG. 24B. Subsequently, the turnover unit 7393 receives the chip CP by making the sucker 7393$a$ suck the chip CP held by the Bernoulli chuck 7391, as illustrated by an arrow AR704 in FIG. 24B. Next, as illustrated by an arrow AR705 in FIG. 25A, the turnover driver 7393$c$, by turning the arm 7393$b$, arranges the chip CP at a handover position to the chip transfer unit 7039. At this time, the chuck driver 7392 moves the Bernoulli chuck 7391 to the position at which the Bernoulli chuck 7391 receives a chip CP from the chip supply 11, as illustrated by an arrow AR706 in FIG. 25A. The turnover driver 7393$c$, by terminating sucking of the chip CP by the sucker 7393$a$, hands over the chip CP to the chip transfer unit 7039, as illustrated by an arrow AR707 in FIG. 25A. At this time, as illustrated in FIG. 25B, the chip transfer unit 7039 is brought to a state in which the chip CP is placed on the chip holder 7355 disposed on the transportation head 7394. The turnover unit 7393, by turning the arm 7393$b$, returns the sucker 7393$a$ from the chip transfer unit 7390 to a position at which the sucker 7393$a$ receives a chip CP, as illustrated by an arrow AR708 in FIG. 26A.

Figure 26A:
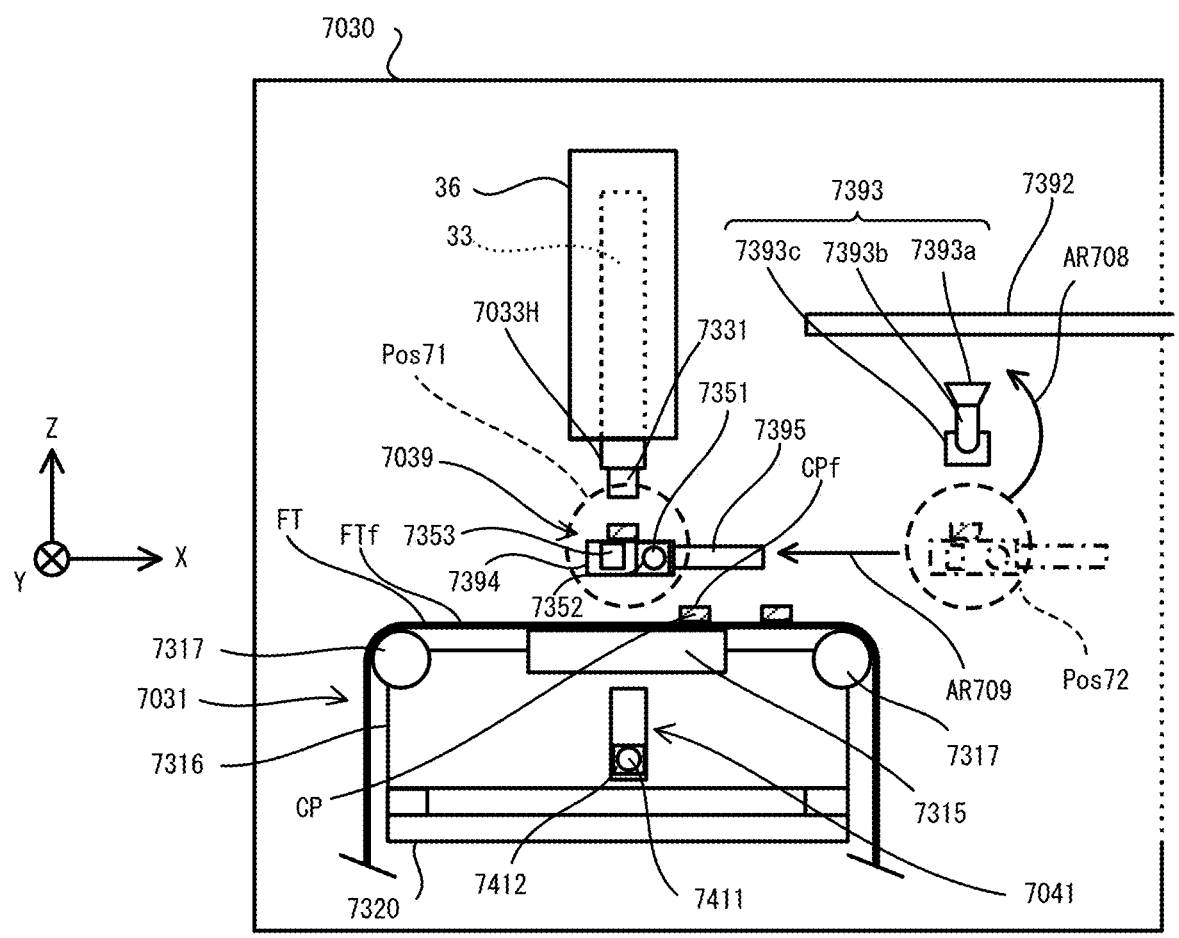
FIG. 26A is a schematic side view illustrating a manner in which the transportation head moves from a second position to a first position in the bonding device according to Embodiment 2 cleans a chip.
Figure 26B:
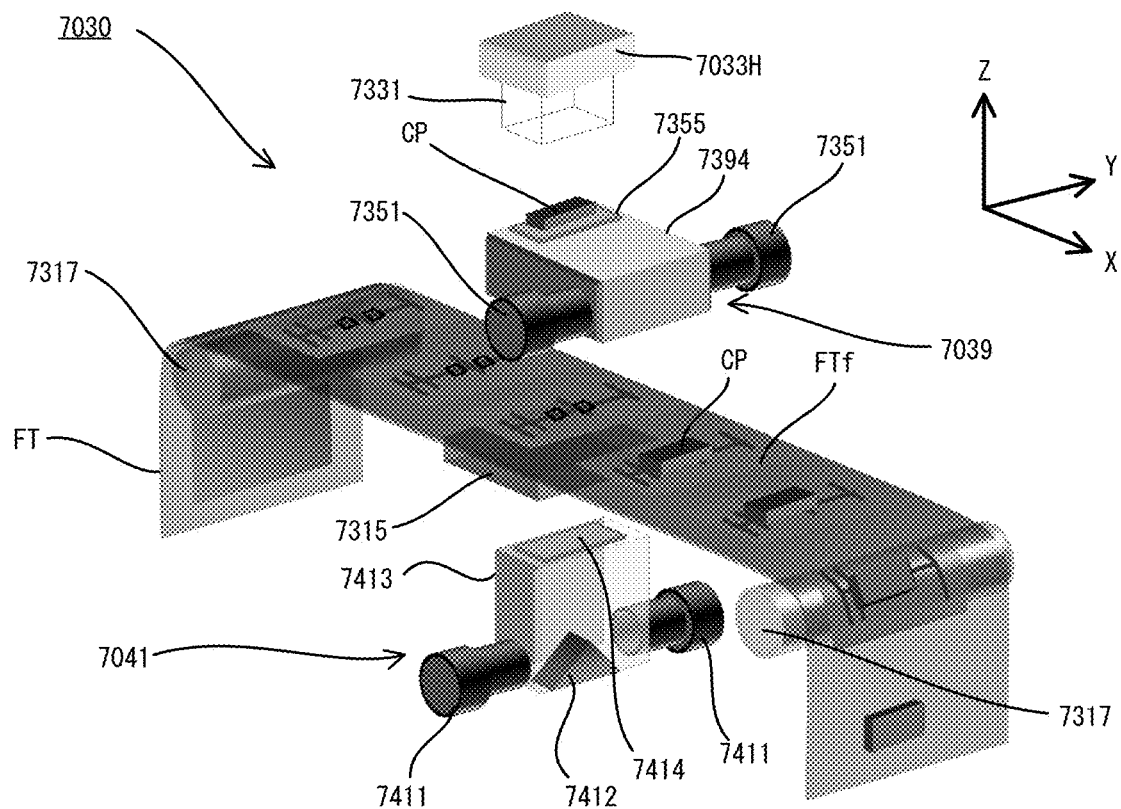
FIG. 26B is a schematic perspective view illustrating a state in which the transportation head has moved to the first position in the bonding device according to Embodiment 2.
Figure 27A:
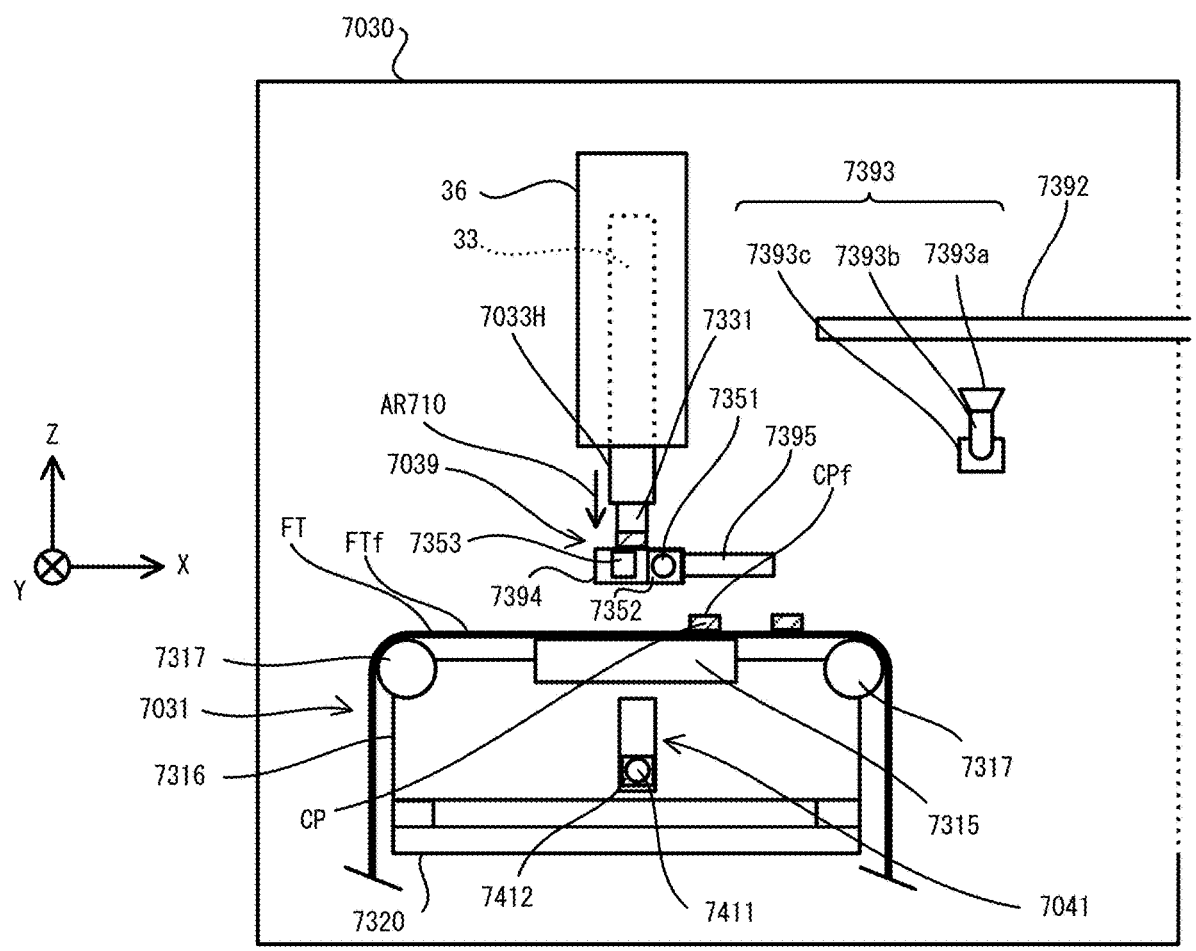
FIG. 27A is a schematic side view illustrating a manner in which a chip is transferred from the transportation head to a head in the bonding device according to Embodiment 2.
Figure 27B:
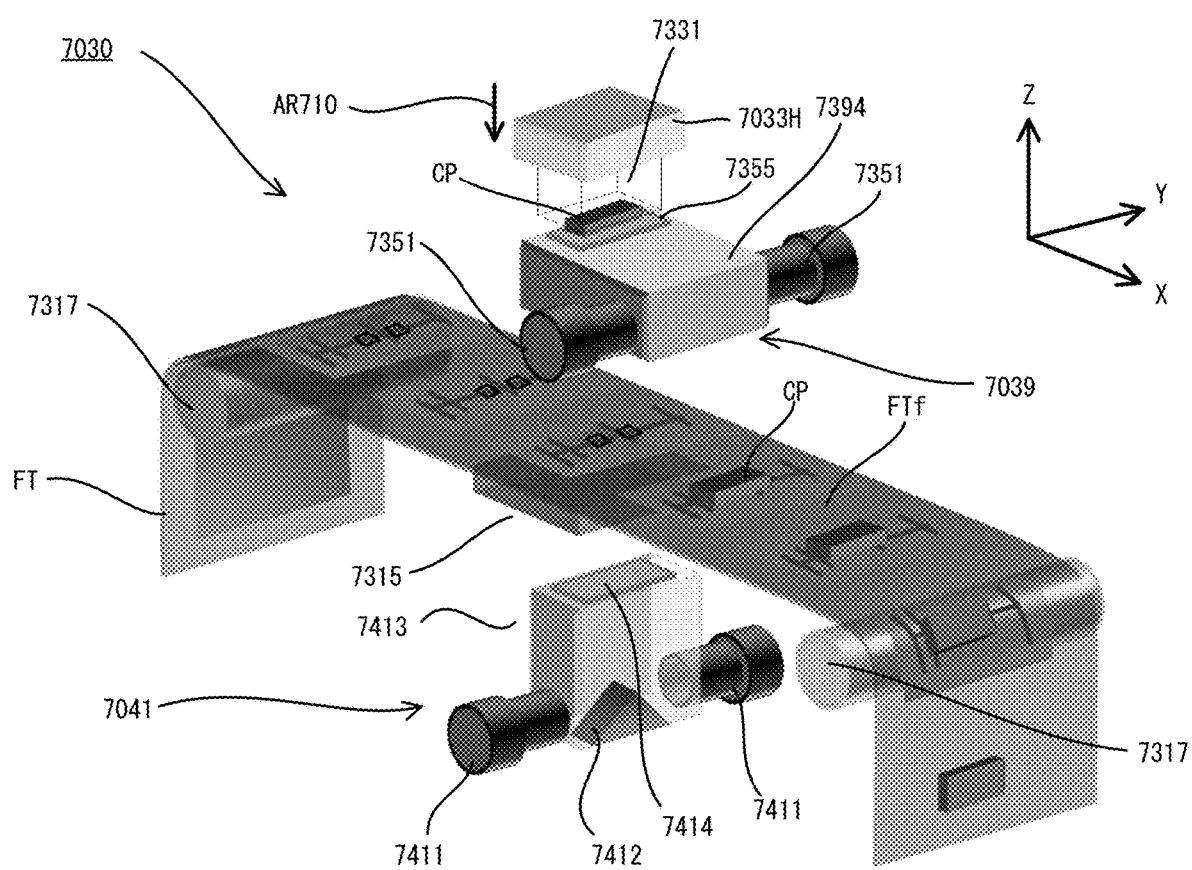
FIG. 27B is a schematic perspective view illustrating the manner in which a chip is transferred from the transportation head to the head in the bonding device according to Embodiment 2.
Figure 28A:
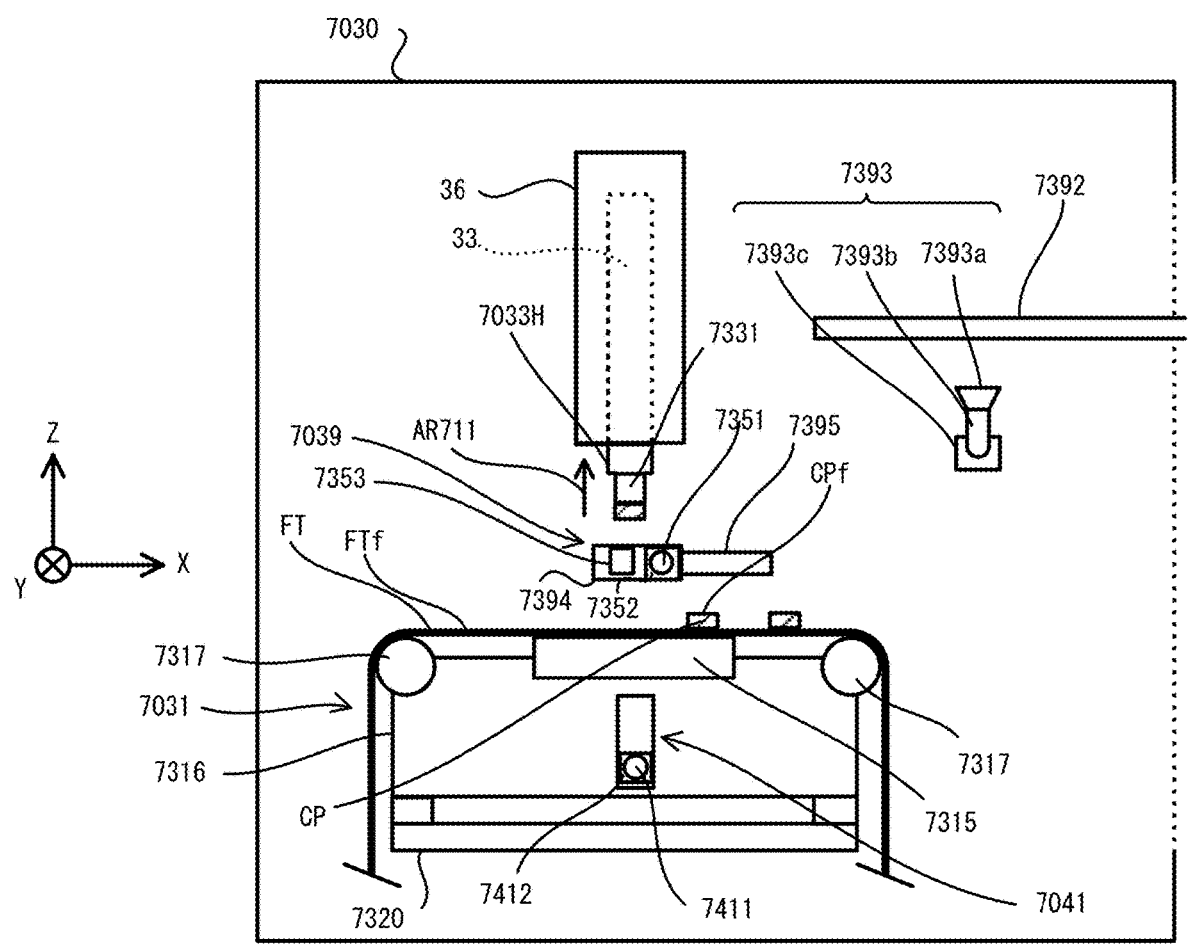
FIG. 28A is a schematic side view illustrating a state in which the chip is held by the head in the bonding device according to Embodiment 2.
Figure 28B:
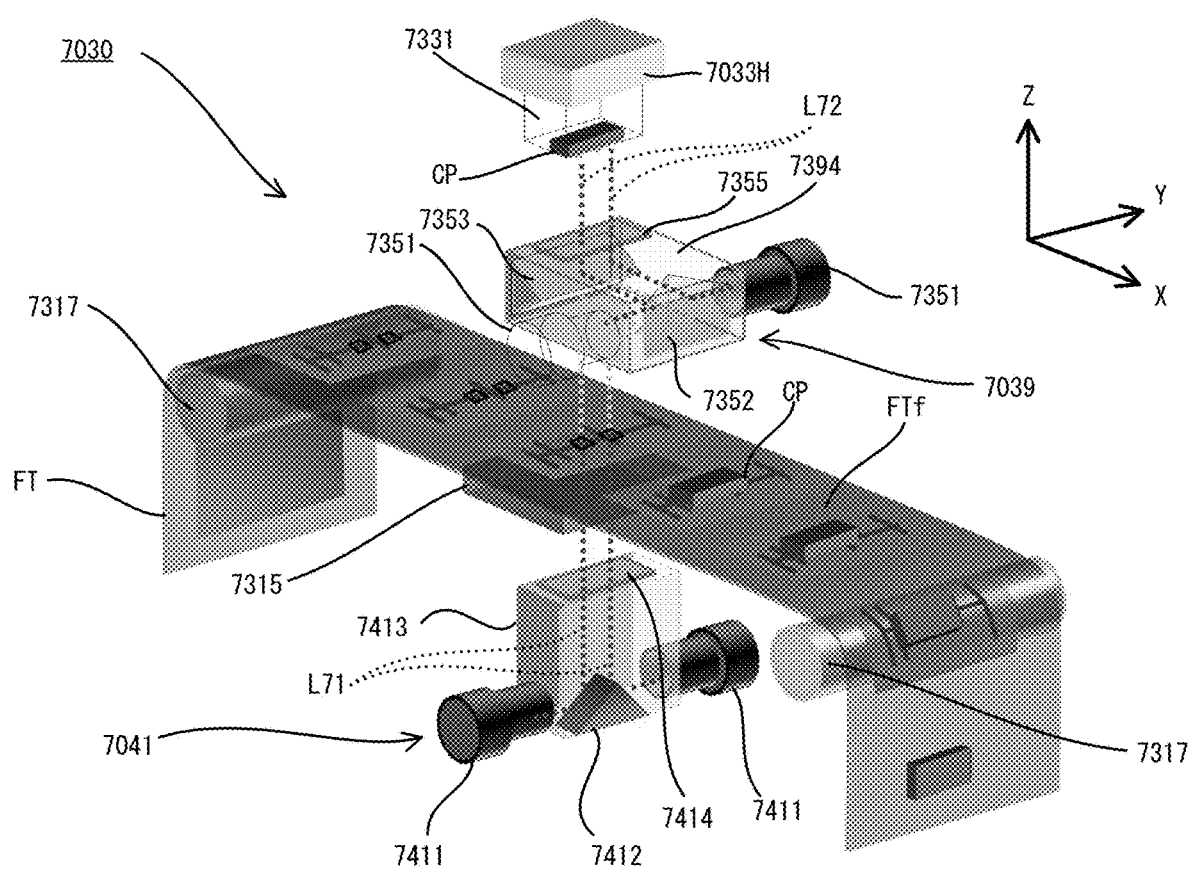
FIG. 28B is a schematic perspective view illustrating a manner in which positional deviation amount calculation and position correction are performed in the bonding device according to Embodiment 2.

Succeedingly, the chip transfer unit 7039 performs a transportation head movement step of moving the transportation head 7394 from the second position Pos72 to the first position Pos71, using the transportation head driver 7395, as illustrated by an arrow AR709 in FIG. 26A. This movement causes the chip CP to be arranged at a position facing the head 7033H, as illustrated in FIG. 26B. Subsequently, the head driver 36 moves the bonder 33 in the −Z-direction and brings the head 7033H close to the chip holder 7355 of the chip transfer unit 7039, as illustrated by an arrow AR710 in FIGS. 27A and 27B. Next, the chip mounting system 7 performs a transfer step of transferring the chip CP to the head 7033H, with the transportation head 7394 having been moved to the first position Pos71. In this step, the head driver 36 makes the head 7033H hold the chip CP on the tip portion thereof by making the sucker 7331 suck the chip CP with the head 7033H in contact with the chip CP. Next, the head driver 36 makes the head 7033H ascend in the +Z-direction, as illustrated by the arrow AR711 in FIG. 28A. At this time, the chip CP and the flexible substrate FT are in a state in which the alignment marks MC2$a$ and MC2$b$ on the chip CP and the alignment marks MC1$a$ and MC1$b$ on the flexible substrate FT are separated from each other by a second distance that is longer than a preset first distance at which the distance between the alignment marks MC2$a$ and MC2$b$ and the alignment marks MC1$a$ and MC1$b$ falls within a depth-of-field range of the imaging devices 7411.

Subsequently, the chip mounting system 7 performs a chip mounting process in which the bonding device 30 mounts the chip CP on the flexible substrate FT. The chip mounting process that the chip mounting system 7 performs will be described below, referring to FIGS. 28B to 31B. Note that, in FIG. 29, the same reference signs as those in FIG. 15 are assigned to the same steps as those in the chip mounting process described in Embodiment 1.

Figure 29:
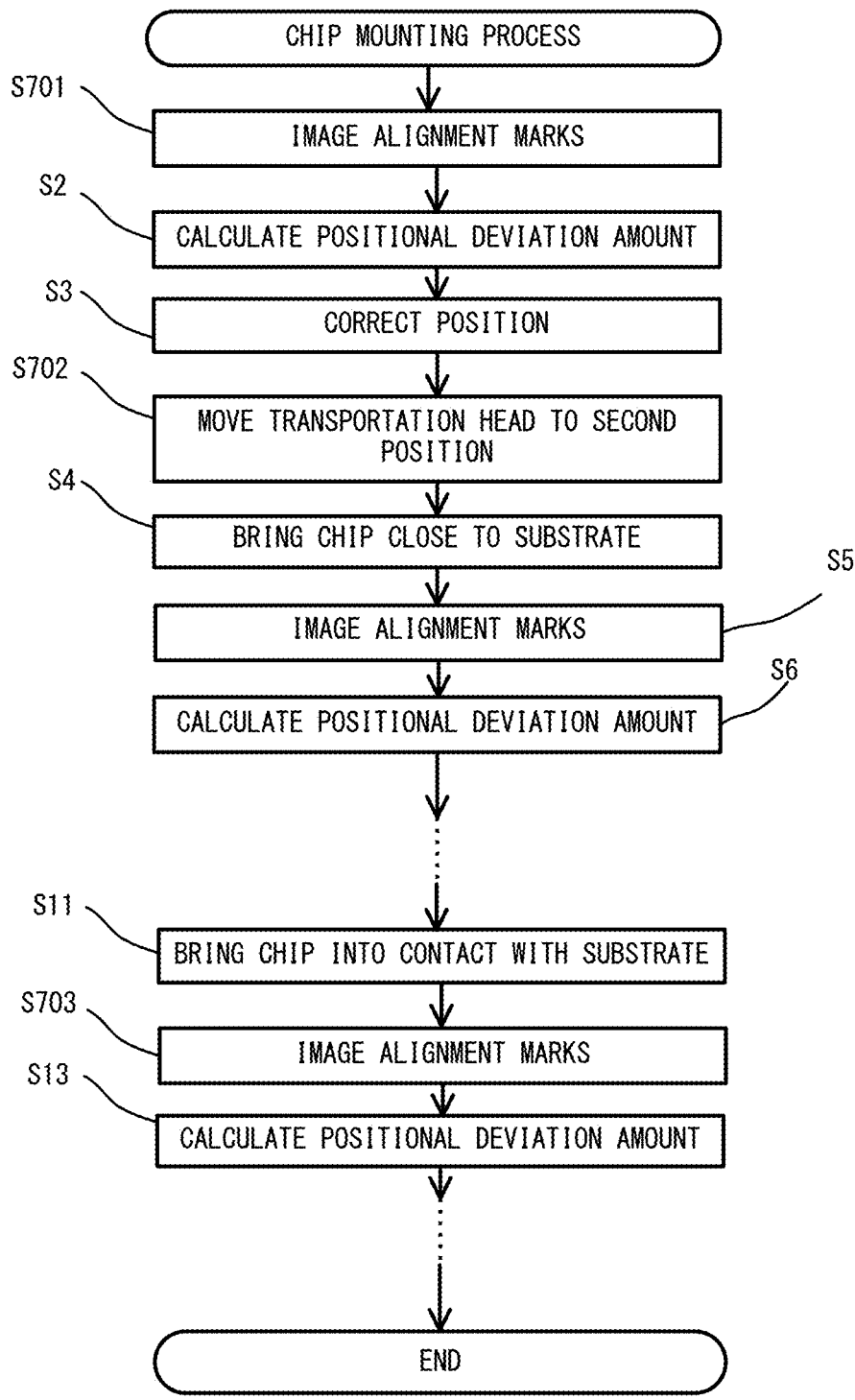
FIG. 29 is a flowchart illustrating an example of a flow of a chip mounting process that the chip mounting system according to Embodiment 2 performs.
Figure 30:
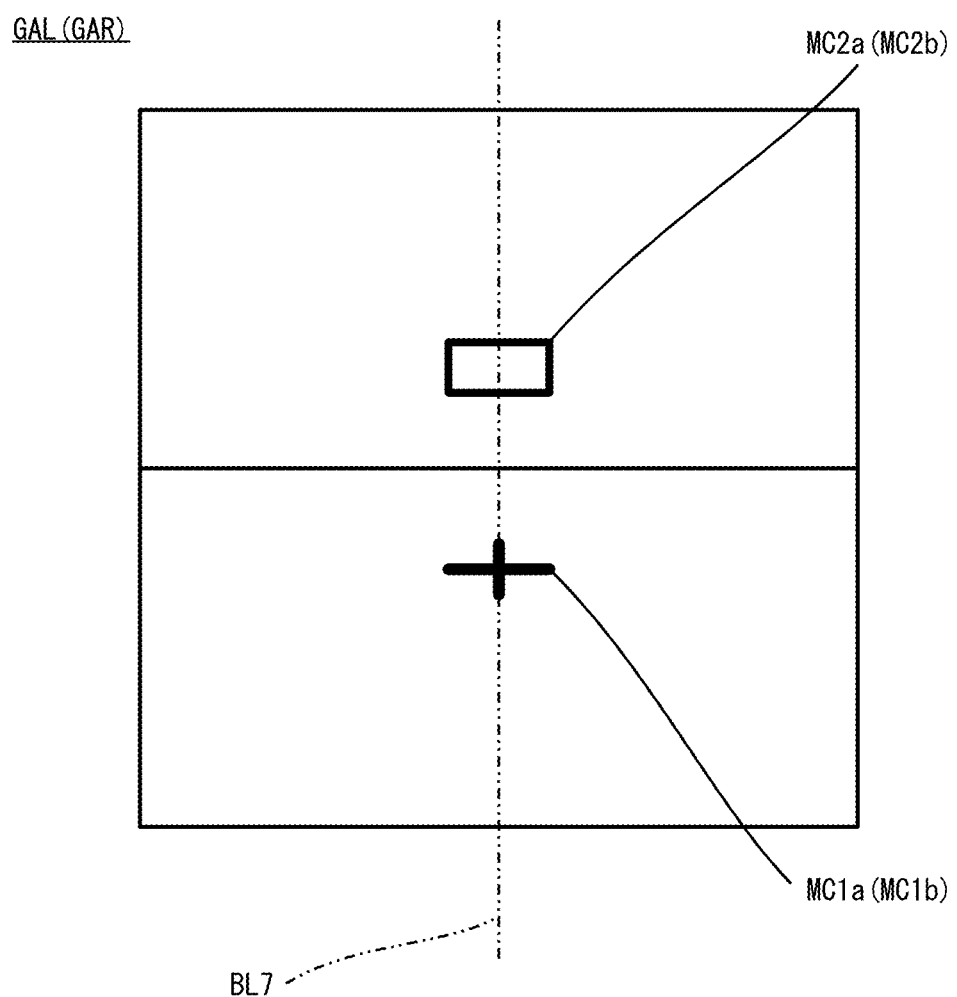
FIG. 30 is a diagram illustrating an imaged image of alignment marks disposed on a chip and a flexible substrate according to Embodiment 2.

First, the chip mounting system 7 performs a second imaging step of imaging the alignment marks on the chip CP and the alignment marks on the flexible substrate FT with the chip CP having been transferred from the chip transfer unit 7039 to the head 7033H, the head 7033H having moved vertically upward, and the chip CP and the flexible substrate FT separated from each other, as illustrated in FIG. 29 (step S701). In this step, distance between the chip transfer unit 7039 and the chip CP held by the head 7033H may be the same as a distance to a retreat position of the head 7033H as long as the distance allows the sucker 7331 of the head 7033H to suck and attach the chip CP thereto. In this step, the imaging devices 7351 image the alignment marks disposed on the flexible substrate FT, using light L71 that is emitted from the imaging devices 7411, is reflected by the light path converting member 7412, is transmitted through the flexible substrate FT, is reflected by the light path converting members 7353 and 7352, and reaches the imaging devices 7351, as illustrated in, for example, FIG. 28B. In addition, the imaging devices 7351 image the alignment marks disposed on the chip CP, using light L72 that is reflected by the chip CP, is reflected by the light path converting members 7353 and 7352, and reaches the imaging devices 7351. The controller 7090 acquires image data including an imaged image of the alignment mark MC2a (MC2b) on the chip CP and an imaged image of the alignment mark MC1a (MC1b) on the flexible substrate FT as illustrated in, for example, FIG. 30, using each of the imaging devices 7351. In this step, when an imaged image of the alignment mark MC2a (MC2b) on the chip CP and an imaged image of the alignment mark MC1a (MC1b) on the flexible substrate FT exist on a base line BL7, it can be determined that there is no positional deviation between the chip CP and the flexible substrate FT.

Returning to FIG. 29, succeedingly, the chip mounting system 7 performs a second step of calculating amount of positional deviation of calculating relative positional deviation amounts between the flexible substrate WT and the chip CP from the imaged images of the alignment marks MC1a, MC1b, MC2a, and MC2b, which were imaged by the imaging devices 7351 (step S2). Subsequently, the chip mounting system 7 performs a second position correction step of performing correction of the position of the chip CP with respect to the flexible substrate FT by moving the support 7316 in a horizontal direction with respect to the head 7033H in such a way as to eliminate the calculated positional deviation amounts (step S3).

Next, the chip mounting system 7 moves the transportation head 7394 from the first position Pos71 to the second position Pos72 (step S702) and subsequently performs a movement step of bringing the chip CP close to the flexible substrate FT by moving the head 7033H holding the chip CP in the −Z-direction (step S4). In this step, the transportation head driver 7395 moves the transportation head 7394 from the first position Pos71 to the second position Pos72, as illustrated by an arrow AR712 in FIG. 31A. The head driver 36 moves the head 7033H in the −Z-direction, as illustrated by the arrow AR713 in FIG. 31A. On this occasion, the head driver 36 brings the chip CP close to the flexible substrate WT until the alignment marks MC2a and MC2b on the chip CP and the alignment marks MC1a and MC1b on the flexible substrate FT are brought to a state of being separated from each other by the preset first distance at which the distance between the alignment marks MC2a and MC2b and the alignment marks MC1a and MC1b falls within the depth-of-field range of the imaging devices 7411.

Figure 31A:
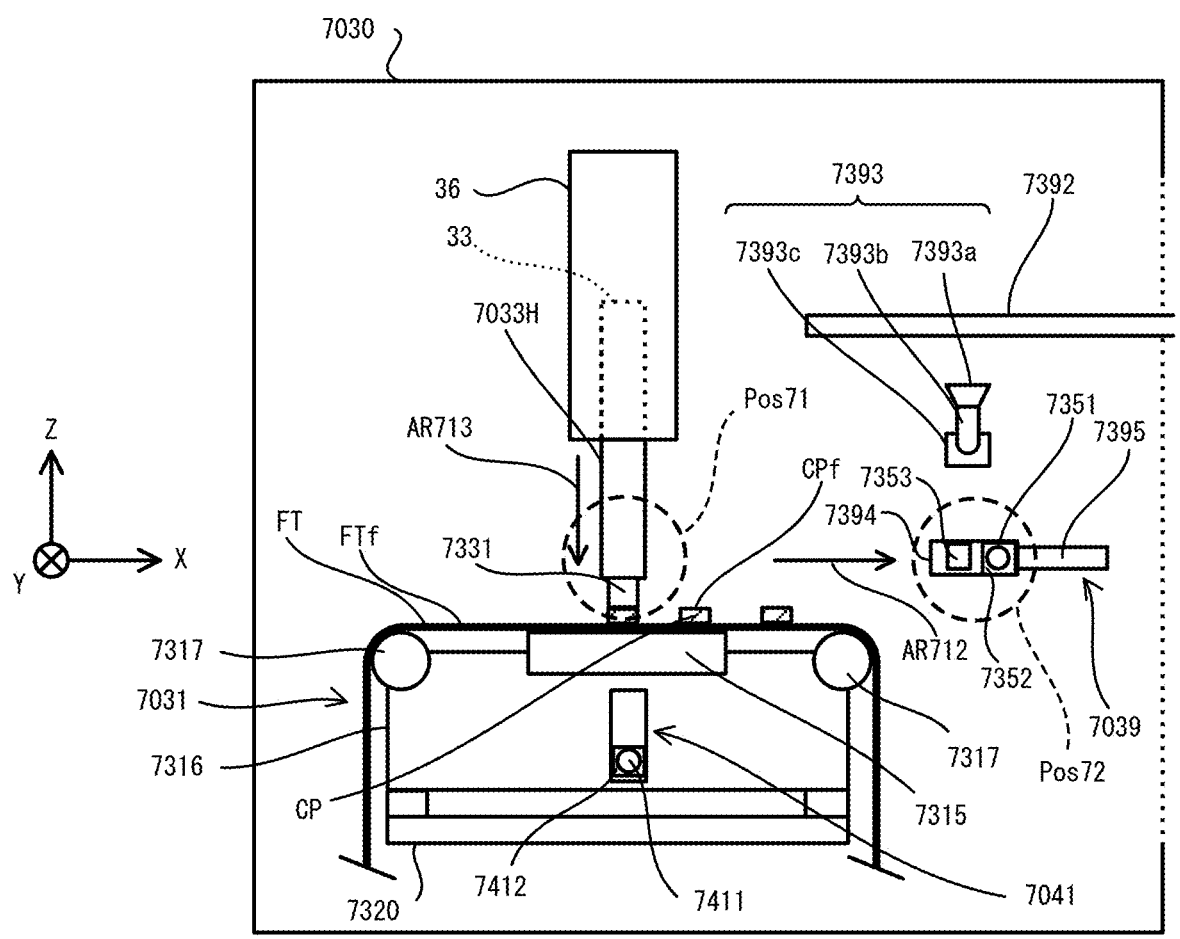
FIG. 31A is a schematic side view illustrating a state in which a chip has been brought into contact with the flexible substrate in the bonding device according to Embodiment 2.
Figure 31B:
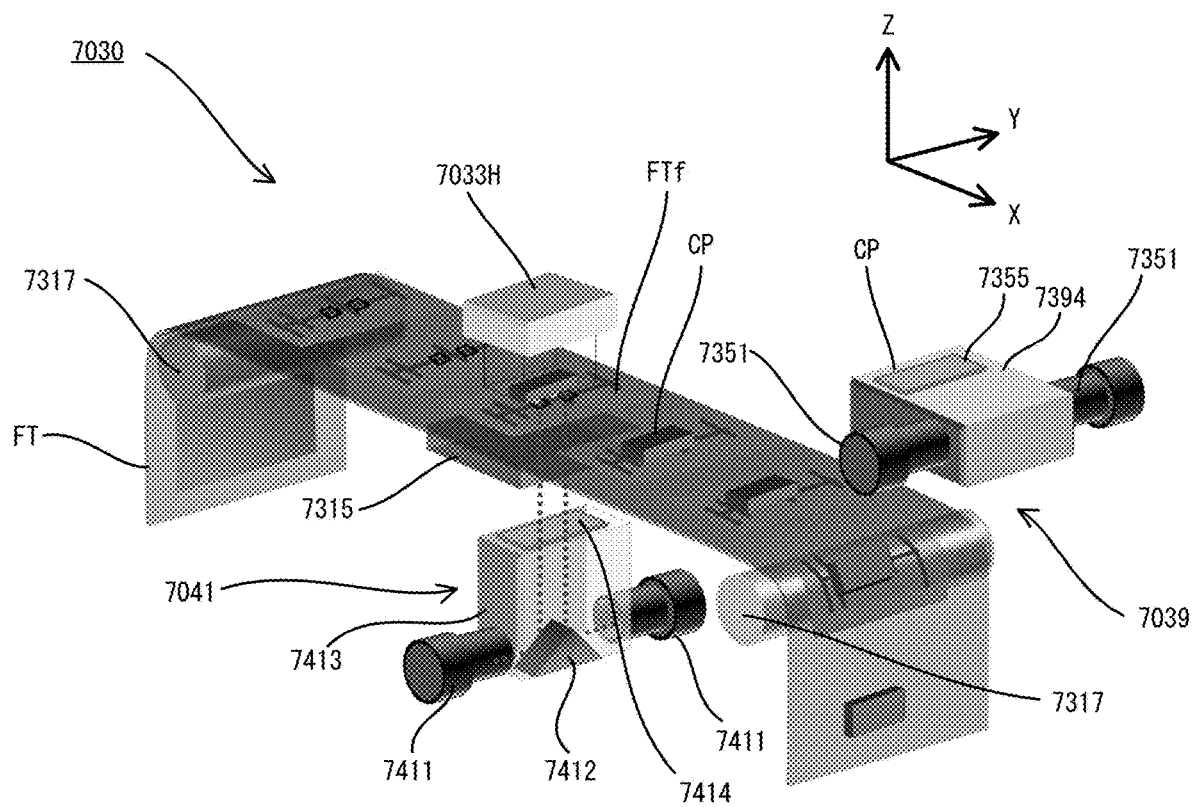
FIG. 31B is a schematic perspective view illustrating the state in which a chip has been brought into contact with the flexible substrate in the bonding device according to Embodiment 2.

Returning to FIG. 29, succeedingly, the chip mounting system 7 performs a first imaging step of imaging the alignment marks MC2a and MC2b on the chip CP and the alignment marks MC1a and MC1b on the flexible substrate FT again with the chip CP and the flexible substrate FT separated from each other by the afore-described first distance (step S5). In this step, as illustrated in FIG. 31B, the imaging devices 7411 perform imaging of the alignment marks MC2a and MC2b on the chip CP and the alignment marks MC1a and MC1b on the flexible substrate FT and imaging of the alignment marks MC2a and MC2b on the chip CP at the same time. In this processing, a portion of light emitted from the imaging devices 7411 and reflected by the light path converting member 7412 is transmitted through the flexible substrate FT. A portion of the light that was transmitted through the flexible substrate FT is reflected by parts of the chip CP at which the alignment marks MC2a and MC2b are disposed. The rest of the light is reflected by parts of the flexible substrate FT at which the alignment marks MC1a and MC1b are disposed. The reflected light is reflected by the light path converting member 7412 again and is incident on the imaging devices 7411. Through this processing, the chip mounting system 1 acquires imaged images including images of the alignment marks MC2a and MC2b, which are disposed on the chip CP, and images of the alignment marks MC1a and MC1b, which are disposed on the flexible substrate FT. The chip mounting system 1 simultaneously recognizes pairs of the alignment marks MC2a and MC2b on the chip CP and the alignment marks MC1a and MC1b on the flexible substrate FT in one imaging by the imaging devices 7411 without moving the focal axis.

Returning to FIG. 29, next, the chip mounting system 7 performs the processing in steps S6 to S11. The chip mounting system 7 performs a contact step of bringing the bonding surface CPf of the chip CP into contact with the mounting surface FTf of the flexible substrate FT in step S11 and subsequently performs a third imaging step of imaging the alignment marks MC2a and MC2b on the chip CP and the alignment marks MC1a and MC1b on the flexible substrate FT with the chip CP and the flexible substrate FT in contact with each other (step S12). In this step, the chip mounting system 1, as with the above-described processing, performs imaging of the alignment marks MC1a and MC1b on the flexible substrate FT and imaging of the alignment marks MC2a and MC2b on the chip CP by the imaging devices 7411 at the same time. Subsequently, the processing in step S13 and following steps is performed.

As described in the foregoing, according to the chip mounting system 7 according to the present embodiment, since the alignment mark MC2a (MC2b) on the chip CP and the alignment mark MC1a (MC1b) on the flexible substrate FT on one side come into the field of view of one of the imaging devices 7351, the one of the imaging devices 7351 is capable of imaging a pair of the alignment marks MC2a and MC1a (MC2b and MC1b) at the same time, as illustrated in FIG. 21A. In the conventional configuration described in Embodiment 1, since an imaging device for imaging the alignment marks on the chip CP and an imaging device for imaging the alignment marks on the flexible substrate FT were arranged in a separated manner, positional deviation between the two imaging devices influenced alignment precision of the chip CP with respect to the flexible substrate FT. By contrast, according to the chip mounting system 7 according to the present embodiment, since the alignment mark MC2a (MC2b) on the chip CP and the alignment mark MC1a (MC1b) on the flexible substrate FT can be imaged at the same time, the positions of the alignment marks MC2a and MC1a (MC2b and MC1b) can be recognized with high precision. In addition, configuring the two imaging devices 7351 to image four alignment marks MC1a, MC1b, MC2a, and MC2b at the same time enables the alignment precision to be further increased.

In the conventional configuration described in Embodiment 1, a chip transporter is retreated after the chip transporter has transferred a chip CP to a head, an imaging device constituted by a so-called dual view camera is inserted and alignment marks on a flexible substrate FT and the chip CP are imaged by the imaging device, and the head moves vertically downward after the imaging device has been retreated and bonds the chip CP to the flexible substrate FT. By contrast, according to the chip mounting system 7 according to the present embodiment, the chip holder 7355, which is formed of a translucent material, is disposed at a position at which the imaging devices 7351 are able to image the alignment marks MC2a and MC2b on the chip CP. This configuration enables the alignment marks MC2a and MC2b on the chip CP and the alignment marks MC1a and MC1b on the flexible substrate FT to be imaged at the same time as the chip CP is transferred to the head 7033H. After the transportation head 7394 has retreated, the head 7033H can be brought close to flexible substrate FT and the chip CP can be bonded to the flexible substrate FT. Therefore, it is possible to eliminate the time required for the chip transporter to complete a retreat after having transferred the chip CP to the head, which was a required motion in the afore-described conventional configuration. In addition, since the configuration of the chip mounting system 7 can be simplified, it is possible to reduce production cost.

In addition, imaging the alignment marks MC2a and MC2b on the chip CP and the alignment marks MC1a and MC1b on the flexible substrate FT, using the imaging devices 7351 in so-called pre-alignment and imaging the alignment marks MC2a and MC2b on the chip CP and the alignment marks MC1a and MC1b on the flexible substrate FT at the same time using the imaging devices 7411 arranged vertically below the flexible substrate FT again with the chip CP held by the head 7033H being kept close to the flexible substrate FT enable the alignment precision of the chip CP with respect to the flexible substrate FT to be improved.

In general, when the transportation head 7394 is inserted between the chip CP and the flexible substrate FT, the head 7033H cannot arrange the chip CP at a position in the vicinity of the flexible substrate FT unless the head 7033H descends vertically downward by a distance equivalent to the thickness of the transportation head 7394. Thus, the chip mounting system 7 according to the present embodiment is configured to be able to finish positional deviation correction in the pre-alignment while making the head 7033H descend. Therefore, it is possible to not only reduce tact time at the time of mounting a chip CP on a flexible substrate FT but also improve the positional precision of the chip CP with respect to the flexible substrate FT. In addition, since imaging the alignment marks MC2a and MC2b on the chip CP and the alignment marks MC1a and MC1b on the flexible substrate FT at the same time with the chip CP arranged in the vicinity of the flexible substrate FT enables influence of temporal positional deviation of the light path converting members 7352 and 7353 caused by thermal expansion of the light path converting members 7352 and 7353 or inclination or error of the central axis of the head 7033H due to increase in the amount of descent of the head 7033H to a position at which the chip CP is bonded to the flexible substrate FT on the alignment precision of the chip CP with respect to the flexible substrate FT to be reduced, it is possible to increase the alignment precision.

In addition, the chip mounting system 7 according to the present embodiment is a so-called chip on film mounting system that mounts chips CP on a continuous tape-shaped flexible substrate FT. The chip mounting system 7 according to the present embodiment enables not only chips CP to be successively mounted at high speed but also the alignment precision of the chips CP with respect to the flexible substrate FT to be increased.

Figure 5B:
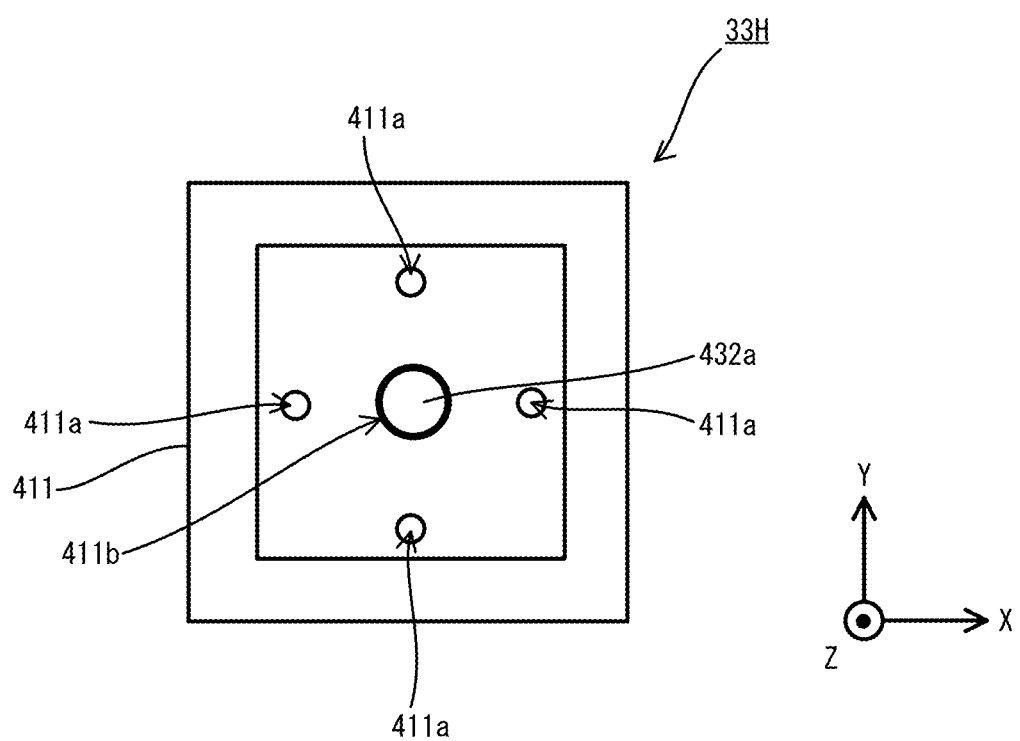
FIG. 5B is a plan view of the head according to Embodiment 1.
Figure 32A:
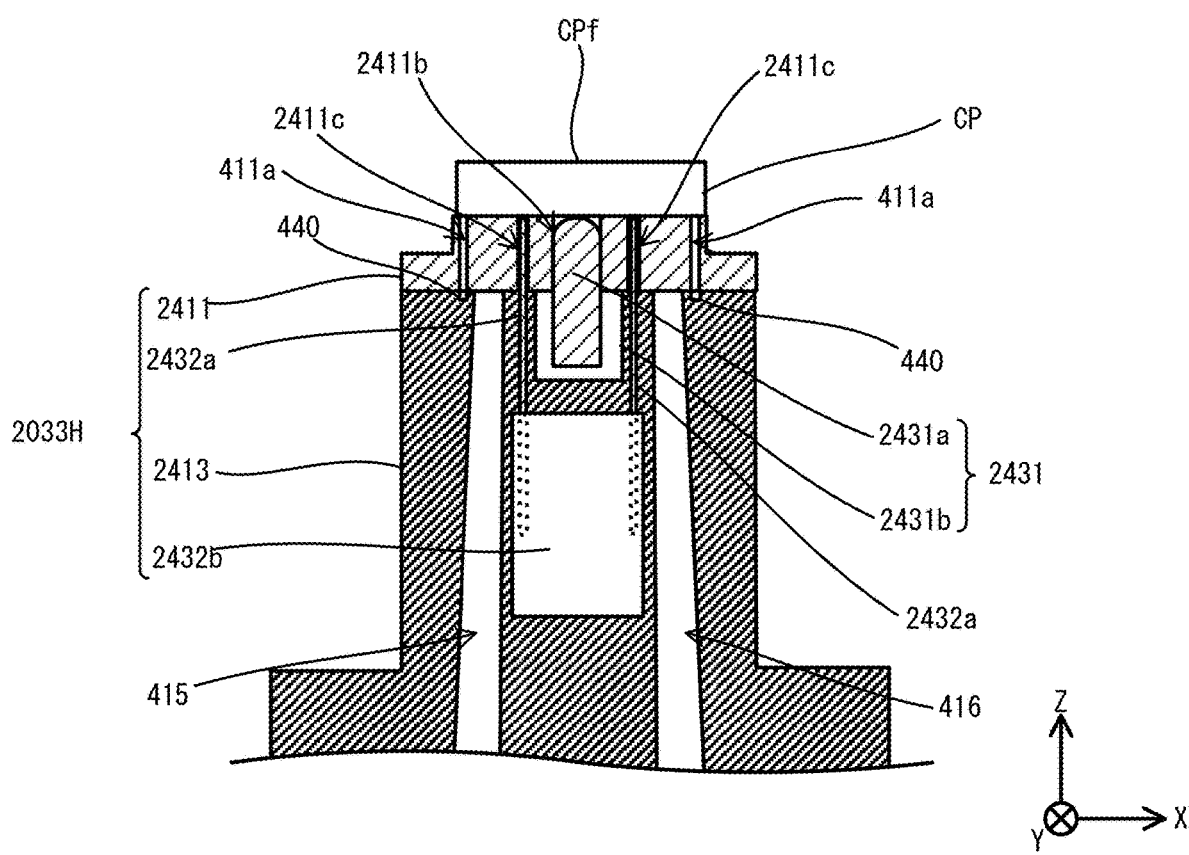
FIG. 32A is a cross-sectional view of a head according to a variation.
Figure 32B:
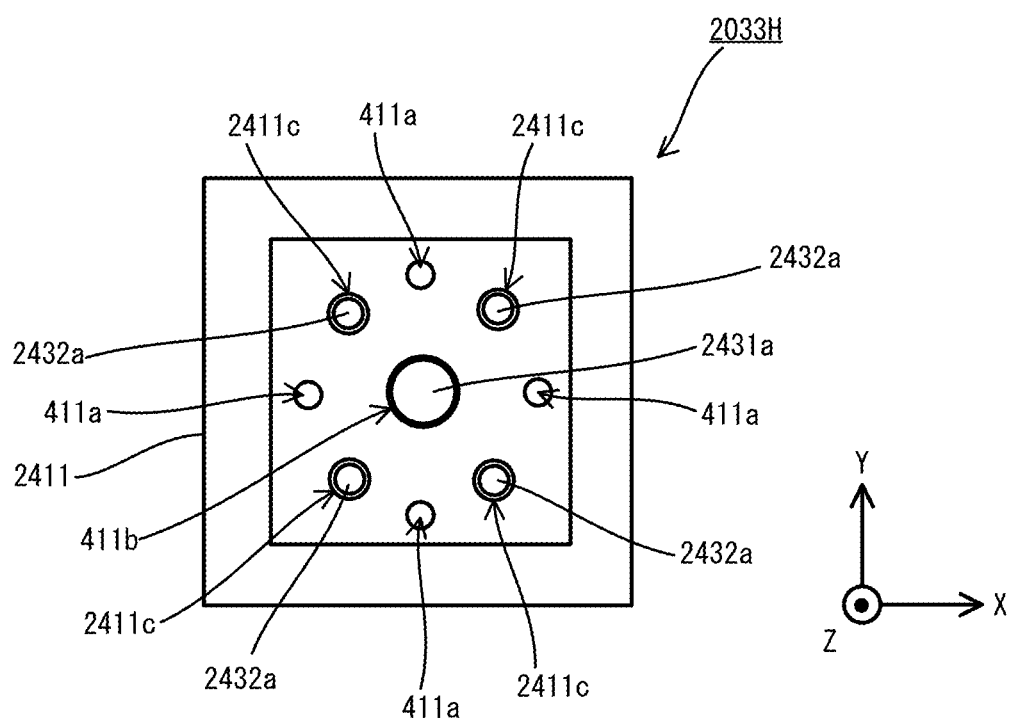
FIG. 32B is a plan view of the head according to the variation.

Although the respective embodiments of the present disclosure were described above, the present disclosure is not limited to the configurations of the afore-described embodiments. For example, as illustrated in FIG. 32A, the present disclosure may have a configuration that includes a bonding device having a head 2033H in which a pressing mechanism 2431 for pressing a central portion of a chip CP vertically upward while holding the periphery of the chip CP is disposed. Note that, in FIGS. 32A and 32B, the same reference signs as those in FIGS. 5A and 5B are assigned to the same constituent components as those in the embodiments. The head 2033H includes a chip tool 2411, a head body 2413, chip supporters 2432a, and a support driver 2432b. The chip tool 2411 is formed of a material (for example, silicon (Si)) that transmits imaging light (infrared light or the like), as with the chip tool 411 in the embodiments. The head body 2413 includes holding mechanisms 440 and the pressing mechanism 2431, which presses the central portion of the chip CP. The pressing mechanism 2431 includes a pressing rod 2431a that is movable in the vertical direction at the central portion of the tip surface of the head body 2413 and a pressing driver 2431b that drives the pressing rod 2431a. The head body 2413 also includes suckers (not illustrated) for fixing the chip tool 2411 to the head body 2413 by means of vacuum suction. The chip tool 2411 has through-holes 411a that are formed at positions corresponding to the holding mechanisms 440 of the head body 2413, a through-hole 2411b into the inside of which the pressing rod 2431a is inserted, and through-holes 2411c into the inside of which the chip supporters 2432a are inserted.

The chip supporters 2432a have, for example, pin-like shapes, are disposed at the tip portion of the head 2033H, and are freely movable in the vertical direction. The chip supporters 2432a support the opposite side to the bonding surface CPf side of a chip CP. As illustrated in, for example, FIG. 32B, the chip supporters 2432a are disposed in a number of four in such away as to surround the pressing rod 2431a. The support driver 2432b drives the chip supporters 2432a in the vertical direction. The support driver 2432b moves the chip supporters 2432a to the vertically upper side of a chip holder 393 with the chip holder 393 of a chip transportation device 39 holding the chip CP and being positioned at a transfer position Pos1 and the chip supporters 2432a supporting the chip CP. This movement causes the chip CP to be transferred from the chip holder 393 of the chip transportation device 39 to the head 2033H.

Figure 33:
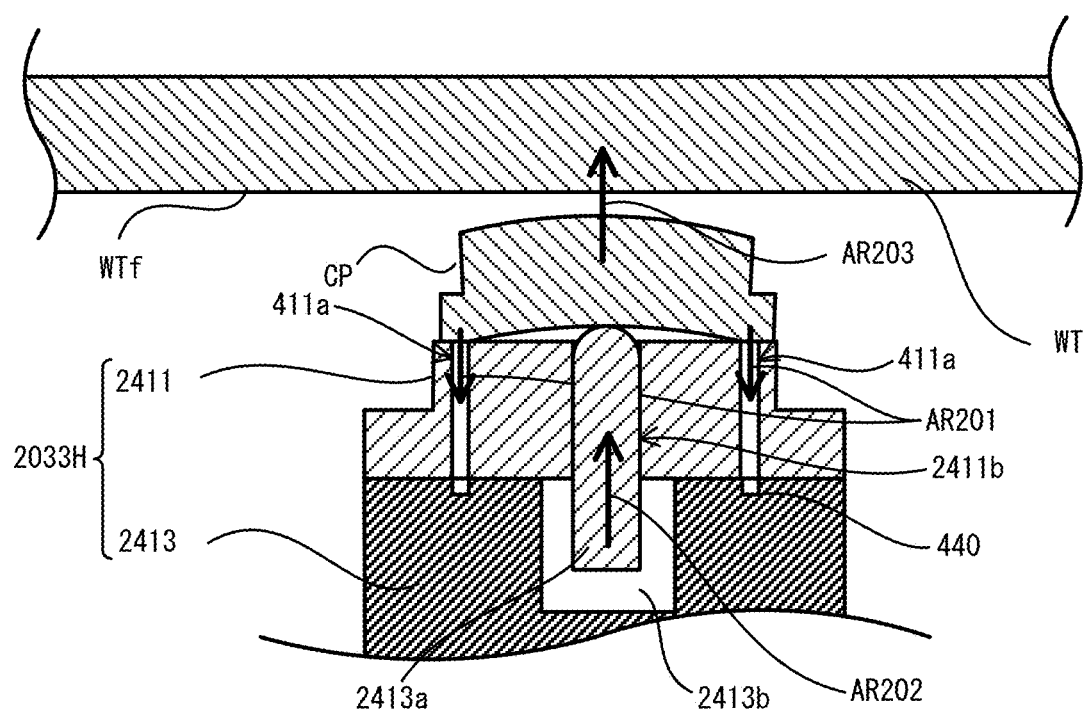
FIG. 33 is a diagram for a description of operation of the head according to the variation.

When the pressing driver 2431b moves the pressing rod 2431a vertically upward with the chip tool 2411 holding the periphery of the chip CP, the central portion of the chip CP is pressed vertically upward (+Z-direction) and the chip CP is brought to a state in which the central portion thereof bends and protrudes to the vertically upper side than the periphery thereof, as illustrated in FIG. 33.

A bonding device according to the present variation makes the pressing driver 2431b drive the pressing rod 2413a in the vertical direction (see an arrow AR202 in FIG. 33), with the periphery of the chip CP sucked and held by the chip tool 2411 (see arrows AR201 in FIG. 33). This configuration causes the chip CP to be brought to a state of bending in such a manner that the central portion thereof protrudes to the substrate WT side of the periphery thereof. The head driver bringing the head 2033H close to the substrate WT with the chip CP made to bend as illustrated by an arrow AR203 in FIG. 33 causes the central portion of the chip CP to come into contact with the mounting surface WTf of the substrate WT. Note that the bonding device may, after having moved the head 2033H in the vertical direction and brought the head 2033H close to a preset distance from the substrate WT, bring the central portion of the chip CP into contact with the mounting surface WTf of the substrate WT by making the chip CP bend. Subsequently, the bonding device mounts the chip CP on the substrate WT by, while making the pressing rod 2413a retract vertically downward, bringing the head 2033H closer to the substrate WT.

Since this configuration enables drawing-in of air into an interspace between the substrate WT and the chip CP when the chip CP is mounted on the substrate WT to be suppressed, it becomes possible to mount the chip CP on the substrate WT excellently without void.

In the respective embodiments, an example of the chip mounting system 1 that mounts a chip CP on a substrate WT by bringing a bonding surface CPf of the chip CP on which hydrophilization treatment was performed into contact with a mounting surface WTf of the substrate WT was described. However, without being limited to the above, the chip mounting system may be a chip mounting system that mounts a chip CP on, for example, a composite substrate made by forming a resin layer on a surface of a substrate WT. The resin layer above is formed of thermosetting resin, thermoplastic resin, ultraviolet-curable resin, or the like. In a chip mounting system according to the present variation, a bonding device 30 includes a substrate temperature regulator (not illustrated) that is disposed to a stage 315 and regulates the temperature of a composite substrate held by the stage 315 and a chip temperature regulator (not illustrated) that is disposed to a head 33H and regulates the temperature of a chip CP held by the head 33H.

Figure 34:
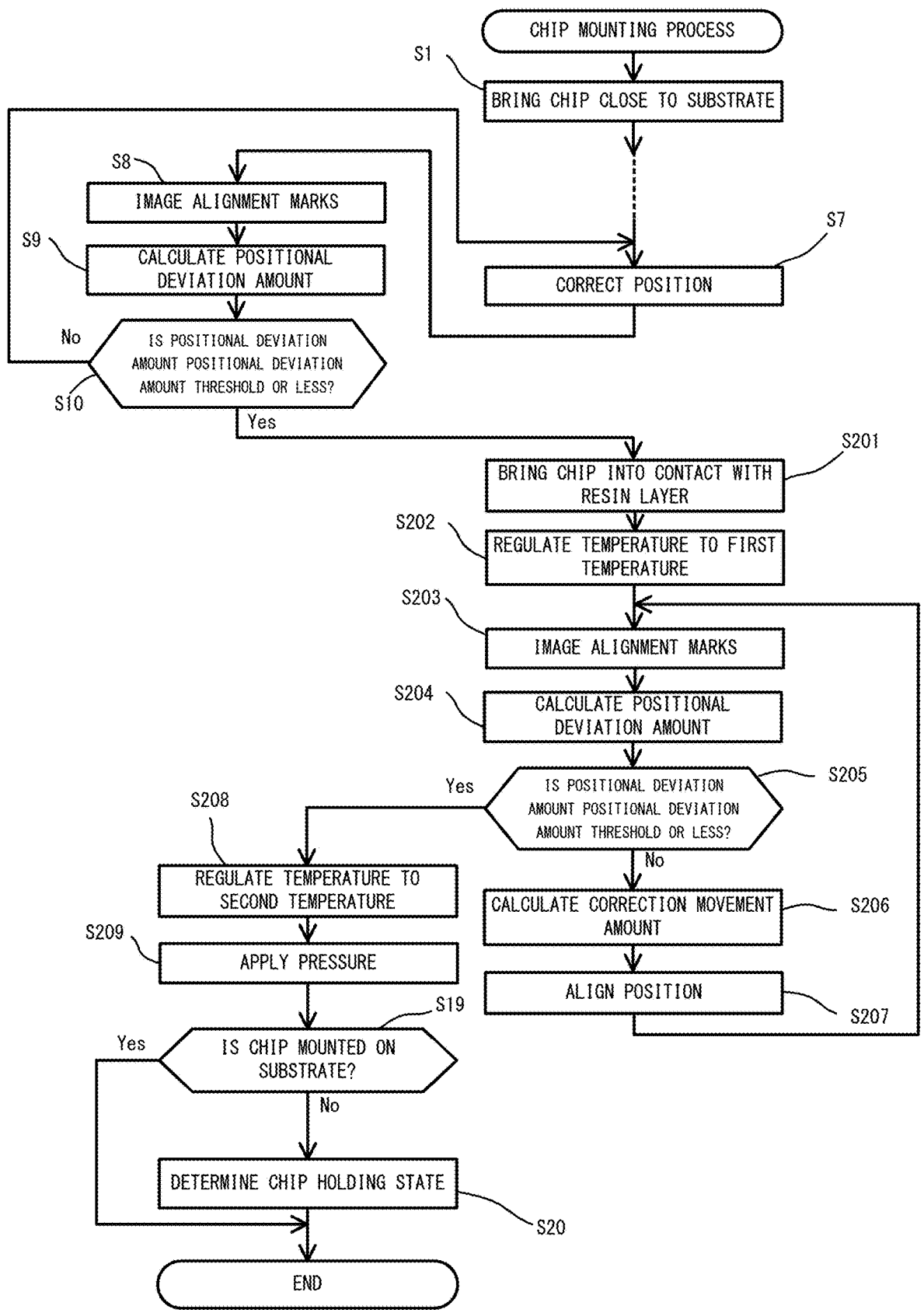
FIG. 34 is a flowchart illustrating an example of a flow of a chip mounting process that a chip mounting system according to another variation performs.
Figure 35A:
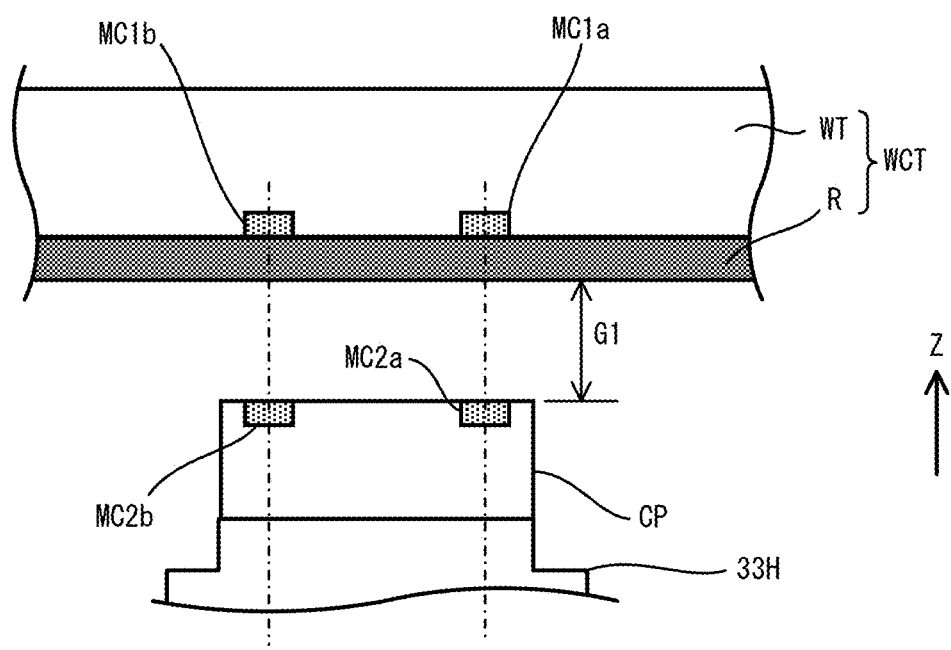
FIG. 35A is a diagram illustrating a state in which a chip is separated from a substrate in the chip mounting system according to the another variation.
Figure 35B:
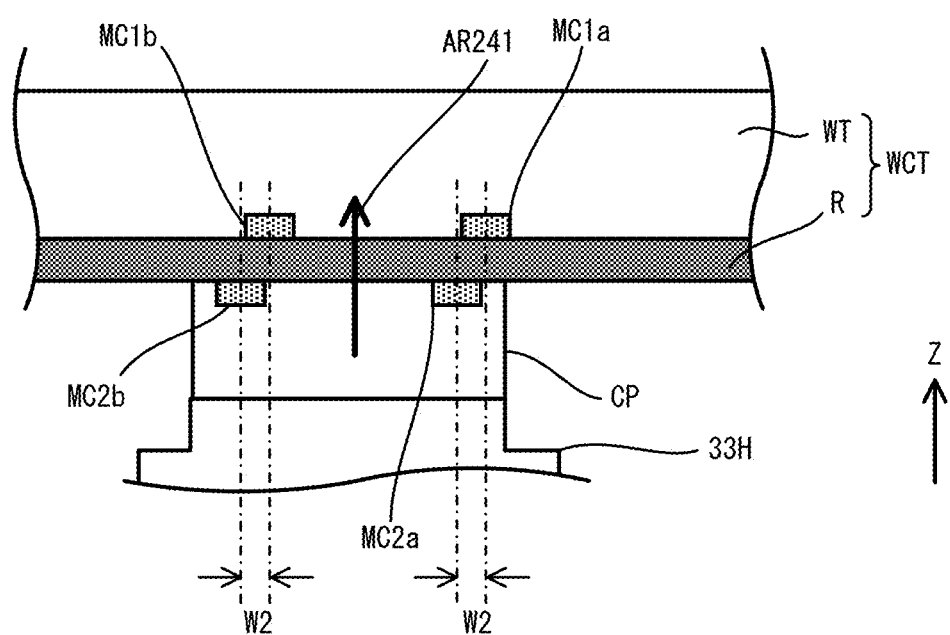
FIG. 35B is a diagram illustrating a state in which the chip has been brought into contact with a resin layer in the chip mounting system according to the another variation.
Figure 35C:
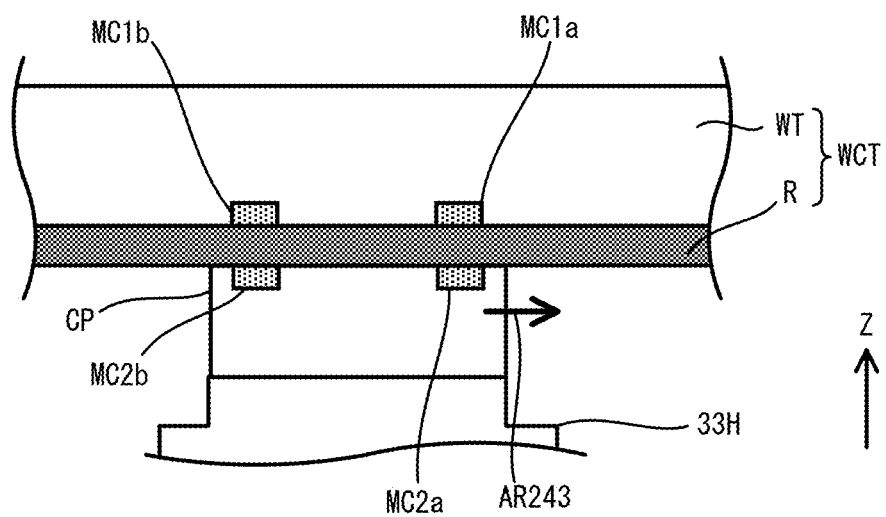
FIG. 35C is a diagram illustrating a manner in which the position of the chip with respect to the substrate is corrected in the chip mounting system according to the another variation.

A chip mounting process that the chip mounting system according to the present variation performs in the bonding device 30 will be described below, referring to FIGS. 34 to 35C. Note that, in FIG. 34, the same reference signs as those in FIG. 15 are assigned to the same steps as those in Embodiment 1. First, a chip mounting system 1 performs processing in steps S1 to S10. The processing completes position correction of a chip CP with the chip CP separated from a composite substrate WCT by a first distance G1, as illustrated in FIG. 35A. The first distance G1 is equivalent to a distance at which distance between alignment marks MC2a and MC2b on the chip CP and alignment marks MC1a and MC1b on the substrate WT falls within a depth-of-field range of imaging devices 35a and 35b, as described in the embodiments.

Next, the chip mounting system brings the chip CP into contact with a resin layer R of the composite substrate WCT by moving the head 33H holding the chip CP vertically upward (step S201). Succeedingly, the chip mounting system makes the substrate temperature regulator and the chip temperature regulator regulate the temperatures of the stage 315 and the head 33H to a first temperature at which the resin layer R softens (step S202). Subsequently, the chip mounting system images the alignment marks MC2a and MC2b on the chip CP and the alignment marks MC1a and MC1b on the substrate WT at the same time with the chip CP in contact with the resin layer R (step S203). Next, the chip mounting system calculates relative positional deviation amounts of the chip CP with respect to the substrate WT (step S204). In this step, the chip mounting system respectively calculates positional deviation amounts $\Delta x$, $\Delta y$, and $\Delta \theta$ in the X-direction, the Y-direction, and the rotational direction about the Z-axis between the chip CP and the substrate WT by performing processing similar to the processing in step S8 in FIG. 15, which was described in the embodiments.

Subsequently, the chip mounting system determines whether or not all of the calculated positional deviation amounts $\Delta x$, $\Delta y$, and $\Delta \theta$ are equal to or less than preset positional deviation amount threshold values $\Delta xth$, $\Delta yth$, and $\Delta \theta th$, respectively (step S205). In the chip mounting process, caused by bringing the chip CP into contact with the resin layer R as illustrated by, for example, an arrow AR241 in FIG. 35B, positional deviation of the alignment mark MC1a with respect to the alignment mark MC2a or positional deviation of the alignment mark MC1b with respect to the alignment mark MC2b may occur.

Returning to FIG. 34, it is assumed that, subsequently, the chip mounting system determines that one of the calculated positional deviation amounts $\Delta x$, $\Delta y$, and $\Delta \theta$ is greater than the corresponding one of the preset positional deviation amount threshold values $\Delta xth$, $\Delta yth$, and $\Delta \theta th$ (step S205: No). In this case, the chip mounting system calculates relative correction movement amounts of the chip CP with respect to the substrate WT required to decrease all of the calculated positional deviation amounts $\Delta x$, $\Delta y$, and $\Delta \theta$ to the positional deviation amount threshold values $\Delta xth$, $\Delta yth$, and $\Delta \theta th$ or less, respectively (step S206). In this step, the chip mounting system calculates the correction movement amounts by performing processing similar to the processing in step S16 in FIG. 15, which was described in the embodiments.

Subsequently, the chip mounting system performs correction of the position of the chip CP with respect to the substrate WT in such a way as to correct the relative positional deviation amounts $\Delta x$, $\Delta y$, and $\Delta \theta$ of the chip CP with respect to the substrate WT (step S207). In this step, the chip mounting system performs position alignment of the chip CP with the chip CP in contact with the resin layer R, as illustrated in, for example, FIG. 35C. Next, the chip mounting system performs the processing in step S203 again.

On the other hand, it is assumed that the chip mounting system determines that all of the calculated positional deviation amounts $\Delta x$, $\Delta y$, and $\Delta \theta$ are equal to or less than the preset positional deviation amount threshold values $\Delta xth$, $\Delta yth$, and $\Delta \theta th$, respectively (step S205: Yes). In this case, the chip mounting system makes the substrate temperature regulator and the chip temperature regulator regulate the temperatures of the stage 315 and the head 33H to a second temperature at which the resin layer R cures (step S208) and applies pressure to the chip CP in a direction in which the chip CP is pressed against the resin layer R (step S209). Succeedingly, the processing in step S19 and following steps is performed.

Figure 36:
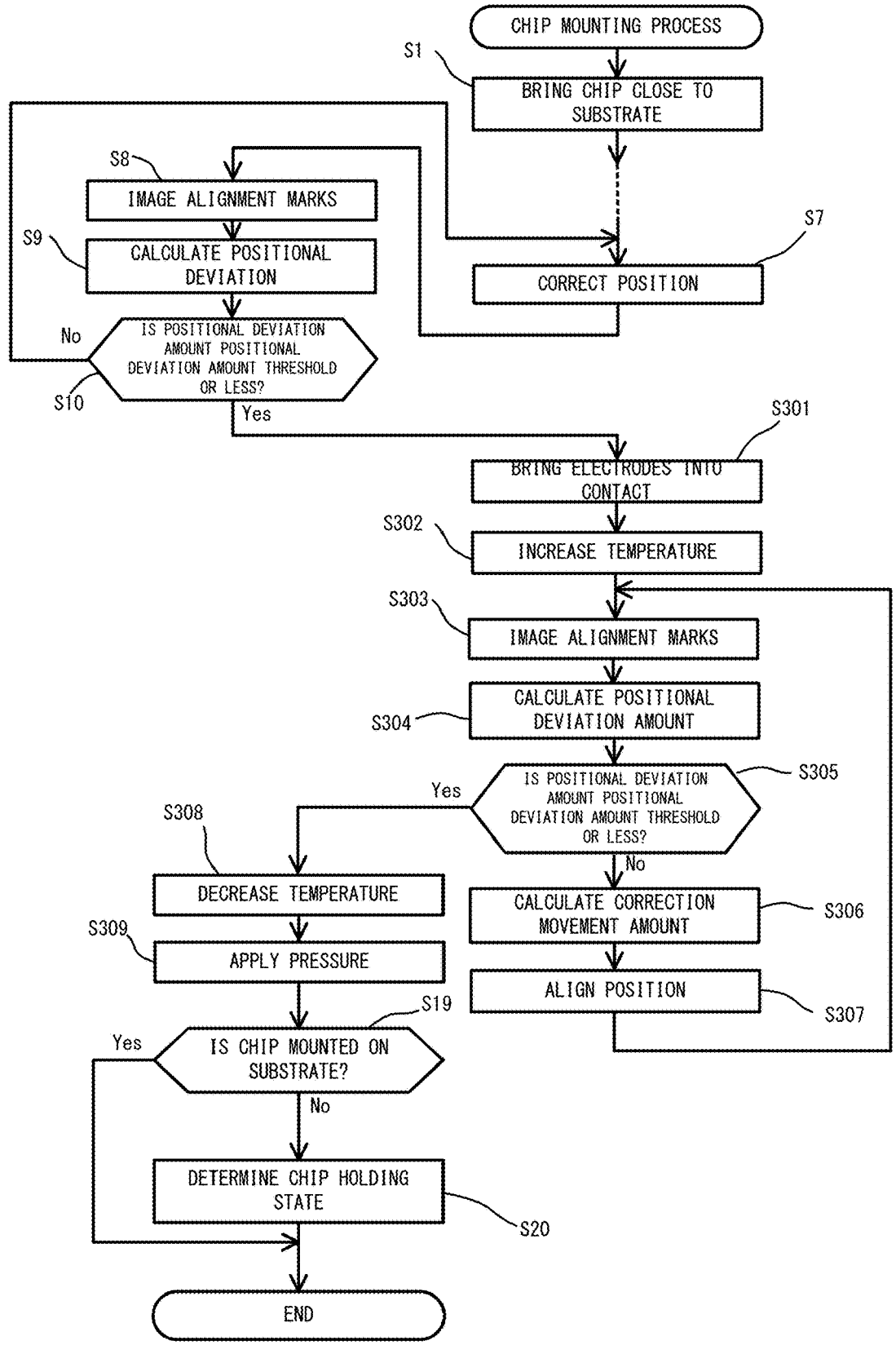
FIG. 36 is a flowchart illustrating an example of a flow of a chip mounting process that a chip mounting system according to still another variation performs.
Figure 37A:
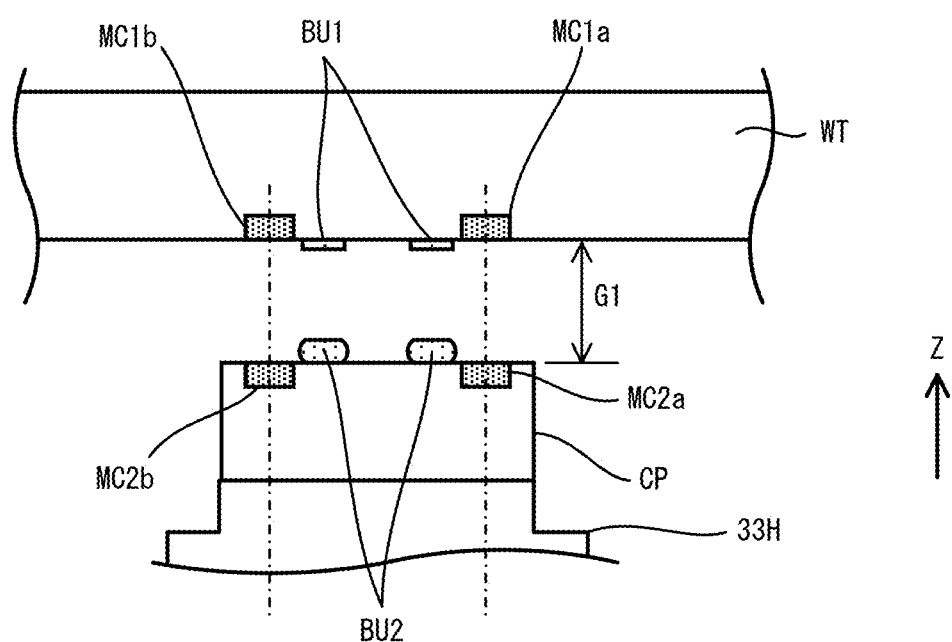
FIG. 37A is a diagram illustrating a state in which a chip is separated from a substrate in the chip mounting system according to the still another variation.
Figure 37B:
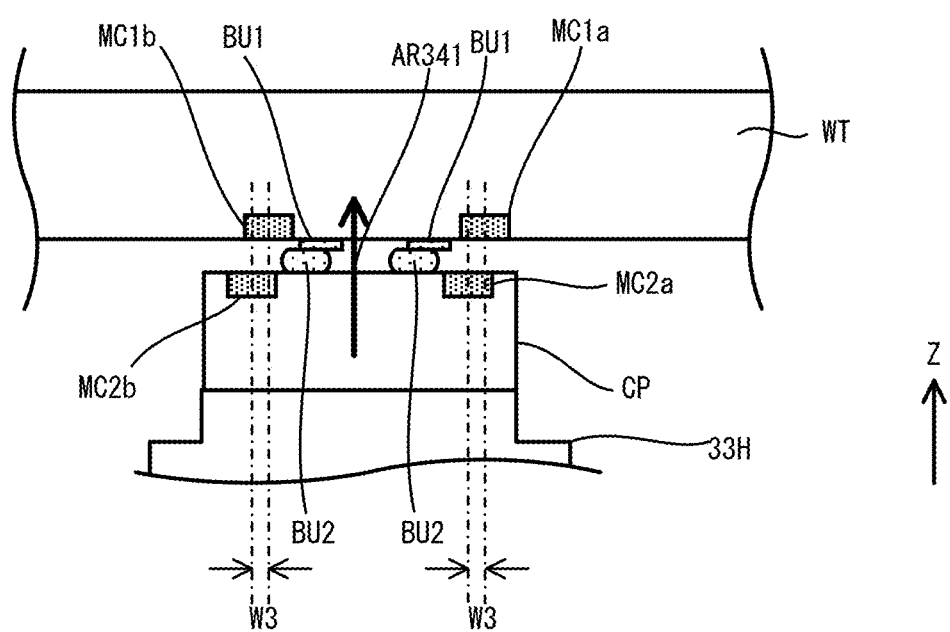
FIG. 37B is a diagram illustrating a state in which electrodes have been brought into contact with each other in the chip mounting system according to the still another variation.
Figure 37C:
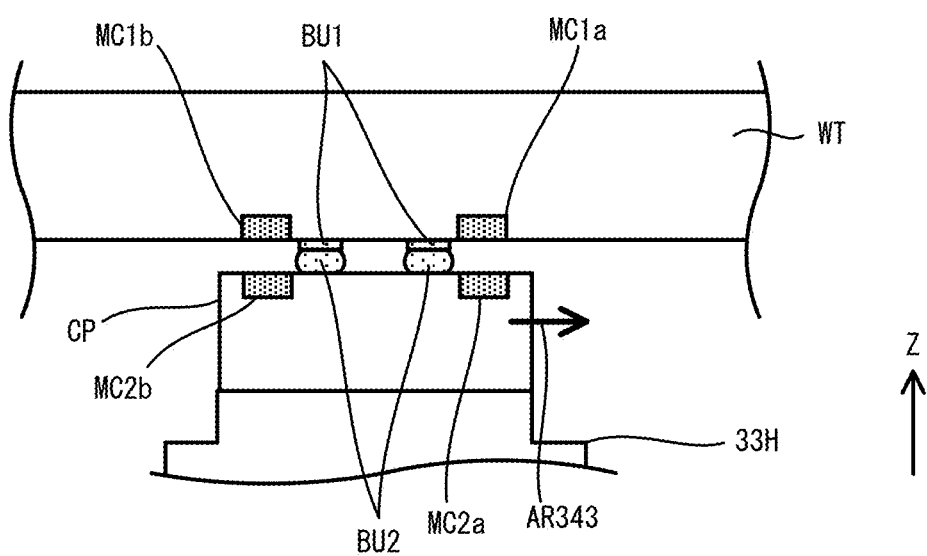
FIG. 37C is a diagram illustrating a manner in which the position of the chip with respect to the substrate is corrected in the chip mounting system according to the still another variation.

The chip mounting system according to the present variation may also be a chip mounting system that, for example, mounts a chip CP on which electrodes made of metal are formed on a substrate on one surface of which electrodes made of metal are formed. In this case, a chip mounting process that the chip mounting system according to the present variation performs in a bonding device 30 will be described below, referring to FIGS. 36 to 37C. Note that, in FIG. 36, the same reference signs as those in FIG. 15 are assigned to the same steps as those in Embodiment 1. First, a chip mounting system 1 performs processing in steps S1 to S10. The processing completes position alignment of a chip CP with the chip CP separated from a substrate WT by a first distance G1, as illustrated in FIG. 37A.

Next, the chip mounting system brings electrodes BU2 on the chip CP and electrodes BU1 on the substrate WT into contact with each other by moving a head 33H holding the chip CP vertically upward (step S301). Succeedingly, the chip mounting system makes a substrate temperature regulator and a chip temperature regulator increase the temperatures of the electrodes BU1 and BU2 to a temperature equivalent to a melting point of a metal forming the electrodes BU1 and BU2 (step S302). This processing causes the electrodes BU1 and BU2 to be brought to a melt state.

Subsequently, the chip mounting system images alignment marks MC2a and MC2b on the chip CP and alignment marks MC1a and MC1b on the substrate WT at the same time with the electrodes BU1 and BU2 in contact with each other (step S303). Next, the chip mounting system calculates relative positional deviation amounts of the chip CP with respect to the substrate WT (step S304).

Subsequently, the chip mounting system determines whether or not all of calculated positional deviation amounts $\Delta x$, $\Delta y$, and $\Delta \theta$ are equal to or less than preset positional deviation amount threshold values $\Delta x th$, $\Delta y th$, and $\Delta \theta th$, respectively (step S305). In the chip mounting process, caused by bringing the electrodes BU1 and BU2 into contact with each other as illustrated by, for example, an arrow AR341 in FIG. 37B, positional deviation of the alignment mark MC1a with respect to the alignment mark MC2a or positional deviation of the alignment mark MC1b with respect to the alignment mark MC2b may occur.

Returning to FIG. 36, it is assumed that, subsequently, the chip mounting system determines that one of the calculated positional deviation amounts $\Delta x$, $\Delta y$, and $\Delta \theta$ is greater than the corresponding one of the preset positional deviation amount threshold values $\Delta x th$, $\Delta y th$, and $\Delta \theta th$ (step S305: No). In this case, the chip mounting system calculates relative correction movement amounts of the chip CP with respect to the substrate WT required to decrease all of the calculated positional deviation amounts $\Delta x$, $\Delta y$, and $\Delta \theta$ to the positional deviation amount threshold values $\Delta x th$, $\Delta y th$, and $\Delta \theta th$ or less, respectively (step S306). Subsequently, the chip mounting system performs correction of the position of the chip CP with respect to the substrate WT in such a way as to correct the relative positional deviation amounts $\Delta x$, $\Delta y$, and $\Delta \theta$ of the chip CP with respect to the substrate WT (step S307). In this step, the chip mounting system performs position alignment of the chip CP with the electrodes BU1 and BU2 in contact with each other, as illustrated in, for example, FIG. 37C. Next, the chip mounting system performs the processing in step S303 again.

On the other hand, it is assumed that the chip mounting system determines that all of the calculated positional deviation amounts $\Delta x$, $\Delta y$, and $\Delta \theta$ are equal to or less than the preset positional deviation amount threshold values $\Delta x th$, $\Delta y th$, and $\Delta \theta th$, respectively (step S305: Yes). In this case, the chip mounting system makes the substrate temperature regulator and the chip temperature regulator decrease the temperatures of the stage 315 and the head 33H to a temperature equal to or less than the melting point of the metal forming the electrodes BU1 and BU2 (step S308) and applies pressure to the chip CP in a direction in which the chip CP is pressed against the substrate WT (step S309). Succeedingly, the processing in step S19 and following steps is performed.

According to this configuration, processing of detaching the chip CP from the composite substrate WCT after having brought the chip CP into contact with the resin layer R is not performed. Processing of detaching the chip CP from the substrate WT after having brought the electrodes BU2 on the chip CP and the electrodes BU1 on the substrate WT into contact with each other is also not performed. Since this configuration causes the total number of processing steps in the chip mounting process to be reduced, processing time equivalent to the reduction is eliminated.

Figure 38:
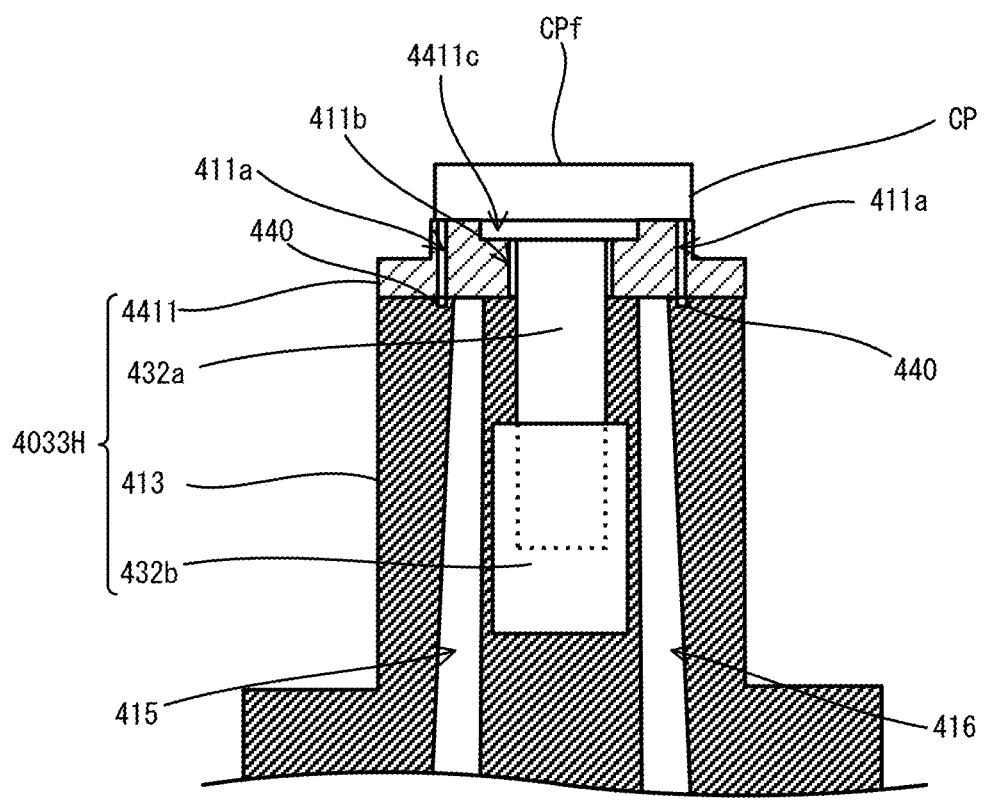
FIG. 38 is a cross-sectional view of a head according to still another variation.

The chip mounting system 1 according to Embodiment 1 may be a chip mounting system that includes a bonding device having a head 4033H in which a recess 4411c is disposed at a portion of a chip tool 4411 that holds a chip CP, as illustrated in, for example, FIG. 38. The recess 4411c above is disposed at a portion corresponding to a region on the chip CP with which the tip portions of needles 111a of a pick-up mechanism 111 in a chip supply 11 come into contact.

This configuration enables the attitude of the chip CP to be suppressed from inclining caused by particles attached to a portion of the chip CP with which the needles 111a come into contact. Therefore, it is possible to bond the chip CP to a substrate WT excellently.

The bonding device 30 according to Embodiment 1 may be configured to include an air flow generator 5042 and a cover 5043 that are arranged vertically below a stage 315, as illustrated in, for example, FIG. 39A. The air flow generator 5042 is a first air flow generator that performs a first air flow generation step of generating air flow on the mounting surface WTf side of a substrate WT in a preset direction orthogonal to the direction (Z-axis direction) in which the stage 315 and a head 33H face each other, with the substrate WT held by the stage 315, as illustrated by an arrow AR501 in FIG. 39A.

In the cover 5043, a through-hole 5043a through which the head 33H is inserted is formed. The cover 5043 separates an area vertically below the stage 315 into a first area AREA1 in which the stage 315 and the air flow generator 5042 are arranged and a second area AREA2 on the vertically lower side of the air flow generator 5042. This configuration causes the first area AREA1 to be more positively pressurized than the second area AREA2. A bonder 33 bonds a chip CP to the substrate WT by moving the head 33H vertically upward and inserting the head 33H into the through-hole 5043a of the cover 5043 with the head 33H holding the chip CP.

Since this configuration causes the first area AREA1 to be more positively pressurized than the second area AREA2, particles generated in the second area AREA2 are suppressed from being attached to the mounting surface WTf of the substrate WT.

In Embodiment 1, the chip mounting system may be a chip mounting system that includes a bonding device in which a stage supports a substrate WT from the vertically lower side and a head brings a chip CP close to the substrate WT from vertically above the substrate WT, brings the chip CP into contact with the substrate WT, and bonds the chip CP to the substrate WT. In this case, the bonding device is only required to be a bonding device including an air flow generator that generates air flow flowing in a preset direction orthogonal to the facing direction between the substrate and the head above the substrate, with the substrate WT held above the stage. The bonding device is only required to include a cover that has a hole through which the head is inserted and, with the substrate WT held above the stage, separates an area above the substrate WT into a first area in which the stage and the air flow generator are arranged and a second area on the upper side of the first area.

Figure 39A:
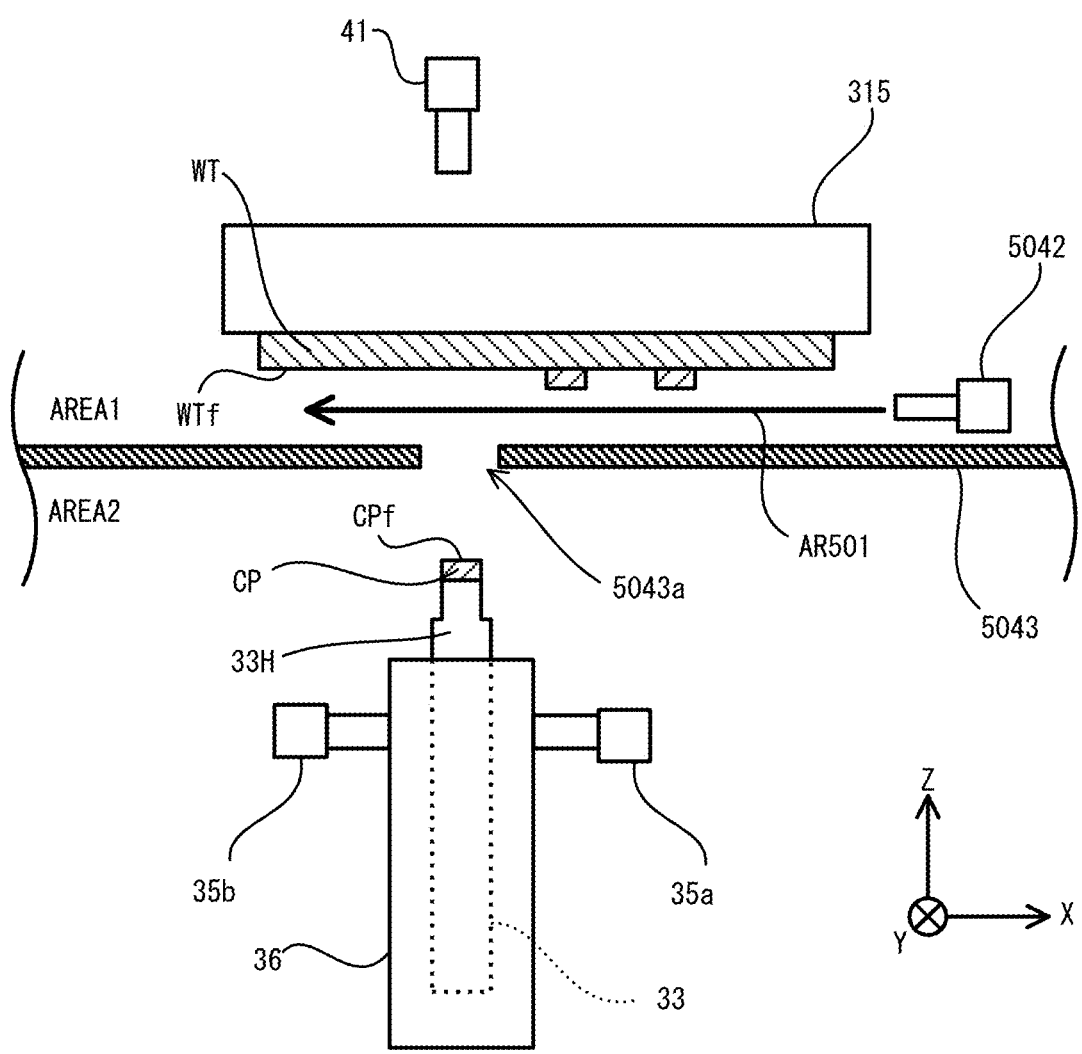
FIG. 39A is a schematic side view illustrating a portion of a chip mounting device according to still another variation.
Figure 39B:
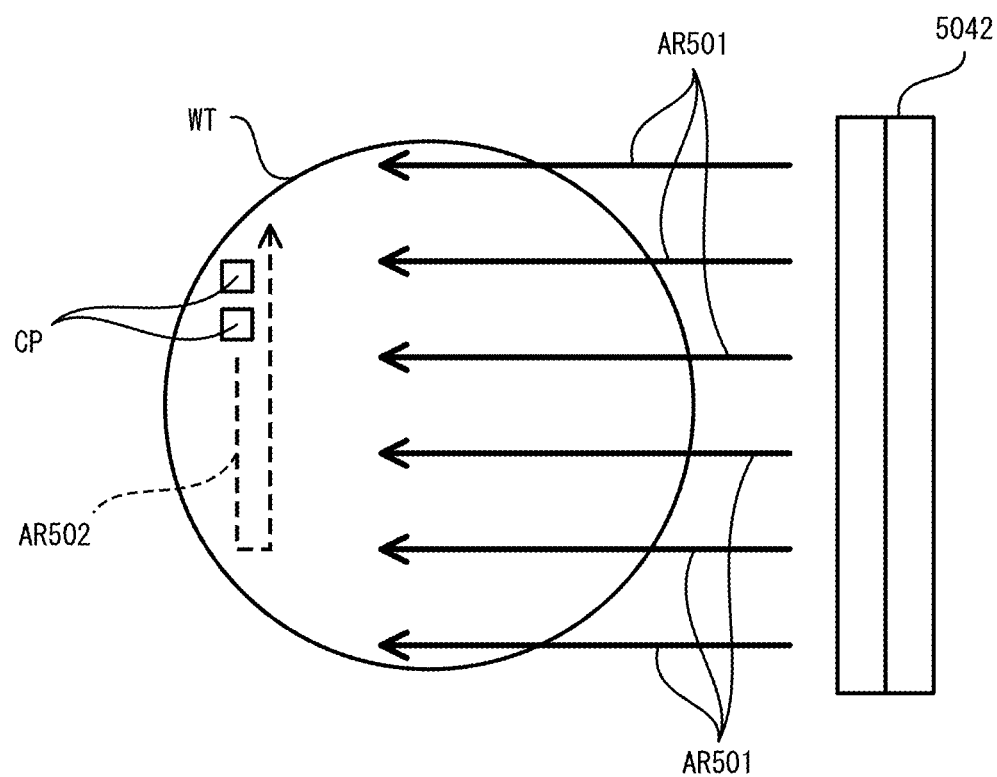
FIG. 39B is a plan view for a description of operation of the chip mounting device according to the still another variation.

It may also be configured such that, in the afore-described variation described using FIG. 39A, the chip mounting system mounts chips CP with a priority to positions on the substrate WT located further downstream of the air flow, as illustrated by an arrow AR502 in FIG. 39B. In this case, since particles generated when a chip CP is mounted on the substrate WT are prevented from adhering to a portion of the mounting surface WTf on which any other chips CP have not been mounted yet, there is an advantage that occurrences of defects in bonding of chips CP on the substrate WT are reduced.

Figure 40:
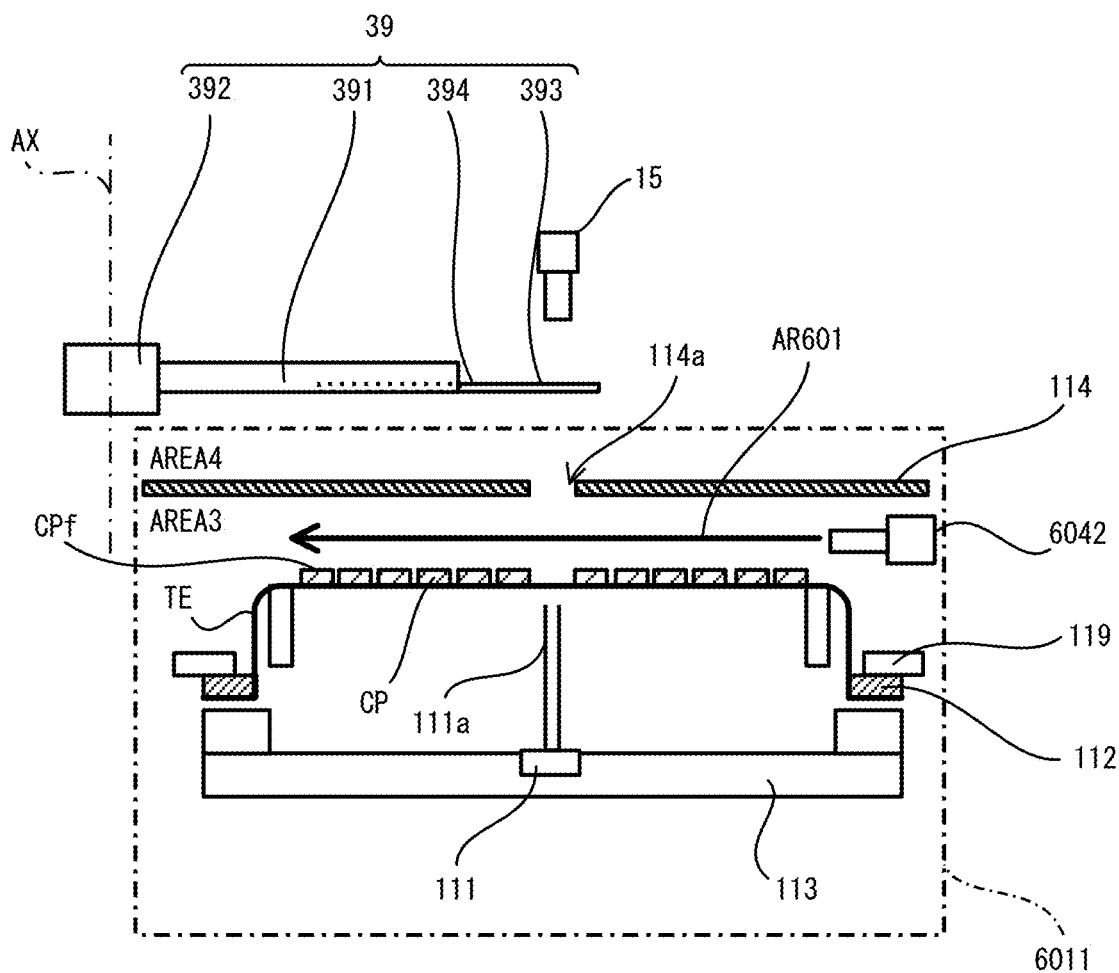
FIG. 40 is a schematic side view illustrating a portion of a chip mounting device according to still another variation.

The chip supply device 10 according to the respective embodiments may be configured to include an air flow generator 6042 that is arranged vertically below a cover 114, as illustrated in, for example, FIG. 40. The air flow generator 6042 is a second air flow generator that performs a second air flow generation step of generating air flow in a preset direction on the bonding surface CPf side of chips CP, with a frame holder 119 holding a sheet holding frame 112 in such an attitude that a surface of a sheet TE on which a plurality of chips CP is stuck faces vertically upward (+Z-direction), as illustrated by an arrow AR601 in FIG. 40. This configuration causes a third area AREA3 vertically above the cover 114 to be more positively pressurized than a fourth area AREA4 vertically below the cover 114.

Since this configuration causes the third area AREA3 to be more positively pressurized than the fourth area AREA4, particles generated in the fourth area AREA4 are suppressed from being attached to the bonding surfaces CPf of chips CP.

In the respective embodiments, the chip mounting system may be a chip mounting system that includes a chip supply having a sheet holder that holds a sheet TE on which a plurality of chips CP is stuck in such an attitude that the bonding surfaces of the chips CP face vertically downward and a pick-up mechanism that picks up a chip CP out of the plurality of chips CP stuck on the sheet TE from vertically below the sheet TE. In this case, the chip supply device is only required to include an air flow generator that generate air flow flowing in a preset direction below the sheet TE with the sheet TE on which the plurality of chips CP is stuck being held by the sheet holder in such an attitude that the bonding surfaces of the chips CP face vertically downward. The chip supply device is also only required to include a cover that has a hole through which a portion of the pick-up mechanism is inserted and separates an area below the sheet TE into a third area in which the sheet holder and the air flow generator are arranged and a fourth area on the lower side of the third area with the sheet on which the plurality of chips CP is stuck being held by the sheet holder.

Regarding the chip mounting system 1 according to Embodiment 1, an example in which, before bringing a chip CP close to the head 33H, the chip mounting system 1 images the alignment marks MC1$a$ and MC1$b$ on the substrate WT, using the imaging device 41 with the chip CP and the substrate WT separated from each other by the second distance was described. However, without being limited to the above, the chip mounting system may, for example, be a chip mounting system that, before making a head 33H hold a chip CP, images alignment marks MC1$a$ and MC1$b$ on a substrate WT, using imaging devices 35$a$ and 35$b$. In this case, a controller 90 stores an imaged image of the alignment marks MC1$a$ and MC1$b$ on the substrate WT in a main storage or an auxiliary storage. Next, the controller 90, after having made the imaging devices 35$a$ and 35$b$ image the alignment marks MC1$a$ and MC1$b$ on the substrate WT, makes the imaging devices 35$a$ and 35$b$ image alignment marks MC2$a$ and MC2$b$ on the chip CP with the head 33H holding the chip CP. The controller 90 calculates relative positional deviation amounts, using imaged images of the alignment marks MC1$a$ and MC1$b$ on the substrate WT and imaged images of the alignment marks MC2$a$ and MC2$b$ on the chip CP, which are acquired through imaging by the imaging devices 35$a$ and 35$b$. Since, when a plurality of chips CP is mounted on the substrate WT, the substrate WT maintains a state of being held by a stage 315, the controller 90 is only required to image the alignment marks MC1$a$ and MC1$b$ on the substrate WT only once at the time of transfer of the substrate WT on the stage 315 and store imaged images in the main storage or the auxiliary storage of the controller 90 and, when the stage 315 has moved, predict the positions of the alignment marks MC1$a$ and MC1$b$, based on information of the alignment marks MC1$a$ and MC1$b$ on the substrate WT stored in the main storage or the auxiliary storage. In this case, when a chip CP is mounted on the substrate WT, it is unnecessary to image the alignment marks MC1$a$ and MC1$b$ on the substrate WT and it is only required to image only the alignment marks MC2$a$ and MC2$b$ on the chip CP.

This configuration enables relative positional deviation amounts between the substrate WT and the chip CP to be calculated even when the substrate WT is not transparent.

In the embodiments, an example in which, as described using FIG. 15, the chip mounting system 1 performs correction of the position of the chip CP with respect to the substrate WT in step S3 and subsequently brings the chip CP closer to the substrate WT by moving the head 33H holding the chip CP vertically upward in step S4 was described. However, order in which the chip mounting system performs the processing in steps S3 and S4 is not limited to the example. For example, the chip mounting system may be a chip mounting system that, while bringing a chip CP closer to a substrate WT, performs correction of the position of the chip CP with respect to the substrate WT.

In Embodiment 1, an example in which the imaging devices 35$a$ and 35$b$ respectively acquire images including the alignment marks MC2$a$ and MC2$b$ on the chip CP and the alignment marks MC1$a$ and MC1$b$ on the substrate WT, using reflected light of illuminating light (such as infrared light) emitted from the light sources of the coaxial illumination systems was described. However, without being limited to the above, the chip mounting system may have a configuration in which imaging devices 35$a$ and 35$b$ acquire images including alignment marks MC2$a$ and MC2$b$ on a chip CP and alignment marks MC1$a$ and MC1$b$ on a substrate WT, using transmitted light that is emitted from light sources disposed on the opposite side to the side on which the imaging devices 35$a$ and 35$b$ are located and is transmitted through the chip CP. For example, the chip mounting system may have a configuration in which an imaging device 41, which is arranged vertically above the substrate WT, acquires an image including the alignment marks MC1$a$, MC1$b$, MC2$a$, and MC2$b$, using coaxial light from the imaging devices 35$a$ and 35$b$ that is incident on the lower side of the chip CP. Alternatively, the chip mounting system may have a configuration in which imaging devices 35$a$ and 35$b$ acquire images including alignment marks MC1$a$, MC1$b$, MC2$a$, and MC2$b$, using coaxial light emitted from an imaging device 41 that is arranged vertically above a substrate WT. When the substrate WT is transparent to visible light, coaxial light emitted from the imaging devices 35$a$ and 35$b$ or the imaging device 41 may be visible light.

The chip mounting system may have a configuration in which an imaging device 41 acquires an image including alignment marks MC2$a$ and MC2$b$ on a chip CP and alignment marks MC1$a$ and MC1$b$ on a substrate WT. By making the identical imaging device 41 simultaneously recognize the alignment marks MC2$a$ and MC2$b$ on the chip CP and the alignment marks MC1$a$ and MC1$b$ on the substrate WT, using infrared light in one imaging of the pairs of the alignment marks MC1$a$ and MC1$b$ and the alignment marks MC2$a$ and MC2$b$ without moving the focal axis while keeping the chip CP in contact with the mounting surface WTf of the substrate WT, as described above, it is possible to recognize positional deviation between the chip CP and the substrate WT with high precision. The same applies to a configuration to simultaneously recognize alignment marks MC2*a* and MC2*b* on a chip CP and alignment marks MC1*a* and MC1*b* on a substrate WT, using imaging devices 35*a* and 35*b* on the chip CP side.

In Embodiment 1, the chip mounting device may be a chip mounting device in which a bonding device 30 includes a distance measurer (not illustrated) that measures distance between the mounting surface WTf of a substrate WT and the bonding surface CPf of a chip CP at three or more points on the bonding surface (flat surface) CPf of the chip CP. The distance measurer may be a distance measurer that includes, for example, laser sources (not illustrated) arranged at a plurality of points on the lateral side of a head 33H and light receivers (not illustrated) that receive laser light that was emitted from the respective ones of the plurality of laser sources and reflected by the substrate WT. A head driver 36 may bring the head 33H holding the chip CP close to a stage unit 31 holding the substrate WT, based on the distance measured by the distance measurer. Three piezo-actuators 333 may adjust at least either distance between the mounting surface WTf of the substrate WT and the bonding surface CPf of the chip CP or inclination of the chip CP with respect to the mounting surface WTf of the substrate WT, based on the distance between the mounting surface WTf of the substrate WT and the bonding surface CPf of the chip CP, which was measured by the distance measurer.

The chip mounting system may be a chip mounting system that, in the afore-described configuration including a water supply, includes a cleaner that removes particles attached to a bonding surface CPf before supplying the bonding surface CPf of a chip CP with water. Examples of the configuration of the cleaner include a configuration to blow a gas, such as nitrogen and helium, a configuration to blow water to which ultrasonic waves, megasonic vibration, or the like is applied, and a configuration to mechanically scrape off particles attached to the bonding surface CPf. When the water supply is configured to blow water to which ultrasonic waves, megasonic vibration, or the like is applied, the water supply has both functions of water supply to the bonding surface CPf and particle removal.

Although, in Embodiment 1, an example in which the alignment marks MC1*a* and MC1*b* on the chip CP are disposed on the bonding surface CPf side was described, the present disclosure is not limited to the example and alignment marks MC1*a* and MC1*b* may, for example, be disposed on a surface of a chip CP on the opposite side to the bonding surface CPf side.

Although, in Embodiment 1, a method for imaging the alignment marks MC1*a* and MC1*b* on the chip CP and the alignment marks MC2*a* and MC2*b* on the substrate WT, using the two imaging devices 35*a* and 35*b* was described, the present disclosure is not limited to the method. For example, when the size of a chip CP is small to some extent, the chip mounting system may be a chip mounting system that images alignment marks MC1*a* and MC1*b* on a chip CP and alignment marks MC2*a* and MC2*b* on a substrate WT at the same time using a single imaging device.

Regarding the chip mounting system 7 according to Embodiment 2, an example in which the imaging devices 7411 image the alignment marks on the chip CP and the alignment marks on the flexible substrate FT with the chip CP and the flexible substrate FT in contact with each other was described. However, without being limited to the above, it may be configured such that, with a chip CP and a flexible substrate FT in contact with each other and a head 7033H having retreated vertically upward, a light path converting member 7353 is arranged vertically above the chip CP and imaging devices 7351 image alignment marks on the chip CP and alignment marks on the flexible substrate FT.

In Embodiment 2, an example in which the imaging devices 7411 image the alignment marks on the flexible substrate FT and the imaging devices 7351 image the alignment marks on the chip CP was described. However, without being limited to the above, the chip mounting system may, for example, have a configuration to image alignment marks on both a chip CP and a flexible substrate FT, using imaging devices 7351.

Although, in the respective embodiments, a case where the shapes of the alignment marks MC2*a* and MC2*b* on the substrate WT or the flexible substrate FT are circles was described, the shapes of the alignment marks MC2*a* and MC2*b* on the substrate WT are not limited to circles and the shapes may be other shapes, such as rectangular shapes and triangular shapes. When the shapes of alignment marks MC2*a* and MC2*b* on a substrate WT are not circles, it is possible to recognize XY directional components and a rotational directional component, using a set of alignment marks MC2*a* and MC2*b*. In this case, it may be configured to calculate positional deviation amounts by, for example, imaging one alignment mark on a substrate WT and one alignment mark on a chip CP at the same time.

Figure 41:
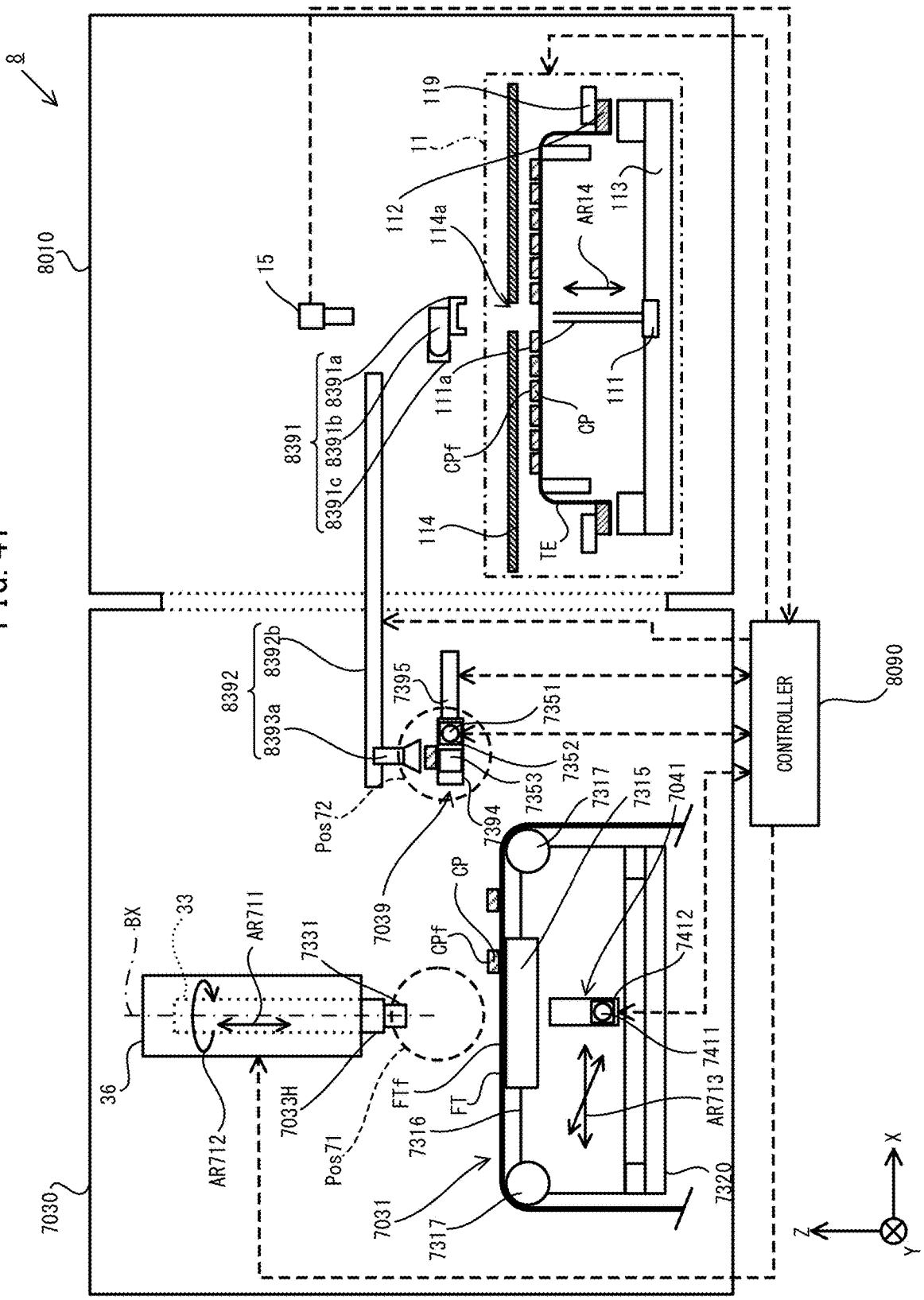
FIG. 41 is a schematic configuration diagram of a chip mounting system according to still another variation.

In Embodiment 2, the chip mounting system may be a chip mounting system that includes a turnover unit 8391 and a transportation unit 8392 that transports a chip CP received from the turnover unit 8391 and transfers the chip CP to a transportation head 7394 of a chip transfer unit 7039, as illustrated in FIG. 41. The turnover unit 8391 above includes a chip holder 8391*a* that holds a chip CP, an arm 8391*b*, and a turnover driver 8391*c*. The turnover unit 8391 directs a tip portion of the arm 8391*b* vertically downward and receives a chip CP from a chip supply 11, using the chip holder 8391*a*. The turnover unit 8391 makes the turnover driver 8391*c* turn the arm 8391*b* with the tip portion of the arm 8391*b* holding the chip CP and thereby directs the tip portion of the arm 8391*b* vertically upward. The chip transportation unit 8392 includes a chip holder 8392*a* that holds the chip CP received from the turnover unit 8391 and a chip holder driver 8392*b* that drives the chip holder 8392*a*. The chip transportation unit 8392 makes the chip holder 8392*a* receive a chip CP from the turnover unit 8391 and subsequently makes the chip holder 8392*a* move in the −X-direction. Subsequently, the chip transportation unit 8392 transfers the chip CP held by the chip holder 8392*a* to the transportation head 7394 of the chip transfer unit 7039. According to this configuration, since the turnover unit 8391 is disposed close to the chip supply 11, it is possible to constitute the bonding device in a dual-head configuration and thereby increase mass productivity of the chip mounting system.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2018-162737, filed on Aug. 31, 2018, the entire disclosure of which is incorporated by reference herein.

INDUSTRIAL APPLICABILITY

The present disclosure is suitable for manufacturing of, for example, CMOS image sensors, memories, arithmetic elements, or MEMSes.

REFERENCE SIGNS LIST 1, 7 Chip mounting system
10 Chip supply device
11 Chip supply
15 Supplied chip imaging device
30 Bonding device
31 Stage unit
33 Bonder
33H, 2033H, 4033H, 7033H Head
34 Z-direction driver
35a, 35b, 41, 7351, 7411 Imaging device
36 Head driver
37 θ-direction driver
38 Linear guide
39 Chip transportation device
50 Cleaning device
51 Chip stage
52 Cleaning head
53 Chip stage driver
54 Cleaned chip imaging device
90 Controller
111 Pick-up mechanism
111a Needle
112 Sheet holding frame
113 Holding frame driver
114, 5043 Cover
114a, 5043a Through-hole
119 Frame holder
301 Fixed member
302 Base member
311 X-direction mover
312, 314, 316 Opening
313 Y-direction mover
315 Stage
321 X-direction driver
323 Y-direction driver
331 Z-axis-direction moving member
332 First disc member
333 Piezo-actuator
334 Second disc member
334a, 334b Hole portion
336 Mirror fixing member
337 Mirror
337a, 337b Inclined surface
351a, 351b, 418 Image sensor
352a, 352b, 419 Optical system
361 Rotating member
363 Camera Z-direction driver
365 Camera F-direction driver
391 Plate
392 Plate driver
393, 7355 Chip holder
10 394, 7393b, 8391b Arm
395 Arm driver
411, 2411, 4411 Chip tool
411a, 411b, 2411b, 2411c Through-hole
413, 2413 Head body
415,416 Cavity
432a, 2432a Chip supporter
432b, 512, 2432b Support driver
2431 Pressing mechanism
2431a Pressing rod
2413b Pressing driver
4411c Recess
5042, 6042 Air flow generator
7031 Flexible substrate support unit
7039 Chip transfer unit
25 7041 Imaging unit
7316 Support
7317 Guide roller
7320 Support driver
7331, 7393a Sucker
7352, 7353, 7412 Light path converting member
7390, 8392 Chip transportation unit
7391 Bernoulli chuck
7392 Chuck driver
7393, 8391 Turnover unit
7393c, 8391c Turnover driver
7394 Transportation head
7394a, 7394b, 7394c, 7413a, 7413b Opening
7395 Transportation head driver
7413 Housing
7414 Window member
8391a Chip holder
CP Chip
CPf Bonding surface
FT Flexible substrate
FTf, WTf Mounting surface
Ga, Gb Imaged image
TE Sheet
L71, L72 Light
MC1a, MC1b, MC2a, MC2b Alignment mark
OB1 Locus
WT Substrate

The invention claimed is:

1. A component mounting method for mounting, on a substrate having a plurality of first alignment marks disposed in a region in which one component is mounted within a mounting surface on which at least said one component is mounted, a component having a plurality of second alignment marks corresponding to the plurality of first alignment marks disposed, the component mounting method comprising:
a first imaging step of imaging the plurality of first alignment marks and the plurality of second alignment marks, using an imaging device at same time with the plurality of first alignment marks and the plurality of second alignment marks separated from each other by a preset first distance at which the plurality of first alignment marks and the plurality of second alignment marks fall within a depth-of-field range of the imaging device;
a first step of calculating amount of positional deviation of calculating a relative positional deviation amount between the substrate and the component from an imaged image of the plurality of first alignment marks and the plurality of second alignment marks imaged by the imaging device, with the substrate and the component separated from each other by the first distance;
a first position correction step of, by relatively moving the component with respect to the substrate in a direction that is parallel with the mounting surface and in which the positional deviation amount decreases, based on the positional deviation amount calculated in the first step of calculating amount of positional deviation, correcting a relative position of the component with respect to the substrate;

a second imaging step of imaging the plurality of first alignment marks and the plurality of second alignment marks, using the imaging device with the substrate and the component separated from each other by a preset second distance longer than the first distance after the component has been transferred to a head for holding the component;

a second step of calculating amount of positional deviation of calculating a relative positional deviation amount between the substrate and the component from an imaged image of the plurality of first alignment marks and the plurality of second alignment marks imaged by the imaging device with the substrate and the component separated from each other by the second distance;

a second position correction step of relatively moving the component with respect to the substrate in a direction that is parallel with the mounting surface and in which the positional deviation amount decreases, based on the positional deviation amount calculated in the second step of calculating amount of positional deviation; and a movement step of relatively bringing the component close to the substrate until the substrate and the component reach a state of being separated from each other by a preset first distance.

2. The component mounting method according to claim 1, wherein the substrate is a flexible substrate made of a continuous tape.

3. A component mounting method for mounting, on a substrate having a plurality of first alignment marks disposed in a region in which one component is mounted within a mounting surface on which at least said one component is mounted, a component having a plurality of second alignment marks corresponding to the plurality of first alignment marks disposed, the component mounting method comprising:

a first imaging step of imaging the plurality of first alignment marks and the plurality of second alignment marks, using an imaging device at same time with the plurality of first alignment marks and the plurality of second alignment marks separated from each other by a preset first distance at which the plurality of first alignment marks and the plurality of second alignment marks fall within a depth-of-field range of the imaging device;

a first step of calculating amount of positional deviation of calculating a relative positional deviation amount between the substrate and the component from an imaged image of the plurality of first alignment marks and the plurality of second alignment marks imaged by the imaging device, with the substrate and the component separated from each other by the first distance;

a first position correction step of, by relatively moving the component with respect to the substrate in a direction that is parallel with the mounting surface and in which the positional deviation amount decreases, based on the positional deviation amount calculated in the first step of calculating amount of positional deviation, correcting a relative position of the component with respect to the substrate;

a second imaging step of, with a first imaging device arranged on an opposite side to the component side of the substrate and a second imaging device arranged between the component and the substrate being arranged and the substrate and the component being separated from each other by a preset second distance longer than the first distance after the component has been transferred to a head for holding the component, imaging the plurality of first alignment marks, using the first imaging device and the plurality of second alignment marks, using the second imaging device; and before the second imaging step, a transportation head movement step of moving a transportation head holding a light path converting member, the light path converting member converting a propagation direction of light propagating in a first direction orthogonal to the mounting surface to a second direction orthogonal to the first direction, to a first position at which at least the light path converting member is arranged between the component and the substrate from a second position at which the light path converting member is separated from the component in a direction parallel with the mounting surface, with the component and the substrate separated from each other by a preset second distance longer than the first distance, and in the second imaging step, the method further comprising:

a second imaging step of imaging the plurality of first alignment marks and the plurality of second alignment marks, using the imaging device from the second direction side of the light path converting member via the light path converting member, a second step of calculating amount of positional deviation of calculating a relative positional deviation amount between the substrate and the component from imaged images of the plurality of first alignment marks and the plurality of second alignment marks imaged by the first imaging device and the second imaging device, with the substrate and the component separated from each other by the second distance;

a second position correction step of relatively moving the component with respect to the substrate in a direction that is parallel with the mounting surface and in which the positional deviation amount decreases, based on the positional deviation amount calculated in the second step of calculating amount of positional deviation; and a movement step of relatively bringing the component close to the substrate until the substrate and the component reach a state of being separated from each other by a preset first distance.

4. The component mounting method according to claim 3, wherein the transportation head further includes a component holder for holding the component and the first position is a position at which the component can be transferred from the component holder of the transportation head to the head, and the method further comprises a transfer step of transferring the component to the head, with the transportation head having been moved to the first position.

5. A component mounting method for mounting, on a substrate having a plurality of first alignment marks disposed in a region in which one component is mounted within a mounting surface on which at least said one component is mounted, a component having a plurality of second alignment marks corresponding to the plurality of first alignment marks disposed, the component mounting method comprising:

a first imaging step of imaging the plurality of first alignment marks and the plurality of second alignment marks, using an imaging device at same time with the plurality of first alignment marks and the plurality of second alignment marks separated from each other by a preset first distance at which the plurality of first alignment marks and the plurality of second alignment marks fall within a depth-of-field range of the imaging device;

a first step of calculating amount of positional deviation of calculating a relative positional deviation amount between the substrate and the component from an imaged image of the plurality of first alignment marks and the plurality of second alignment marks imaged by the imaging device, with the substrate and the component separated from each other by the first distance;

a first position correction step of, by relatively moving the component with respect to the substrate in a direction that is parallel with the mounting surface and in which the positional deviation amount decreases, based on the positional deviation amount calculated in the first step of calculating amount of positional deviation, correcting a relative position of the component with respect to the substrate; and a first air flow generation step of generating air flow flowing in a preset direction orthogonal to a facing direction between the substrate and a head holding the component on the mounting surface side of the substrate with the substrate held by a substrate holder for holding the substrate.

6. The component mounting method according to claim 5, wherein the method mounts the component with a priority to positions on the substrate located further downstream of air flow generated in the first air flow generation step.

7. A component mounting method for mounting, on a substrate having a plurality of first alignment marks disposed in a region in which one component is mounted within a mounting surface on which at least said one component is mounted, a component having a plurality of second alignment marks corresponding to the plurality of first alignment marks disposed, the component mounting method comprising:

a first imaging step of imaging the plurality of first alignment marks and the plurality of second alignment marks, using an imaging device at same time with the plurality of first alignment marks and the plurality of second alignment marks separated from each other by a preset first distance at which the plurality of first alignment marks and the plurality of second alignment marks fall within a depth-of-field range of the imaging device;

a first step of calculating amount of positional deviation of calculating a relative positional deviation amount between the substrate and the component from an imaged image of the plurality of first alignment marks and the plurality of second alignment marks imaged by the imaging device, with the substrate and the component separated from each other by the first distance;

a first position correction step of, by relatively moving the component with respect to the substrate in a direction that is parallel with the mounting surface and in which the positional deviation amount decreases, based on the positional deviation amount calculated in the first step of calculating amount of positional deviation, correcting a relative position of the component with respect to the substrate;

a contact step of bringing the component into contact with the substrate; a third imaging step of imaging the plurality of first alignment marks and the plurality of second alignment marks, using an imaging device at same time with the component in contact with the substrate;

a third step of calculating amount of positional deviation of calculating a relative positional deviation amount between the substrate and the component from an imaged image of the plurality of first alignment marks and the plurality of second alignment marks imaged by the imaging device with the component in contact with the substrate;

a detachment step of detaching the component from the substrate; and a third position correction step of relatively moving the component with respect to the substrate in a direction that is parallel with the mounting surface and in which the positional deviation amount decreases, based on the positional deviation amount calculated in the third step of calculating amount of positional deviation, wherein the method repeats the contact step, the third imaging step, the third step of calculating amount of positional deviation, the detachment step, and the third position correction step until the positional deviation amount calculated in the third step of calculating amount of positional deviation becomes equal to or less than a preset positional deviation amount threshold value.

8. A component mounting method for mounting, on a substrate having a plurality of first alignment marks disposed in a region in which one component is mounted within a mounting surface on which at least said one component is mounted, a component having a plurality of second alignment marks corresponding to the plurality of first alignment marks disposed, the component mounting method comprising:

a first imaging step of imaging the plurality of first alignment marks and the plurality of second alignment marks, using an imaging device at same time with the plurality of first alignment marks and the plurality of second alignment marks separated from each other by a preset first distance at which the plurality of first alignment marks and the plurality of second alignment marks fall within a depth-of-field range of the imaging device;

a first step of calculating amount of positional deviation of calculating a relative positional deviation amount between the substrate and the component from an imaged image of the plurality of first alignment marks and the plurality of second alignment marks imaged by the imaging device, with the substrate and the component separated from each other by the first distance;

a first position correction step of, by relatively moving the component with respect to the substrate in a direction that is parallel with the mounting surface and in which the positional deviation amount decreases, based on the positional deviation amount calculated in the first step of calculating amount of positional deviation, correcting a relative position of the component with respect to the substrate; and a second air flow generation step of, with a sheet on which the at least one component is stuck being held by a sheet holder for holding the sheet, generating air flow flowing in a preset direction on the components side of the sheet.

* * * * *